United States Patent
Kishida

(10) Patent No.: US 8,947,901 B2
(45) Date of Patent: Feb. 3, 2015

(54) CONTENT ADDRESSABLE MEMORY CHIP

(71) Applicant: Renesas Electronics Corporation, Kanagawa (JP)

(72) Inventor: Masanobu Kishida, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/320,850

(22) Filed: Jul. 1, 2014

(65) Prior Publication Data

US 2014/0313808 A1    Oct. 23, 2014

Related U.S. Application Data

(63) Continuation of application No. 13/839,191, filed on Mar. 15, 2013, now Pat. No. 8,804,392.

(30) Foreign Application Priority Data

Mar. 27, 2012 (JP) ................................ 2012-071700

(51) Int. Cl.
*G11C 15/04*    (2006.01)

(52) U.S. Cl.
CPC ..................................... *G11C 15/04* (2013.01)
USPC ....................................................... 365/49.17

(58) Field of Classification Search
CPC ........................................... G11C 15/00–15/06
USPC ...................................................... 365/49.17
See application file for complete search history.

(56) References Cited

U.S. PATENT DOCUMENTS

| 6,760,242 | B1 * | 7/2004 | Park et al. ................... 365/49.15 |
| 6,917,535 | B2 | 7/2005 | Shiratake |
| 7,009,861 | B2 * | 3/2006 | Dixit et al. ................. 365/49.17 |
| 7,317,628 | B1 * | 1/2008 | Meng ......................... 365/49.17 |
| 7,492,646 | B2 | 2/2009 | Lee et al. |
| 7,911,818 | B2 | 3/2011 | Chu |
| 8,164,934 | B2 | 4/2012 | Watanabe et al. |

FOREIGN PATENT DOCUMENTS

| JP | 7-014391 A | 1/1995 |
| JP | 7-282587 A | 10/1995 |
| JP | 2009-026350 A | 2/2009 |

OTHER PUBLICATIONS

Wieckkowski, et al., "A 128kb High Density Portless SRAM Using Hierarchical Bit Lines and Thyristor Sense Amplifiers," Quality Electronic Design (ISQED), 2011 12th International Symposium on, Mar. 14-16, 2011, pp. 1-4.
Notice of Allowance issued Apr. 7, 2014 in U.S. Appl. No. 13/839,191.

* cited by examiner

*Primary Examiner* — Harry W Byrne
*Assistant Examiner* — Lance Reidlinger
(74) *Attorney, Agent, or Firm* — Sughrue Mion, PLLC

(57) ABSTRACT

A content addressable memory chip which can perform a high speed search with less error is provided. A match amplifier zone determines coincidence or non-coincidence of search data with data stored in the content addressable memory cells in an entry of a CAM cell array, according to the voltage of a match line. The match amplifier zone comprises one or more NMOS transistors and one or more PMOS transistors. The match amplifier zone has a dead zone to an input of a voltage of the match line, and has a property that no flow-through current is present in the match amplifier zone.

16 Claims, 38 Drawing Sheets

CONTENT ADDRESSABLE MEMORY CHIP

CROSS-REFERENCE TO RELATED APPLICATIONS

This application is a Continuation application of U.S. application Ser. No. 13/839,191 filed Mar. 15, 2013, now U.S. Pat. No. 8,804,392, which claims priority from Japanese Patent Application No. 2012-071700 filed on Mar. 27, 2012, the disclosures of which are incorporated herein by reference in their entirety.

BACKGROUND

The present invention relates to a content addressable memory chip (or a content addressable memory device).

In a content addressable memory chip (or a content addressable memory device), a configuration which allows a high speed search with little error has been known from the past.

In Patent Literature 1 (Published Japanese Unexamined Patent Application No. Hei 07 (1995)-282587), match lines of a content addressable memory (CAM) circuit are hierarchized and a signal of a match line 31 of the first hierarchy is stored in latch circuits 306, 307, and 308. Using the signal 51 of the latch circuits 306, 307, and 308, a match line 34 of the second hierarchy is discharged during the period of precharge of the match line 31 of the first hierarchy. The match line 34 of the second hierarchy is precharged during the period of discharge of the match line 31 of the first hierarchy.

A semiconductor device 101 disclosed by Patent Literature 2 (Published Japanese Unexamined Patent Application No. 2009-26350) comprises a first control line ML1 in which a signal based on stored data in a first memory circuit CM1 appears; a first characteristic adjustment circuit CL1 which adjusts a read property to the signal appeared in the first control line ML1; a second control line MLT in which a signal based on stored data in a second memory circuit CM1T appears; a second characteristic adjustment circuit CLT which adjusts a read property to the signal appeared in the second control line MLT; and a control signal generating circuit 11 which generates a control signal based on the adjustment result by the second characteristic adjustment circuit CLT. The first characteristic adjustment circuit CL1 adjusts the read property to the signal appeared in the first control line ML1 based on the control signal, and a power supply voltage different from the one supplied to the first memory circuit CM1 is supplied to the second memory circuit CM1T.

In a semiconductor memory device disclosed by Patent Literature 3 (Published Japanese Unexamined Patent Application No. Hei 07 (1995)-14391), a memory matrix employed is divided into four memory matrix sub-blocks in total in the bit column direction, such as a first memory matrix sub-block comprised of word memories MW1a-MW128a. Each memory matrix sub-block has shifted timing in searching time according to corresponding enable timing signals SEa-SEd. Consequently, the peak current in the searching time is distributed, and a peak maximum current is reduced.

(Patent Literature 1) Published Japanese Unexamined Patent Application No. Hei 07 (1995)-282587
(Patent Literature 2) Published Japanese Unexamined Patent Application No. 2009-26350
(Patent Literature 3) Published Japanese Unexamined Patent Application No. Hei 07 (1995)-14391

SUMMARY

However, the configuration of the device disclosed by Patent Literature 1 is complicated and requires many elements. For example, in Patent Literature 1, a bias potential generating circuit is required for generating bias potential. In Patent Literature 2, the configuration of a tuning circuit and others is complicated. In Patent Literature 3, it is necessary to generate plural activation signals by employing delay circuits in order to distribute the consumption current; therefore, processing is complicated.

According to one embodiment of the present invention, a match amplifier determines coincidence or non-coincidence of search data with stored data in content addressable memory cells in an entry of a memory array, according to a voltage of a match line. The match amplifier comprises one or more NMOS transistors and one or more PMOS transistors. The match amplifier has a dead zone to an input of a voltage of the match line, and has a property that no flow-through current is present in the match amplifier.

According to one embodiment of the present invention, it is possible to perform a high speed search with little error.

DETAILED DESCRIPTION

Hereinafter, with reference to the accompanying drawings, the embodiments of the present invention are explained in detail.

Embodiment 1

Figure 1:
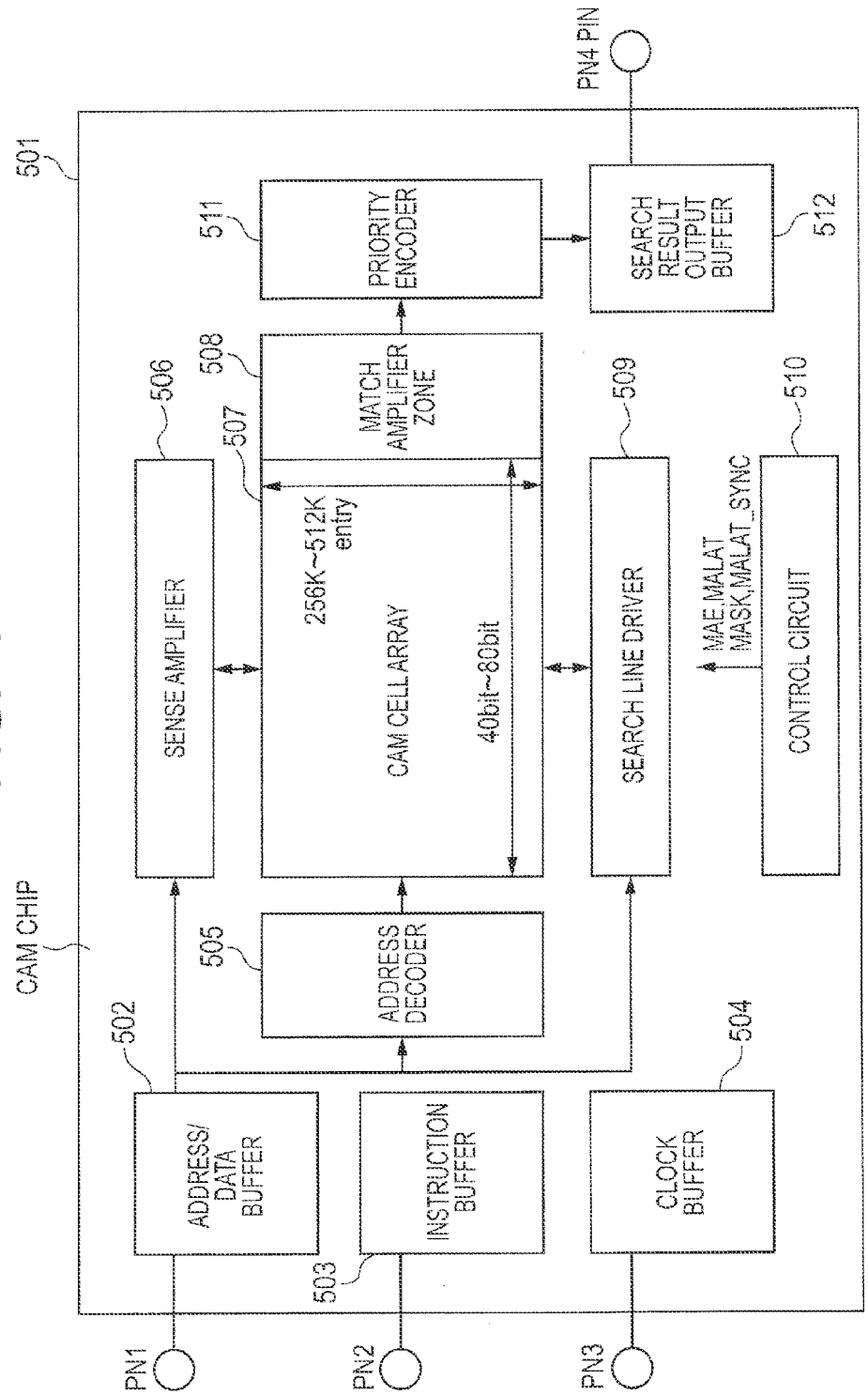
FIG. 1 is a drawing illustrating a basic configuration of a content addressable memory.

(An entire configuration of a content addressable memory) FIG. 1 illustrates a basic configuration of a content addressable memory (CAM) chip.

A CAM cell array 507 is comprised of CAM cells arranged in a matrix. Each row of the CAM cell array 507 is called an entry. Each entry corresponds to an address of an address decoder 505 and a priority encoder 511. A match line to which plural memory cells of each entry are coupled is provided for every entry.

An address/data buffer 502 receives an address and data from the exterior through a pin PN1.

An instruction buffer 503 receives an instruction from the exterior through a pin PN2. A clock buffer 504 receives a clock signal through a pin PN3.

The address decoder 505 decodes the inputted address and specifies a row in the CAM cell array 507.

A sense amplifier 506 amplifies data read from the CAM cell array. A search line driver 509 transfers the inputted search data (called an address key) to all the entries.

A match amplifier zone 508 is provided with a match amplifier for every entry. The match amplifier detects coincidence or non-coincidence of an address key with the data stored in the entry.

When coincidence is obtained for one entry, the priority encoder 511 outputs the address of the entry, and when coincidence is obtained for plural entries, the priority encoder 511 outputs the smallest address among the addresses of the entries.

A search output buffer 512 outputs the address outputted from the priority encoder 511, to the exterior through a pin PN4.

Figure 2:
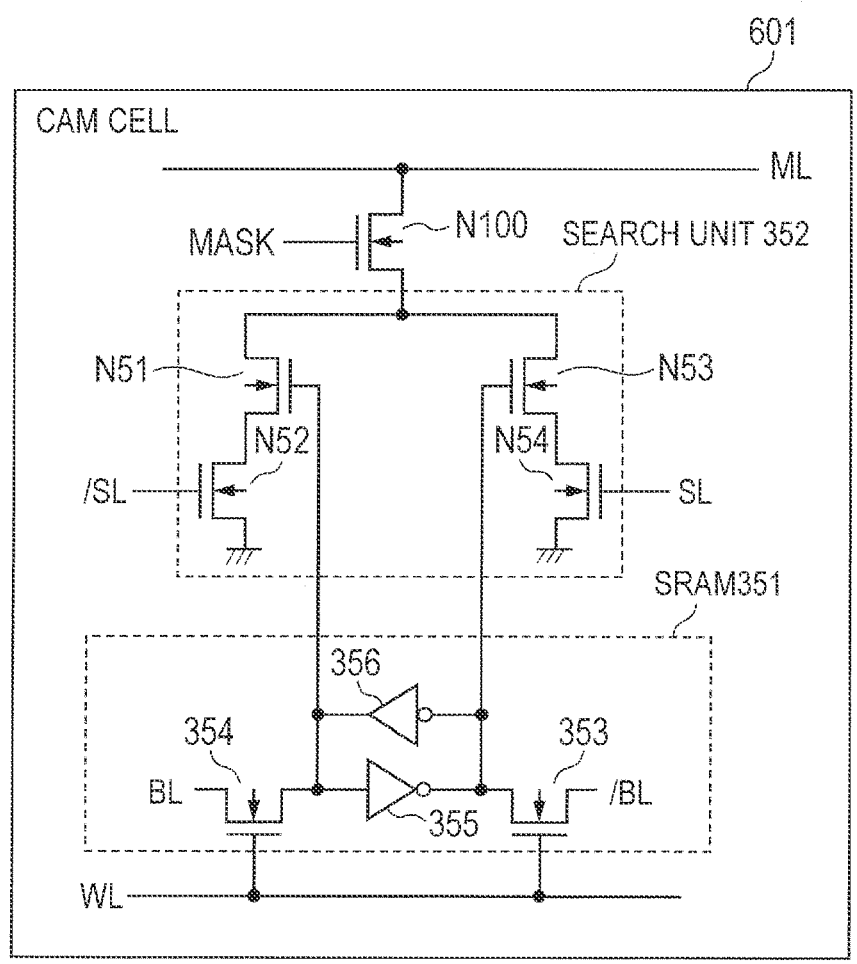
FIG. 2 is a drawing illustrating a configuration of a CAM cell.

(A configuration of a CAM cell) FIG. 2 illustrates a configuration of a CAM cell.

As illustrated in FIG. 2, a CAM cell 601 comprises an SRAM 351, a search unit 352, and a mask transistor N100.

The SRAM 351 stores one of binaries "L" and "H." The search unit 352 comprises search transistors N51-N54. The search transistors N51-N54 employ an NMOS with a high Vth (HVth), in order to alleviate an off state leakage current. In the following description of the present specification, a medium. Vth (MVth) means the threshold value of the ordinary general purpose MOS transistor. HVth is a threshold value higher than MVth. A low Vth (LVth) is a threshold value lower than MVth. In the present specification, it is assumed that the threshold value of a MOS transistor is MVth, unless otherwise specified.

A gate of the search transistor N54 is coupled to a search line SL indicating search data.

A gate of the search transistor N52 is coupled to a search line /SL indicating search data.

When the search line SL is at an "H" level and an input gate of the search transistor N53 is at an "H" level, or when the search line /SL is at an "H" level and an input gate of the search transistor N51 is at an "H" level, a high potential which has been precharged to a match line ML in advance is discharged to a ground VSS.

The mask transistor N100 has the function of masking the search, by means of a mask signal MASK. That is, when the mask signal MASK is at an "L" level, discharge of the match line ML does not take place irrespective of the level of the search lines SL and /SL and the level of bit lines BL and /BL.

Figure 3:
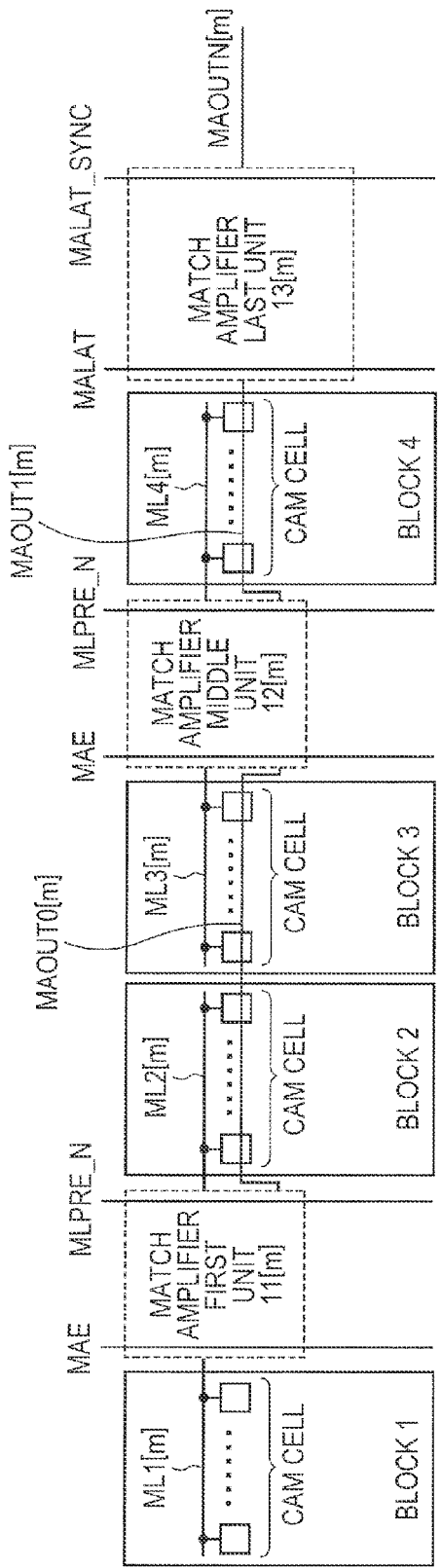
FIG. 3 is a drawing illustrating a configuration of a CAM cell array and a match amplifier according to Embodiment 1.

(A configuration of one entry) FIG. 3 illustrates a configuration of a CAM cell array and a match amplifier according to Embodiment 1.

In FIG. 3, the CAM cell array 507 and the match line ML illustrated in FIG. 1 are divided into four blocks, Block 1-Block 4. Accordingly, one match line is divided into four match lines ML1[m]-ML4[m].

In contrast to FIG. 1, a match amplifier first unit 11[m] is arranged as a determination circuit between Block 1 and Block 2.

In contrast to FIG. 1, a match amplifier middle unit 12[m] is arranged as a determination circuit between Block 3 and Block 4. Next to Block 4, a match amplifier last unit 13[m] is arranged as an output circuit.

The match amplifier first unit 11[m] takes in voltages of the match lines ML1[m] and ML2[m] which have changed by the search of an entry[m] in Block 1 and Block 2, and outputs a voltage indicating that both of the entry[m] of Block 1 and the entry[m] of Block 2 are coincidence, to an internal data wiring MAOUT0[m].

The internal data wiring MAOUT0[m] is coupled to the match amplifier middle unit 12[m] via Block 2 and Block 3.

The match amplifier middle unit 12[m] takes in voltages of the match lines ML3[m] and ML4[m] which have changed by the search of the entry[m] in Block 3 and Block 4, and a voltage of the internal data wiring MAOUT0[m], and outputs a voltage indicating that all the entry[m] of Block 1 through the entry[m] of Block 4 are coincidence, to an internal data wiring MAOUT1[m].

The internal data wiring MAOUT1[m] is coupled to the match amplifier last unit 13[m] via Block 4.

The match amplifier last unit 13[m] takes in a voltage of the internal data wiring MAOUT1[m], and outputs a match amplifier output signal to an output data wiring MAOUTN, according to a pre-latch signal MALAT and an output latch signal MALAT_SYNC.

Figure 4:
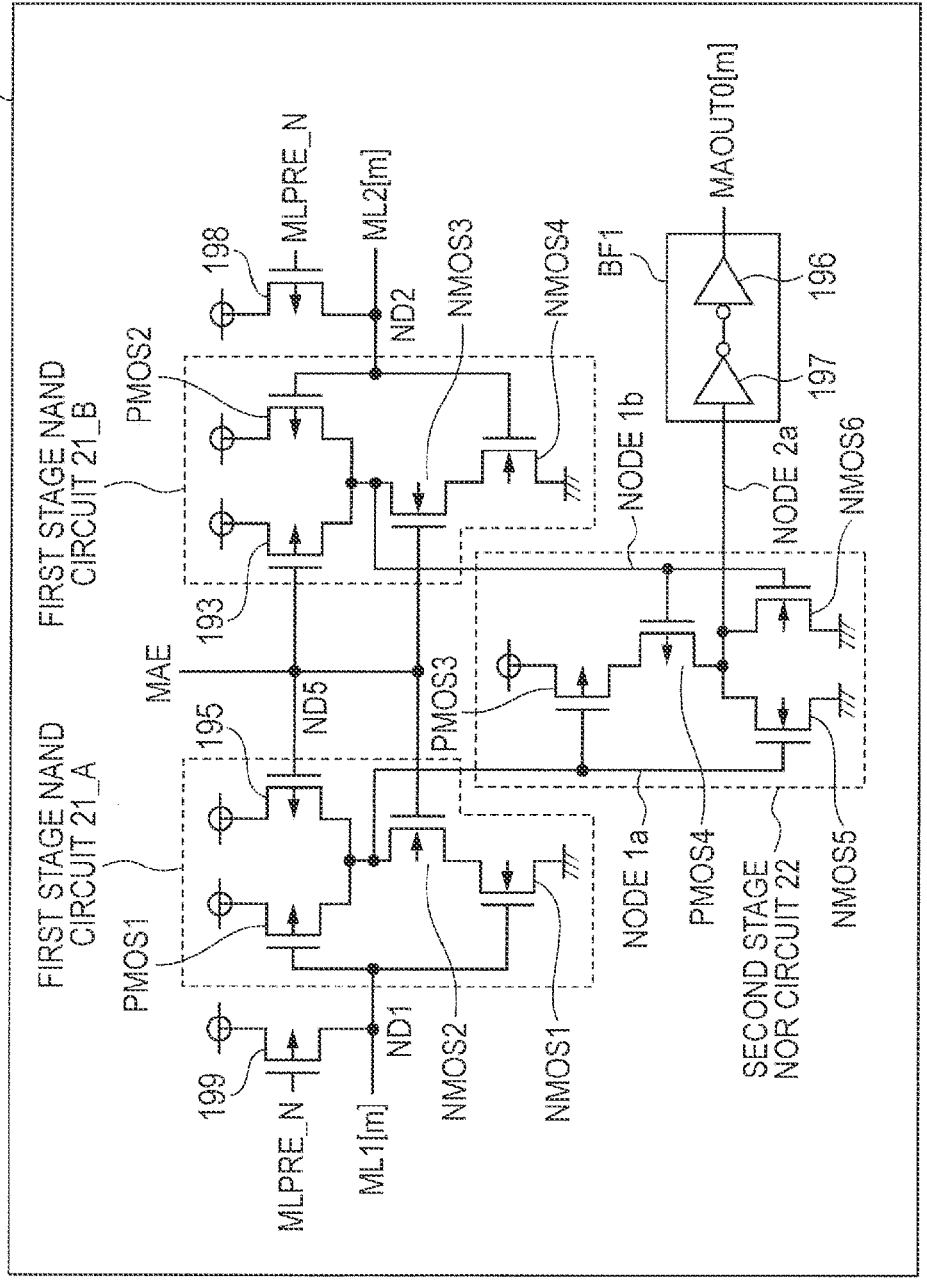
FIG. 4 is a drawing illustrating a configuration of a match amplifier first unit 11[$m$]

(A configuration of the match amplifier first unit, the match amplifier middle unit, and the match amplifier last unit) FIG. 4 illustrates a configuration of the match amplifier first unit 11[m].

The match amplifier first unit 11[m] comprises PMOS transistors 198 and 199, first stage NAND circuits 21_A and 21_B, a second stage NOR circuit 22, and a buffer unit BF1.

The PMOS transistor 199 is provided between a VDD power supply and a node ND1 coupled to the match line ML1[m], and has a gate which receives a pre-charge signal MLPRE_N. The PMOS transistor 198 is provided between the VDD power supply and a node ND2 coupled to the match line ML2[m], and has a gate which receives the pre-charge signal MLPRE_N.

The first stage NAND circuit 21_A comprises PMOS transistors PMOS1 and 195, and NMOS transistors NMOS1 and NMOS2.

The PMOS transistor PMOS1 is provided between the VDD power supply and a node 1a, and has a gate coupled to the node ND1.

The PMOS transistor 195 is provided between the VDD power supply and the node 1a, and has a gate coupled to a node ND5 which receives a match amplifier activation signal MAE.

The NMOS transistors NMOS1 and NMOS2 are coupled in series between the node 1a and the ground. A gate of the NMOS transistor NMOS1 is coupled to the node ND1 and a gate of the NMOS transistor NMOS2 is coupled to the node ND5. It is also preferable to couple the gate input of the NMOS transistor NMOS1 to the node ND5 and to couple the gate input of the NMOS transistor NMOS2 to the node ND1.

The first stage NAND circuit 21_B comprises PMOS transistors PMOS2 and 193, and NMOS transistors NMOS3 and NMOS4.

The PMOS transistor PMOS2 is provided between the VDD power supply and a node 1b, and has a gate coupled to a node ND2.

The PMOS transistor 193 is provided between the VDD power supply and the node 1b, and has a gate coupled to the node ND5 which receives the match amplifier activation signal MAE.

The NMOS transistors NMOS3 and NMOS4 are coupled in series between the node 1b and the ground. A gate of the NMOS transistor NMOS3 is coupled to the node ND5 and a gate of the NMOS transistor NMOS4 is coupled to the node ND2. It is also preferable to couple the gate input of the NMOS transistor NMOS3 to the node ND2 and to couple the gate input of the NMOS transistor NMOS4 to the node ND5.

The NMOS transistors NMOS1, NMOS2, NMOS3, and NMOS4 are HVth NMOS transistors. The PMOS transistor PMOS1 and PMOS2 are LVth PMOS transistors.

The second stage NOR circuit 22 comprises PMOS transistors PMOS3 and PMOS4, and NMOS transistors NMOS5 and NMOS6.

The PMOS transistors PMOS3 and PMOS4 are provided in series between the VDD power supply and a node 2a. A gate of the PMOS transistor PMOS3 is coupled to the node 1a and a gate of the PMOS transistor PMOS4 is coupled to the node 1b.

The NMOS transistors NMOS5 and NMOS6 are provided in parallel between the node 2a and the ground. A gate of the NMOS transistor NMOS5 is coupled to the node 1a and a gate of the NMOS transistor NMOS6 is coupled to the node 1b.

The buffer unit BF1 comprises two stages of inverters 197 and 196. The buffer unit BF1 buffers a voltage of the node 2a as an output of the second stage NOR circuit 22, and outputs it to the match amplifier middle unit 12[m] via the internal data wiring MAOUT0[m].

The buffer unit BF1 sets the internal data wiring MAOUT0[m] to an "L" level when the node 2a is at an "L" level, and sets the internal data wiring MAOUT1[m] to an "H" level when the node 2a is at an "H" level.

Figure 5:
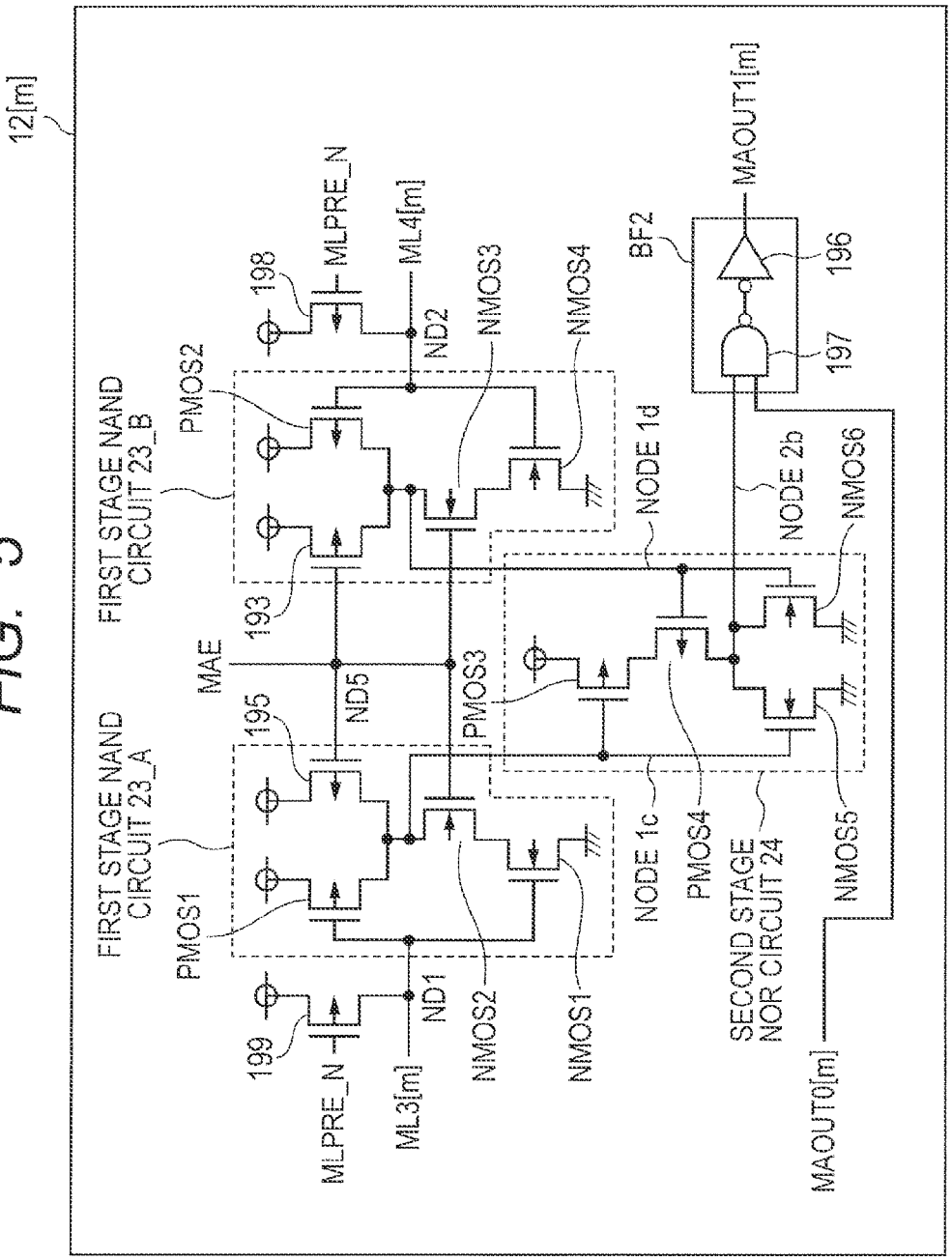
FIG. 5 is a drawing illustrating a configuration of a match amplifier middle unit 12[$m$]

FIG. 5 illustrates a configuration of the match amplifier middle unit 12[m]. The match amplifier middle unit 12[m] comprises PMOS transistors 198 and 199, first stage NAND circuits 23_A and 23_B, a second stage NOR circuit 24, and a buffer unit BF2.

The PMOS transistor 199 is provided between a VDD power supply and a node ND1 coupled to the match line ML3[m], and has a gate which receives a pre-charge signal MLPRE_N. The PMOS transistor 198 is provided between the VDD power supply and a node ND2 coupled to the match line ML4[m], and has a gate which receives the pre-charge signal MLPRE_N.

The first stage NAND circuit 23_A comprises PMOS transistors PMOS1 and 195, and NMOS transistors NMOS1 and NMOS2.

The PMOS transistor PMOS1 is provided between the VDD power supply and a node 1c, and has a gate coupled to the node ND1.

The PMOS transistor 195 is provided between the VDD power supply and the node 1c, and has a gate coupled to a node ND5 which receives the match amplifier activation signal MAE.

The NMOS transistors NMOS1 and NMOS2 are coupled in series between the node 1c and the ground. A gate of the NMOS transistor NMOS1 is coupled to the node ND1 and a gate of the NMOS transistor NMOS2 is coupled to the node ND5. It is also preferable to couple the gate input of the NMOS transistor NMOS1 to the node ND5 and to couple the gate input of the NMOS transistor NMOS2 to the node ND1.

The first stage NAND circuit 23_B comprises PMOS transistors PMOS2 and 193, and NMOS transistors NMOS3 and NMOS4.

The PMOS transistor PMOS2 is provided between the VDD power supply and a node 1d, and has a gate coupled to a node ND2.

The PMOS transistor 193 is provided between the VDD power supply and the node 1d, and has a gate coupled to the node ND5 which receives the match amplifier activation signal MAE.

The NMOS transistors NMOS3 and NMOS4 are coupled in series between the node 1d and the ground. A gate of the NMOS transistor NMOS3 is coupled to the node ND5 and a gate of the NMOS transistor NMOS4 is coupled to the node ND2. It is also preferable to couple the gate input of the NMOS transistor NMOS3 to the node ND2 and to couple the gate input of the NMOS transistor NMOS4 to the node ND5.

The NMOS transistors NMOS1, NMOS2, NMOS3, and NMOS4 are HVth NMOS transistors. The PMOS transistor PMOS1 and PMOS2 are LVth PMOS transistors.

The second stage NOR circuit 24 comprises PMOS transistors PMOS3 and PMOS4, and NMOS transistors NMOS5 and NMOS6.

The PMOS transistors PMOS3 and PMOS4 are provided in series between the VDD power supply and a node 2b. A gate of the PMOS transistor PMOS3 is coupled to the node 1c and a gate of the PMOS transistor PMOS4 is coupled to the node 1d.

The NMOS transistors NMOS5 and NMOS6 are provided in parallel between the node 2b and the ground. A gate of the NMOS transistor NMOS5 is coupled to the node 1c and a gate of the NMOS transistor NMOS6 is coupled to the node 1d.

The buffer unit BF2 comprises a NAND circuit 191 and an inverter 196. The buffer unit BF2 buffers a voltage of the node 2b as an output of the second stage NOR circuit 24, and outputs it to the match amplifier last unit 13[m] via the internal data wiring MAOUT1[m].

When the internal data wiring MAOUT0[m] is at an "L" level, the buffer unit BF2 sets the internal data wiring MAOUT1[m] to an "L" level, irrespective of a voltage level of the node 2b. The buffer unit BF2 sets the internal data wiring MAOUT1[m] to an "L" level, when the internal data wiring MAOUT0[m] is at an "H" level and when the node 2b is at an "L" level, and sets the internal data wiring MAOUT1[m] to an "H" level, when the internal data wiring MAOUT0[m] is at an "H" level and when the node 2b is at an "H" level.

Figure 6:
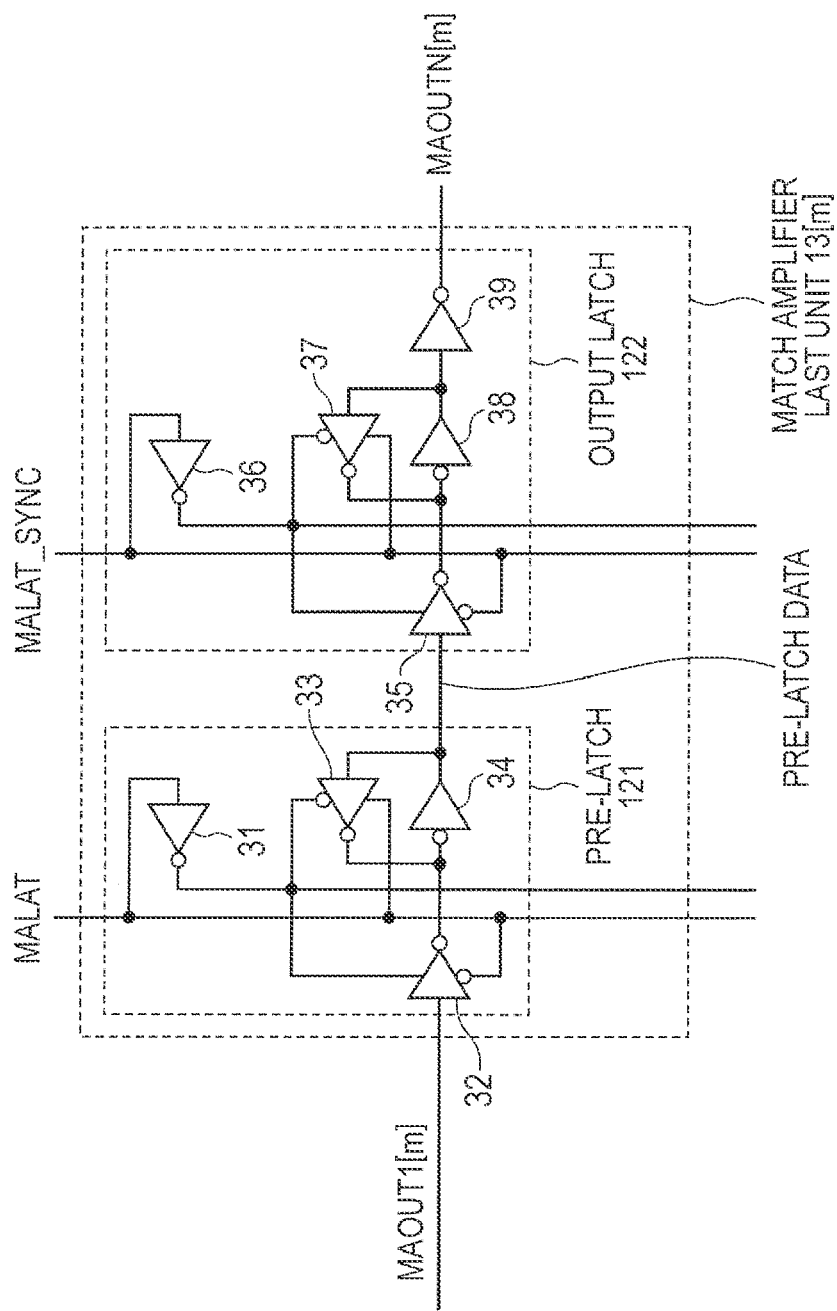
FIG. 6 is a drawing illustrating a configuration of a match amplifier last unit 13[$m$]

FIG. 6 illustrates a configuration of the match amplifier last unit 13[m]. The match amplifier last unit 13[m] comprises a pre-latch 121 and an output latch 122.

The pre-latch 121 takes in data of the internal data wiring MAOUT1[m] according to a pre-latch signal MALAT, and outputs pre-latch data.

The output latch 122 takes in the pre-latch data outputted by the pre-latch 121, according to an output latch signal MALAT_SYNC, and outputs a match amplifier output signal to the output data wiring MAOUTN[m] to supply it to the priority encoder 511 illustrated in FIG. 1.

(Dead zone) The following explains a logic threshold value and a dead zone, under the first conditions to be described below, in the case where the NMOS transistors NMOS1 and NMOS2 are formed to have HVth and the PMOS transistor PMOS1 is formed to have LVth. Here, the NMOS transistors NMOS1 and NMOS2 and the PMOS transistor PMOS1 compose the first stage NAND circuit 21_A illustrated in FIG. 4. The property to be explained in the following applies equally to the first stage NAND circuit 21_B illustrated in FIG. 4, and the first stage NAND circuits 23_A and 23_B illustrated in FIG. 5. Here, the first conditions refer to conditions in which the power supply voltage VDD is a lower limit (about 0.7V) and the temperature is low (−40° C.).

Figure 7:
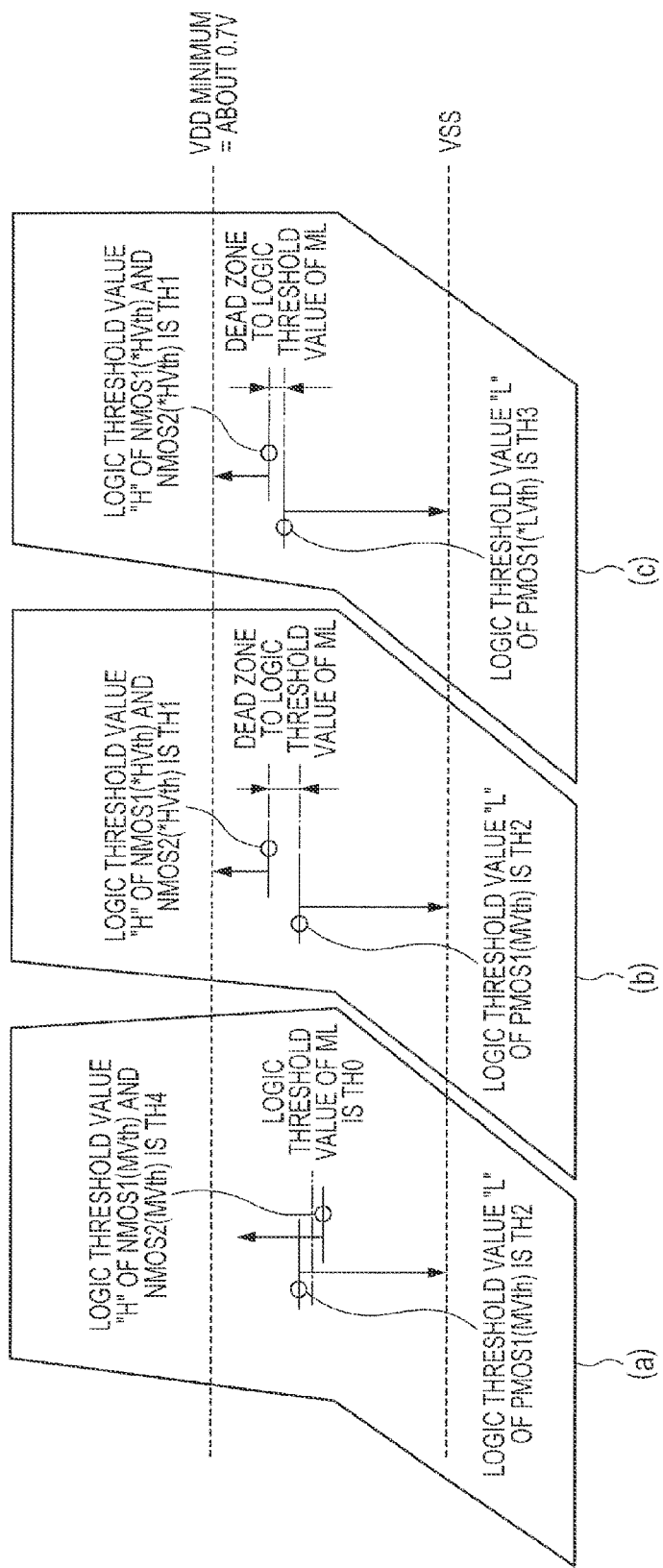
FIG. 7 is an explanatory drawing illustrating a dead zone of a first stage NAND circuit 21_A according to Embodiment 1.

FIG. 7 is an explanatory drawing illustrating the dead zone of the first stage NAND circuit 21_A illustrated in FIG. 4 according to Embodiment 1. The explanation given in the following holds true also for the first stage NAND circuit 21_B illustrated in FIG. 4, and the first stage NAND circuits 23_A and 23_B illustrated in FIG. 5.

A part enclosed with a solid line (a) in FIG. 7 illustrates a logic threshold value in the case where the PMOS transistor PMOS1 and the NMOS transistors NMOS1 and NMOS2 are formed with MVth MOS transistors. It is assumed that the logic threshold value of the PMOS transistor 195 is MVth always in the following cases.

In this case, the logic threshold value TH4 of the PMOS transistor PMOS1 is lower than the logic threshold value TH2 of the NMOS transistors NMOS1 and NMOS2. Therefore, when the voltage level of the match line ML lies between the threshold values TH1 and TH4, the PMOS transistor PMOS1, the NMOS transistor NMOS1, and the NMOS transistor NMOS2 are concurrently set to ON, and a flow-through current flows.

A part enclosed with a solid line (b) in FIG. 7 illustrates a logic threshold value in the case where the PMOS transistor PMOS1 is formed with an MVth MOS transistor and the NMOS transistors NMOS1 and NMOS2 are formed with HVth MOS transistors.

In this case, the logic threshold value TH1 of the NMOS transistors NMOS1 and NMOS2 is higher than the logic threshold value TH4 of the PMOS transistors PMOS1 and 195 in the NAND circuit 21_A.

Accordingly, there arises a dead zone in which none of the PMOS transistor PMOS1, the NMOS transistor NMOS1, and the NMOS transistor NMOS2 is set to ON. Consequently, the flow-through current can be prevented from flowing, at any level of the voltage of the match line ML.

A part enclosed with a solid line (c) in FIG. 7 illustrates the logic threshold value in the case where the NMOS transistor NMOS1 and the NMOS transistor NMOS2 are formed with HVth MOS transistors, and the PMOS transistor PMOS1 is formed with an LVth MOS transistor, as in the configuration adopted in a modified example of the present embodiment.

In this case, the logic threshold value TH3 of the LVth PMOS transistor PMOS1 is higher than the logic threshold value TH2 of the MVth PMOS transistor PMOS1 in the part enclosed with the solid line (b) in FIG. 7. That is, in this case, the logic threshold value TH3 of the PMOS transistor PMOS1 is higher than the threshold value of the general PMOS transistor composing the content addressable memory chip. However, as is the case with the part enclosed with the solid line (b) in FIG. 7, the logic threshold value TH1 of the NMOS transistors NMOS1 and NMOS2 is higher than the logic threshold value TH3 of the PMOS transistor PMOS1.

Accordingly, the dead zone, where none of the PMOS transistor PMOS1, the NMOS transistor NMOS1, and the NMOS transistor NMOS2 is set to ON, is produced in a level range narrower than that of the part enclosed with the solid line (b) in FIG. 7. Consequently, the flow-through current can be prevented from flowing, at any level of the voltage of the match line ML.

As the result that the logic threshold value TH3 of the PMOS transistor PMOS1, which has been formed to have LVth, becomes high in the present case, it is possible to sense Miss (non-coincidence) more quickly, when descent of the voltage level of the match line ML is slow due to a one-bit miss, etc.

Figure 8:
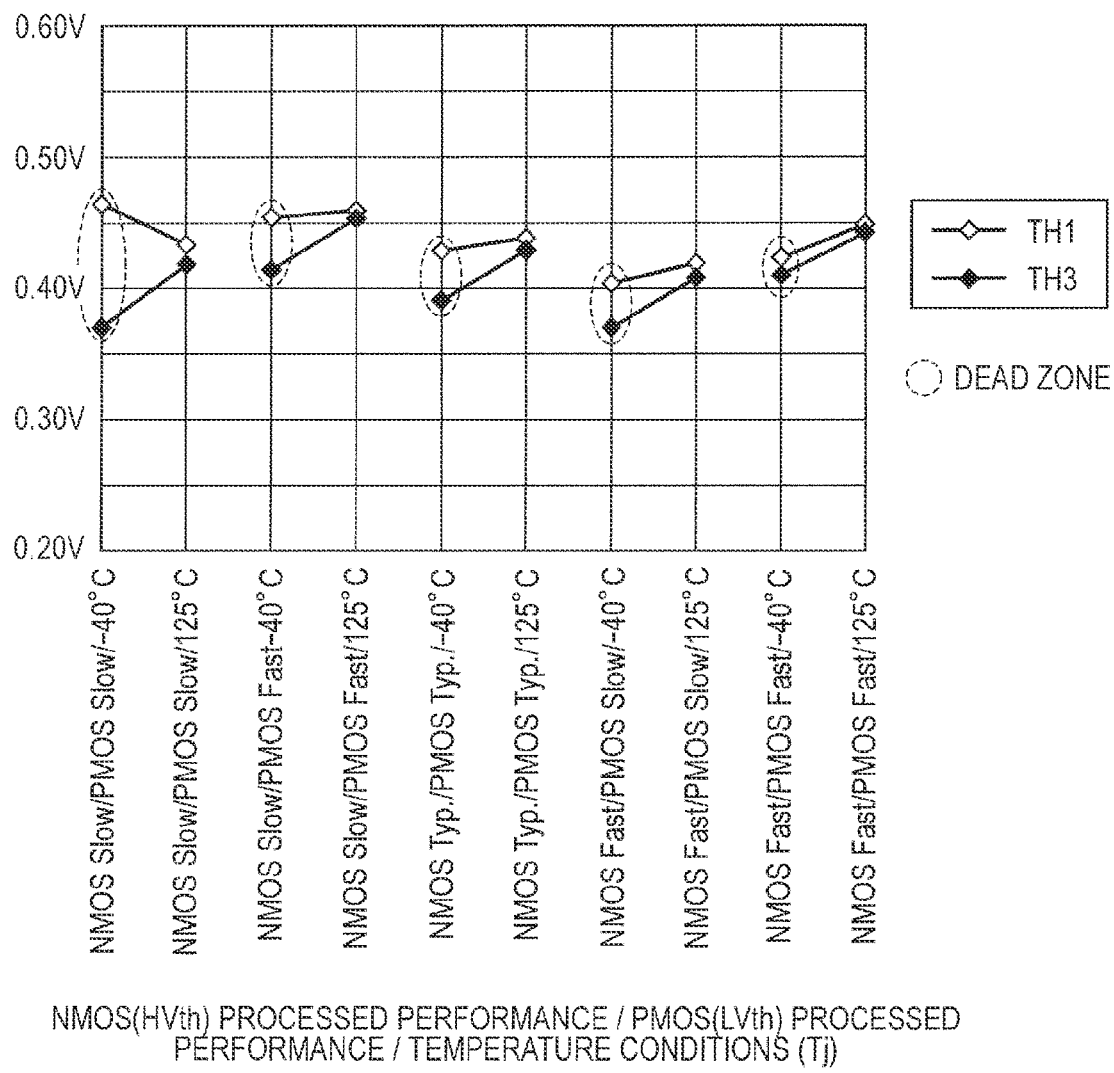
FIG. 8 is a drawing illustrating a simulation result of the dead zone.

(Simulation) FIG. 8 illustrates a simulation result of the dead zone.

FIG. 8 illustrates the logic threshold values TH1 and TH3 of the match amplifier, when VDD is set at a lower limit voltage (0.7V) and when temperature and process corner parameters are changed, for the case where HVth NMOS transistors are employed for the NMOS transistors NMOS1, NMOS2, NMOS3, and NMOS4 and LVth PMOS transistors are employed for the PMOS transistors PMOS1 and PMOS2, in the first stage NAND circuits 21_A and 21_B illustrated in FIG. 4. The logic threshold value TH1 is the logic threshold value of HVth NMOS transistors NMOS1, NMOS2, NMOS3, and NMOS4, as explained in the part enclosed with the solid line (c) illustrated in FIG. 7. The logic threshold value TH3 is the logic threshold value of LVth PMOS transistors PMOS1 and PMOS2, as explained in the part enclosed with the solid line (c) illustrated in FIG. 7.

The process corner parameters mean processed performance of the NMOS transistors NMOS1-NMOS4 and the PMOS transistors PMOS1 and PMOS2, and are shown here for combinations of Fast and Slow about the NMOS transistor and the PMOS transistor. The temperature is shown for two extremes of −40° C. and 125° C. The state of a dead zone at an arbitrary temperature between the two extremes can be estimated to some extent by connecting the two extremes with a line as illustrated in FIG. 8.

As illustrated in FIG. 8, in a high temperature condition, a dead zone becomes narrow, however, it is seen that, on all the conditions, the logic threshold value TH1 is higher than the logic threshold value TH3 and a dead zone is produced.

Figure 9:
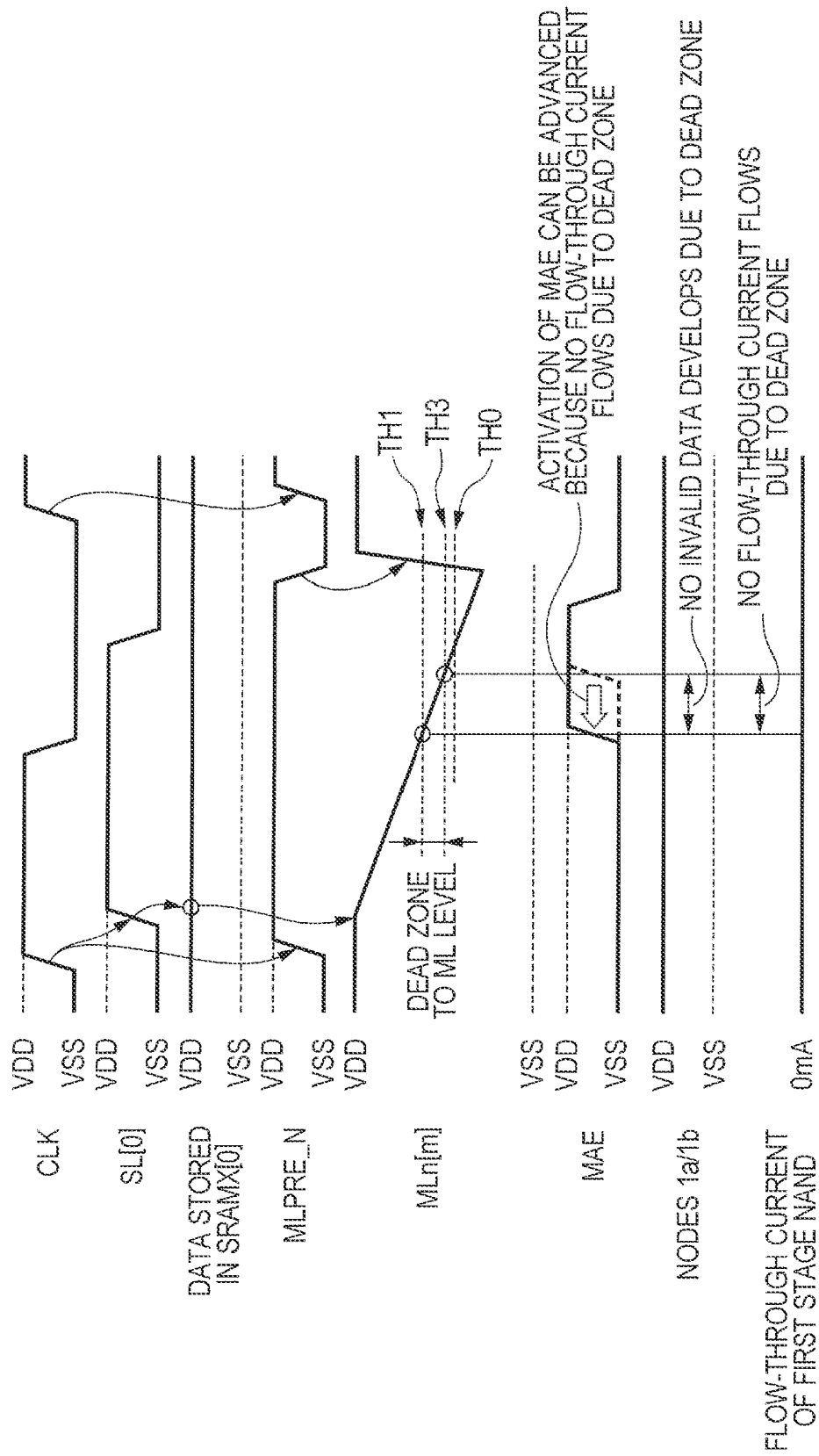
FIG. 9 is a drawing illustrating an effect of the dead zone according to the first stage NAND circuits 21_A and 21_B.

(Effect of a dead zone) FIG. 9 illustrates an effect of the dead zone according to the first stage NAND circuits 21_A and 21_B illustrated in FIG. 4.

FIG. 9 illustrates the operation at the time of a one-bit miss, for the case where HVth NMOS transistors are employed for the NMOS transistors NMOS1, NMOS2, NMOS3, and NMOS4 and LVth PMOS transistors are employed for the PMOS transistors PMOS1 and PMOS2, in the first stage NAND circuits 21_A and 21_B of the match amplifier first unit illustrated in FIG. 4. Same applies also to the match amplifier middle unit illustrated in FIG. 5.

As illustrated in FIG. 9, at the time of a one-bit miss, the match line MLn[m] descends gently. In particular, on the conditions that the search transistors N51-N54 illustrated in FIG. 2 are Slow in the processed performance, local variations with decreasing drain current Id are present, the temperature is low, and the VDD is minimum, then, the drain Id becomes considerably small and the descending speed of the match line MLn[m] becomes considerably slow.

When MVth MOS transistors are employed for the NMOS transistors NMOS1, NMOS2, NMOS3, and NMOS4, and for the PMOS transistors PMOS1 and PMOS2, it is difficult to activate the match amplifier activation signal MAE until the match line MLn[m] becomes less than the logic threshold value TH0. This is because, when activated, invalid data is generated and the consumption current increases. As for PMOS1, NMOS1, and NMOS2 or PMOS2, NMOS3, and NMOS4, when the match line MLn[m] is at a middle potential and lies between the threshold values TH1 and TH4, as in the explanation of the part enclosed with the solid line (a) in FIG. 7, these transistors are set to ON concurrently and a flow-through current flows, generating a power supply noise which causes the circuit malfunctions.

In contrast with this, when HVth NMOS transistors are employed for the NMOS transistors NMOS1, NMOS2, NMOS3, and NMOS4 and LVth PMOS transistors are employed for the PMOS transistors PMOS1 and PMOS2, it is possible to advance the timing to activate the match amplifier activation signal MAE to the timing when the match line MLn[m] becomes less than the logic threshold value TH1. Accordingly, it is possible to enhance the access speed in the case of Hit (coincidence) in particular, thereby it is possible to advance the timing to retrieve and latch the internal data MAOUT1[m] to the pre-latch 121 of the match amplifier last unit illustrated in FIG. 6. Therefore, it is possible to attain overall improvement in the search operation frequency. When the match amplifier activation signal MAE rises, the match line MLn[m] is between the logic threshold values TH1 and TH3. Accordingly, the invalid data is not generated owing to the dead zone, and no flow-through current flows.

Figure 10:
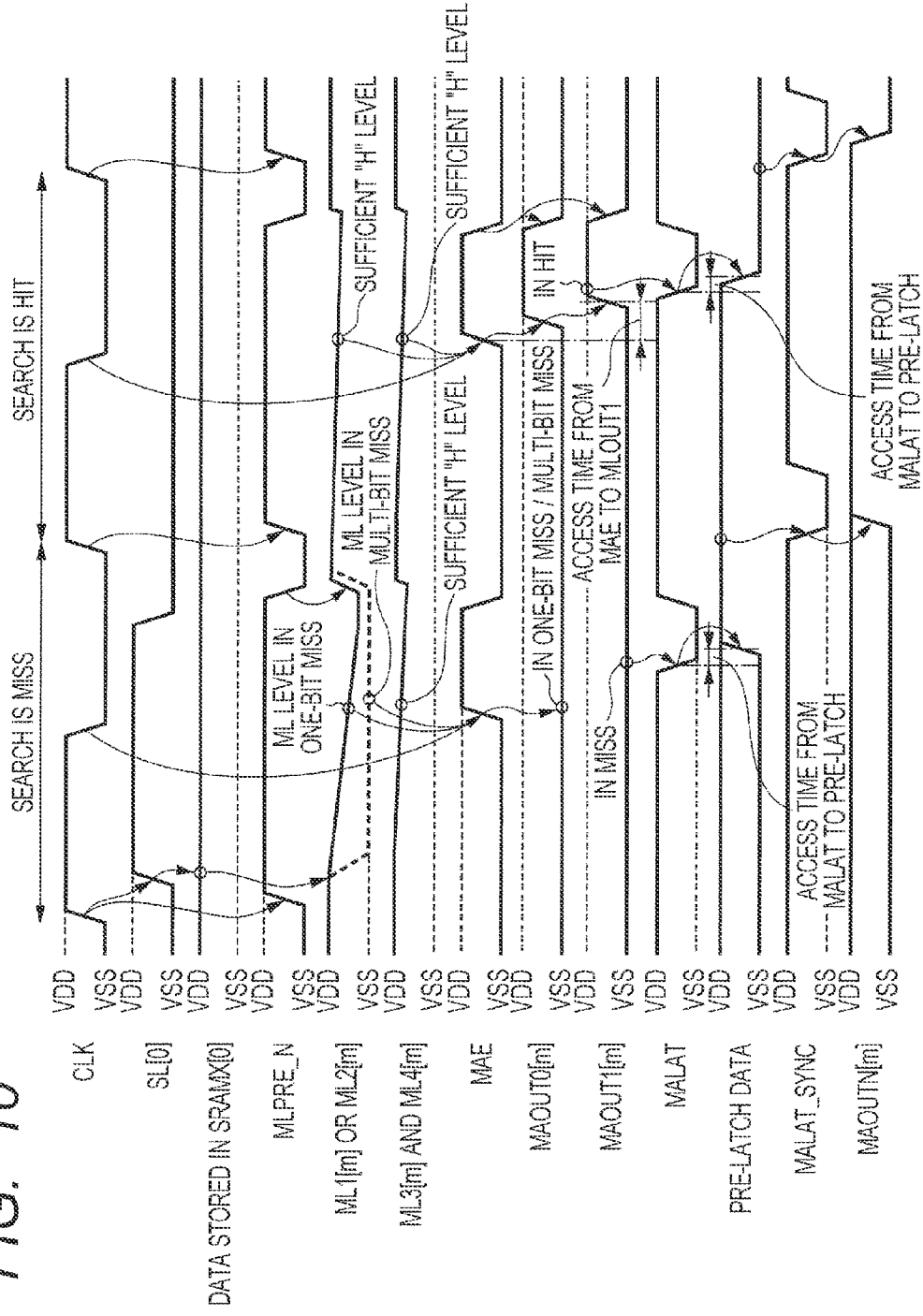
FIG. 10 is a drawing illustrating waveforms in continuous search operations when only a match line ML1[$m$] or a match line ML2[$m$] is Miss (non-coincidence) in the first half, and all the match lines are Hit (coincidence) in the second half.

(The entire operation) FIG. 10 illustrates waveforms in continuous search operations when only a match line ML1[m] or a match line ML2[m] is Miss (non-coincidence) in the first half, and all the match lines are Hit (coincidence) in the second half.

In the first half, the internal data wirings MAOUT0[m] and MAOUT1[m] do not change, remaining at "L." Consequently, in contrast to the charge and discharge of the match line occurring in Miss, the charge and discharge of the internal data wiring do not occur, except for the pre-latch 121, the output latch 122, and the output data wiring MAOUTN when the previous search has been Hit "coincidence" and the state has been latched. Even if all the CAM cells of about 80 bits of an entry are non-coincidence, the operation of the internal data wiring is the same as the present case.

In the second half, triggered by a rising edge of the match amplifier activation signal MAE, the match amplifier first unit 11[m] and the match amplifier middle unit 12[m] illustrated in FIG. 3 sense an "H" level (coincidence) of the match lines ML[1]-ML[4], and the internal data wirings MAOUT0[m] and MAOUT1[m] both change from an "L" level to an "H" level. After that, triggered by a falling edge of the match amplifier activation signal MAE, the internal data wirings MAOUT0[m] and MAOUT1[m] both change from an "H" level to an "L" level.

Triggered by the falling of the pre-latch signal MALAT, the data of the internal data wiring MAOUT1[m] is transferred to the pre-latch 121 illustrated in FIG. 6, and the pre-latch 121 latches the data received. After that, triggered by the falling of the output latch signal MALAT_SYNC, the data latched in the pre-latch 121 is transferred to the output latch 122, and the output latch 122 outputs the data received, to the output data wiring MAOUT0[m].

Therefore, in the search in the case of Hit (coincidence), the charge and discharge of the internal data wirings MAOUT0[m] and MAOUT1[m] occur, although the discharge of the match line does not occur. The simulation has revealed that the charge and discharge current of these internal data wirings is about 50% of the charge and discharge current of the match line. This charge and discharge current is utilized in the dummy search function to be described later.

In FIG. 10, a falling edge of the pre-latch signal MALAT is delayed particularly, relative to a rising edge of the match amplifier activation signal MAE, by the access time of Hit (coincidence) after the match amplifier activation signal MAE rises until the signal of the internal data wiring MAOUT1[m] is reversed. That is, after the search result of Hit (coincidence) has reached the pre-latch 121 illustrated in FIG. 6 via the internal data wiring MAOUT1[m], the clocked inverter 32 of the pre-latch 121 is set to ON, to take the data into the pre-latch 121. Accordingly, the spread of invalid data can be prevented, that is, the state of Miss (non-coincidence) in standby can be prevented from propagating to the pre-latch circuit until Hit (coincidence) propagates. Therefore, it is possible to avoid the power consumption due to the excessive charge and discharge of the internal data wirings arranged in the latter stages of the pre-latch circuit.

Since the pre-latch signal MALAT is delayed similarly in the left half of FIG. 10, the access time to the pre-latch of Miss (non-coincidence) and Hit (coincidence) is nearly the same.

Figure 11:
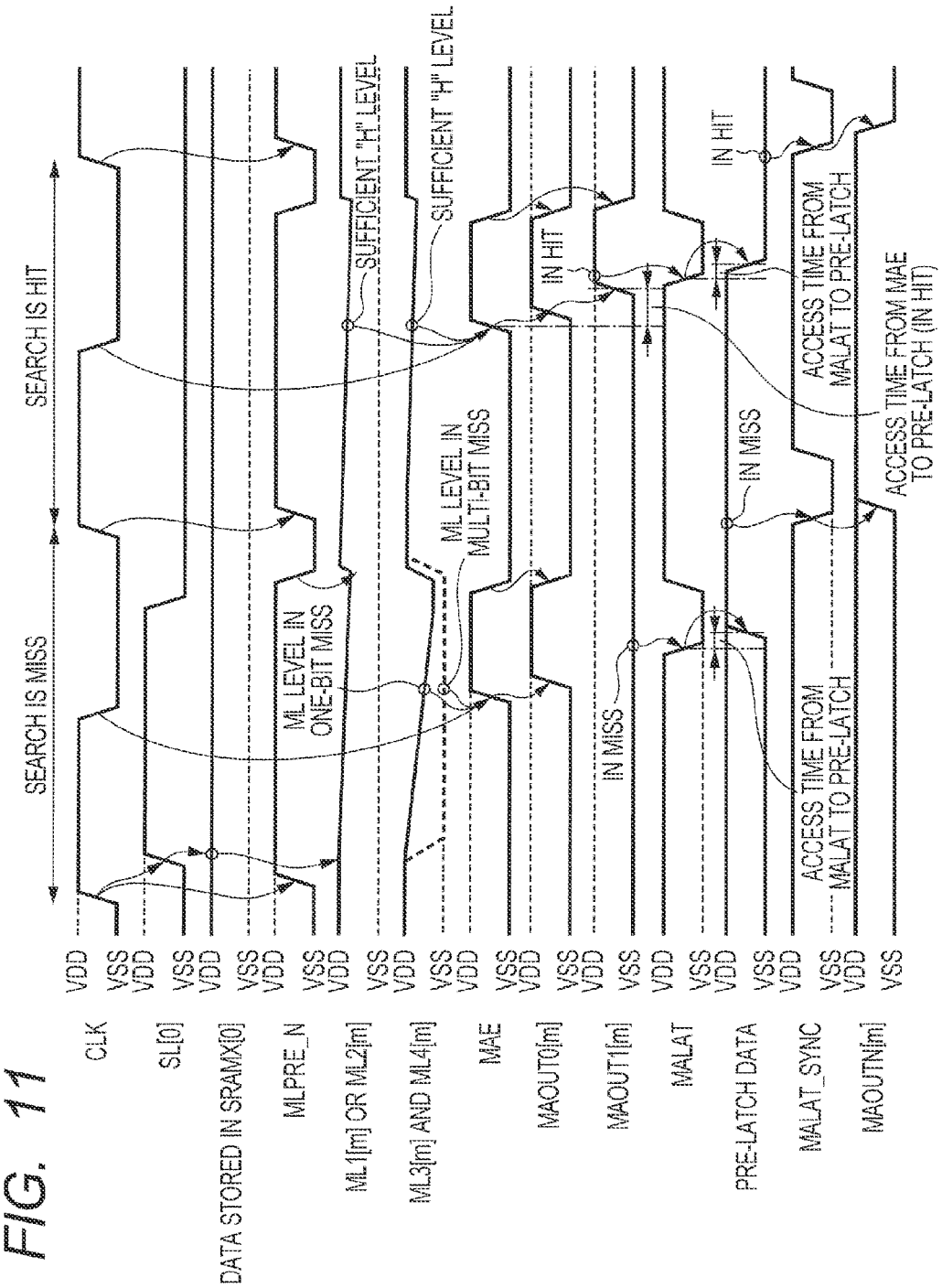
FIG. 11 is a drawing illustrating waveforms in continuous search operations when only a match line ML3[$m$] or a match line ML4[$m$] is Miss (non-coincidence) in the first half, and all the match lines are Hit (coincidence) in the second half.

FIG. 11 illustrates waveforms in continuous search operations when only the match line ML3[m] or the match line ML4[m] is Miss (non-coincidence) in the first half, and all the match lines are Hit (coincidence) in the second half.

In the first half, triggered by a rising edge of the match amplifier activation signal MAE, the internal data wiring MAOUT0[m] changes from an "L" level to an "H" level, reflecting the fact that ML1[m] and ML2[m] are partially Hit (coincidence). After that, MAOUT0[m] changes from an "H" level to an "L" level, triggered by the falling edge of the match amplifier activation signal MAE. Therefore, the charge and discharge take place up to the internal data wiring MAOUT0 [m]. Since the match line ML3[m] or ML4[m] is in the state of Miss (non-coincidence), the internal data wiring MAOUT1 [m] is not inverted and keeps an "L" level; accordingly, no charge and discharge current are generated in MAOUT1[m].

The operation of the latter half is the same as that of FIG. 10. As described above, according to the present embodiment, the match amplifier has a dead zone to an input of a voltage of the match line ML, and has a property that no flow-through current is present in the match amplifier. Accordingly, it is possible to advance the timing of activating the match amplifier activation signal MAE, and to enhance the search operation frequency by shortening the search operation cycle.

Modified Example 1 of Embodiment 1

Figure 12:
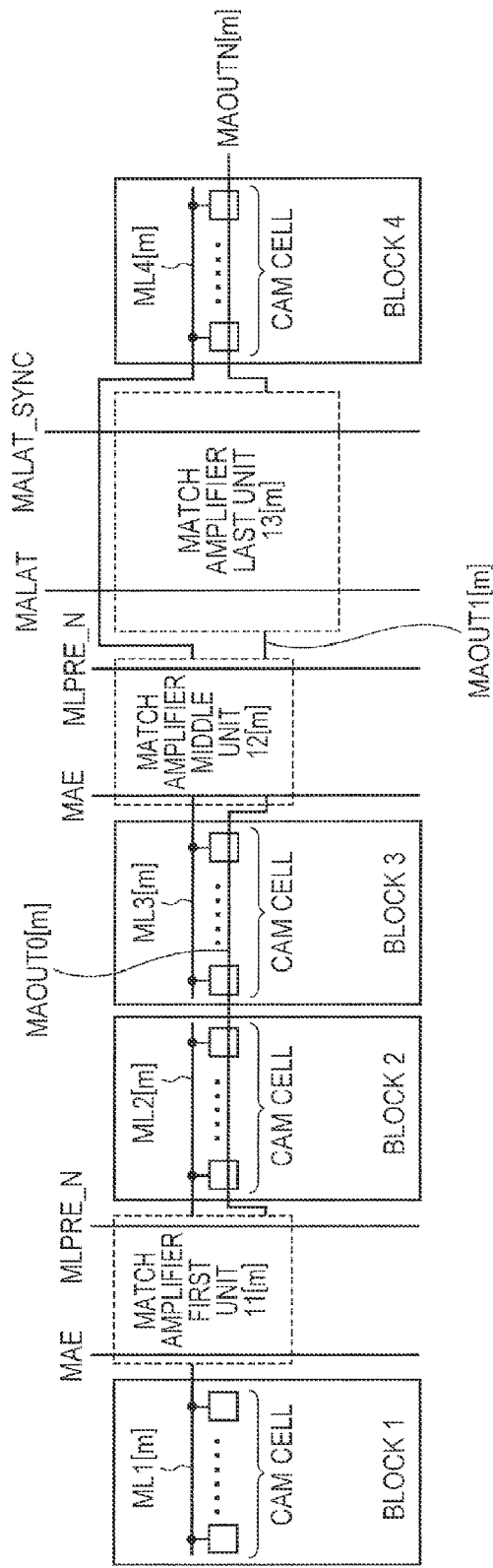
FIG. 12 is a drawing illustrating a configuration of a CAM cell array and a match amplifier according to a modified example 1 of Embodiment 1.

FIG. 12 illustrates a configuration of a CAM cell array and a match amplifier according to a modified example 1 of Embodiment 1.

In the modified example 1, in order to improve the access speed at the time of Hit, the match amplifier last unit 13[m] is arranged next to the match amplifier middle unit 12[m]. Accordingly, it is possible to shorten the length of the internal data wiring MAOUT1[m], leading to improvement of the access speed to the match amplifier last unit 13[m].

FIGS. 3 and 12 illustrate the example in which the CAM cell array 507 and the match line ML are divided into four blocks. However, the division is not restricted to four blocks.

When divided into six blocks, it is only necessary to arrange an additional match amplifier middle unit 12[m] between the fifth block and the sixth block and to couple the output internal data wiring to the match amplifier last unit. It can be accomplished by coupling the internal data wiring outputted by the match amplifier middle unit 12[m] arranged between the third block and the fourth block, to the internal data wiring of the additional match amplifier middle unit 12[m] arranged between the fifth block and the sixth block. It is also possible to adopt the similar arrangement and coupling, even when the match line is divided into eight or ten blocks.

In the case described above, the match amplifier last unit may be arranged next to the last-stage match amplifier middle unit, or it may be arranged next to the last-stage block.

In general, when a CAM cell array and a match line are divided into the first to the 2n-th block (n is a natural number), a match amplifier comprises the first to the n-th determination circuit (a match amplifier first unit and a match amplifier middle unit) and the latch circuit (match amplifier last unit) which latches and outputs the output of the n-th determination circuit.

The internal data wirings which couple in series the first to the n-th determination circuit and the latch circuit are provided for every entry. The i-th determination circuit (1≤i≤n) is arranged between the (2i−1)-th block and the 2i-th block.

The i-th determination circuit (1≤i≤n) comprises a first and a second NAND circuit which are fed from a match line of the (2i−1)-th block and a match line of the 2i-th block, respectively, and a logic circuit (including a NOR circuit and a buffer unit) which performs logical operation of an output of the first and the second NAND circuit and an output of a determination circuit in the preceding stage transferred through the internal data wiring, and which outputs the logical operation result to the internal data wiring. The latch circuit is arranged at either of adjacent sides of the 2n-th block.

Modified Example 2 of Embodiment 1

In the modified example 2, explanation is made for a logic threshold value and a dead zone in the case where the NMOS transistor NMOS1 is formed to have HVth and the PMOS transistor PMOS1 is formed to have LVth, among the transistors composing the first stage NAND circuit 21_A illustrated in FIG. 4. That is, it is assumed in the present modified example that the NMOS transistor NMOS2 employs an MVth MOS transistor. The explanation given here applies equally to the first stage NAND circuit 21_B illustrated in FIG. 4, and the first stage NAND circuits 23_A and 23_B illustrated in FIG. 5.

Figure 13:
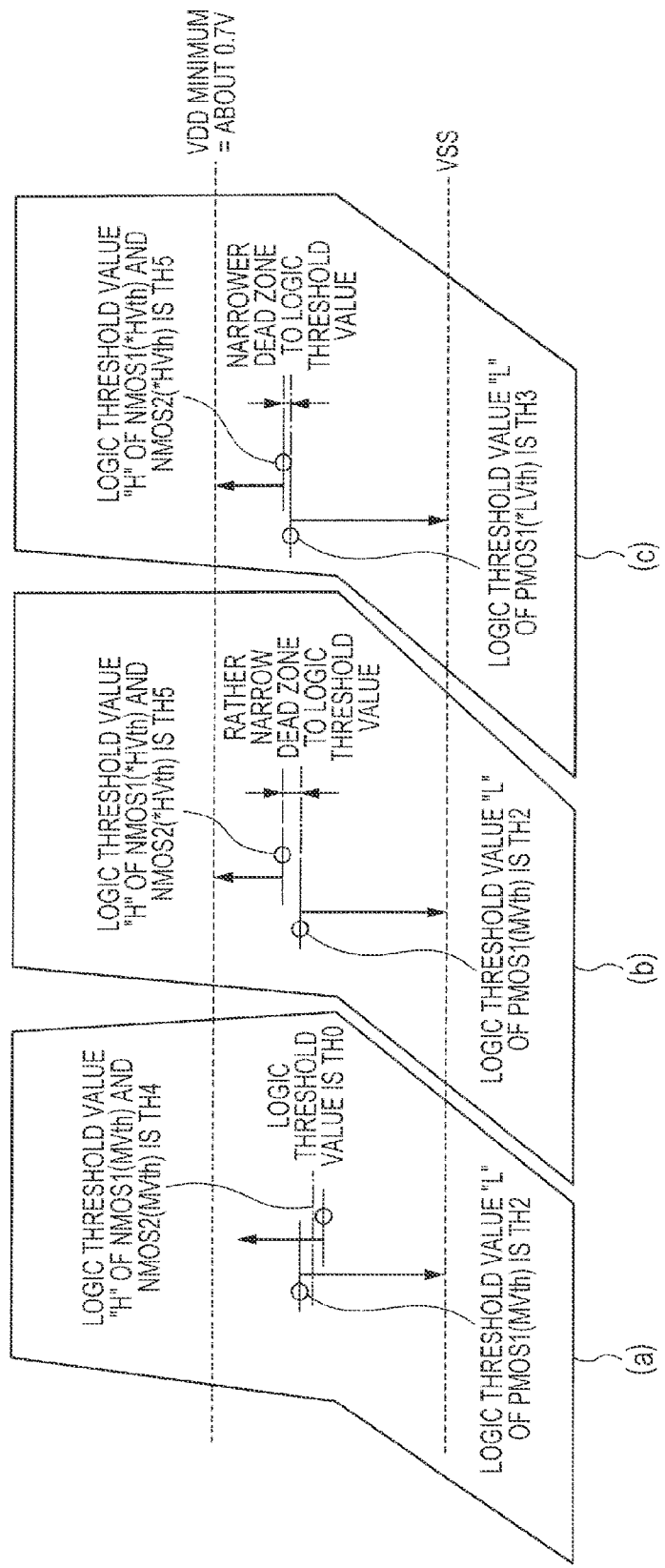
FIG. 13 is an explanatory drawing illustrating a dead zone of a first stage NAND circuit 21_A according to a modified example 2 of Embodiment 1.

FIG. 13 is an explanatory drawing illustrating a dead zone of the first stage NAND circuit 21_A according to the modified example 2 of Embodiment 1.

A part enclosed with a solid line (a) in FIG. 13 illustrates a logic threshold value in the case where the PMOS transistor PMOS1 and the NMOS transistors NMOS1 and NMOS2 are formed with MVth MOS transistors.

In this case, the logic threshold value TH4 of the PMOS transistor PMOS1 is higher than the logic threshold value TH2 of the NMOS transistors NMOS1 and NMOS2. When the voltage level of the match line ML lies between the threshold values TH1 and TH4, the PMOS transistor PMOS1, the NMOS transistor NMOS1, and the NMOS transistor NMOS2 are concurrently set to ON, and a flow-through current flows.

A part enclosed with a solid line (b) in FIG. 13 illustrates a logic threshold value in the case where the PMOS transistor PMOS1 is formed with an MVth MOS transistor and the NMOS transistor NMOS1 is formed with an HVth MOS transistor.

Even in the present case, as is the case with the part enclosed with the solid line (b) in FIG. 7, the logic threshold value TH5 of the NMOS transistors NMOS1 and NMOS2 is higher than the logic threshold value TH2 of the PMOS transistor PMOS1.

Accordingly, in the present modified example, there arises a dead zone in which none of the PMOS transistor PMOS1, the NMOS transistor NMOS1, and the NMOS transistor NMOS2 is set to ON. Consequently, the flow-through current can be prevented from flowing, at any level of the voltage of the match line ML.

A part enclosed with a solid line (c) in FIG. 13 illustrates a logic threshold value in the case where only the NMOS transistor NMOS1 is formed with an HVth MOS transistor and the PMOS transistor PMOS1 is formed with an LVth MOS transistor.

Even in this case, the logic threshold value TH3 of the LVth PMOS transistor PMOS1 is higher than the logic threshold value TH2 of the MVth PMOS transistor PMOS1 in the part enclosed with the solid line (b) in FIG. 13. As is the case with the part enclosed with the solid line (b) in FIG. 13, the logic threshold value TH5 of the NMOS transistors NMOS1 and NMOS2 is higher than the logic threshold value TH3 of the PMOS transistor PMOS1.

Accordingly, as is the case with the part enclosed with the solid line (b) illustrated in FIG. 13, there arises a dead zone in which none of the PMOS transistor PMOS1, the NMOS transistor NMOS1, and the NMOS transistor NMOS2 is set to ON. Consequently, the flow-through current can be prevented from flowing, at any level of the voltage of the match line ML. Since only the NMOS transistor NMOS1 is formed to have HVth, the logic threshold values of two stages of the NMOS transistors NMOS1 and NMOS2 are low, and the width of the dead zone is narrow. However, no flow-through current flows no matter what level the match line ML may be, because there is the dead zone.

Even if the level of the match line falls due to an off state leakage current of the search transistor in the case of the Hit (coincidence) search operation at a low frequency, the logic threshold value is lower, compared with two stages of the NMOS transistors NMOS1 (HVth) and NMOS2 (HVth); therefore it takes time before the level of the match line reaches the logic threshold value TH5, and the data hold time can be improved.

In the case where the match line is inputted to the NMOS transistor NMOS2 among the NMOS transistors NMOS1 and NMOS2, the NMOS transistor NMOS2 is formed to have HVth. By doing so, it is possible to prevent the flow-through current from flowing when the match line is at a middle potential.

When descent of the level of the match line ML is slow due to a one-bit miss, etc., as a result of the increased logic threshold value TH3 of the PMOS transistor PMOS1 having been formed to have LVth, it is possible to sense Miss (non-coincidence) more quickly.

Modified Example 3 of Embodiment 1

Figure 14:
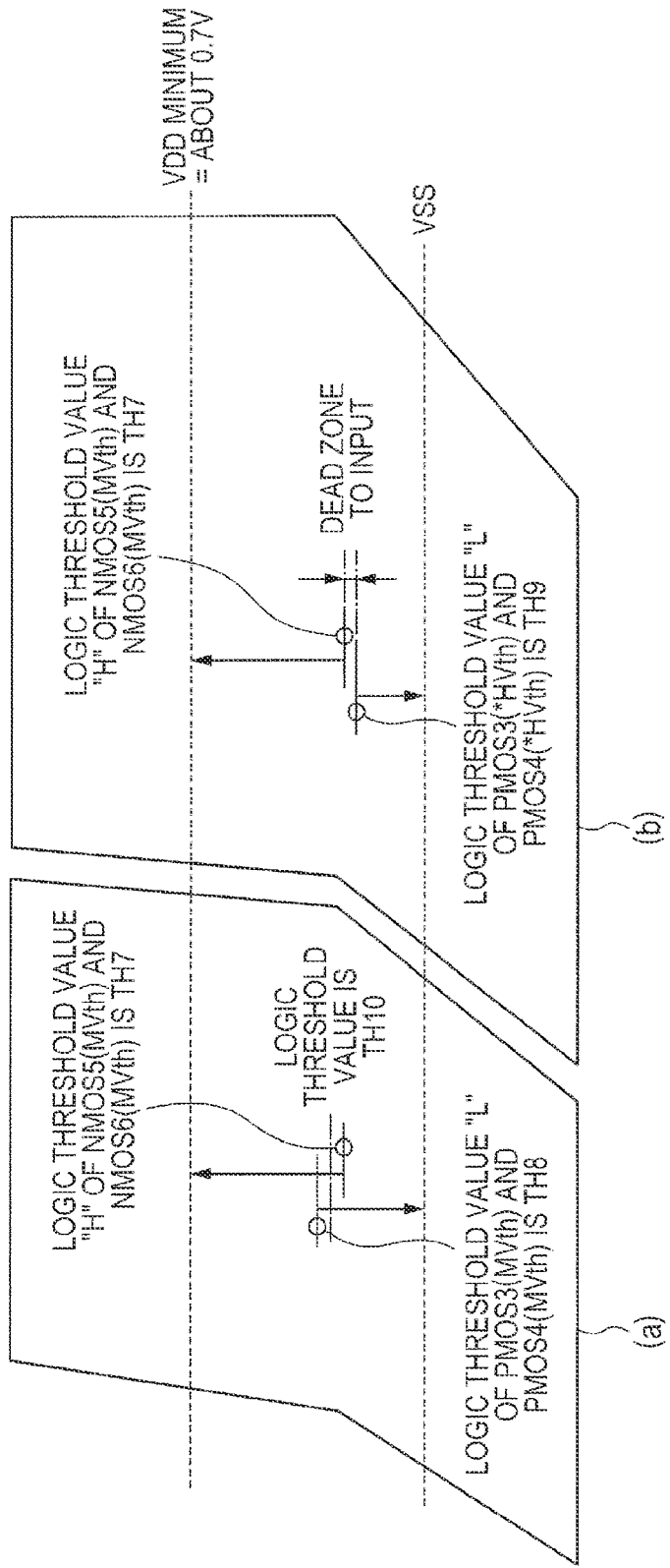
FIG. 14 is a drawing illustrating a logic threshold value and a dead zone to an input of a second stage NOR circuit.

FIG. 14 illustrates a logic threshold value and a dead zone to an input of the second stage NOR circuit.

A part enclosed with a solid line (a) in FIG. 14 illustrates the logic threshold value in the case where all of the NMOS transistor NMOS5, the NMOS transistor NMOS6, the PMOS transistor PMOS3, and the PMOS transistor PMOS4 are formed with MVth MOS transistors.

In this case, the logic threshold value TH8 of the PMOS transistors PMOS3 and PMOS4 is higher than the logic threshold value TH7 of the NMOS transistors NMOS5 and NMOS6. When the input voltage level of the second stage NOR circuit is between the threshold values TH7 and TH8, the PMOS transistors PMOS3 and PMOS4, and the NMOS transistor NMOS5 and NMOS6 are set to ON concurrently and a flow-through current flows.

A part enclosed with a solid line (b) in FIG. 14 illustrates the logic threshold value in the case where the NMOS transistor NMOS5 and the NMOS transistor NMOS6 are formed with MVth MOS transistors and the PMOS transistor PMOS3 and the PMOS transistor PMOS4 are formed with HVth MOS transistors.

In this case, the logic threshold value TH9 of the PMOS transistors PMOS3 and PMOS4 is lower than the logic threshold value TH7 of the PMOS transistors NMOS5 and NMOS6.

Accordingly, there occurs a dead zone in which the PMOS transistors PMOS3 and PMOS4 and the NMOS transistors NMOS5 and NMOS6 are not set to ON concurrently. Consequently, the flow-through current can be prevented from flowing at any level of the voltage inputted into the NOR circuit.

Figure 15:
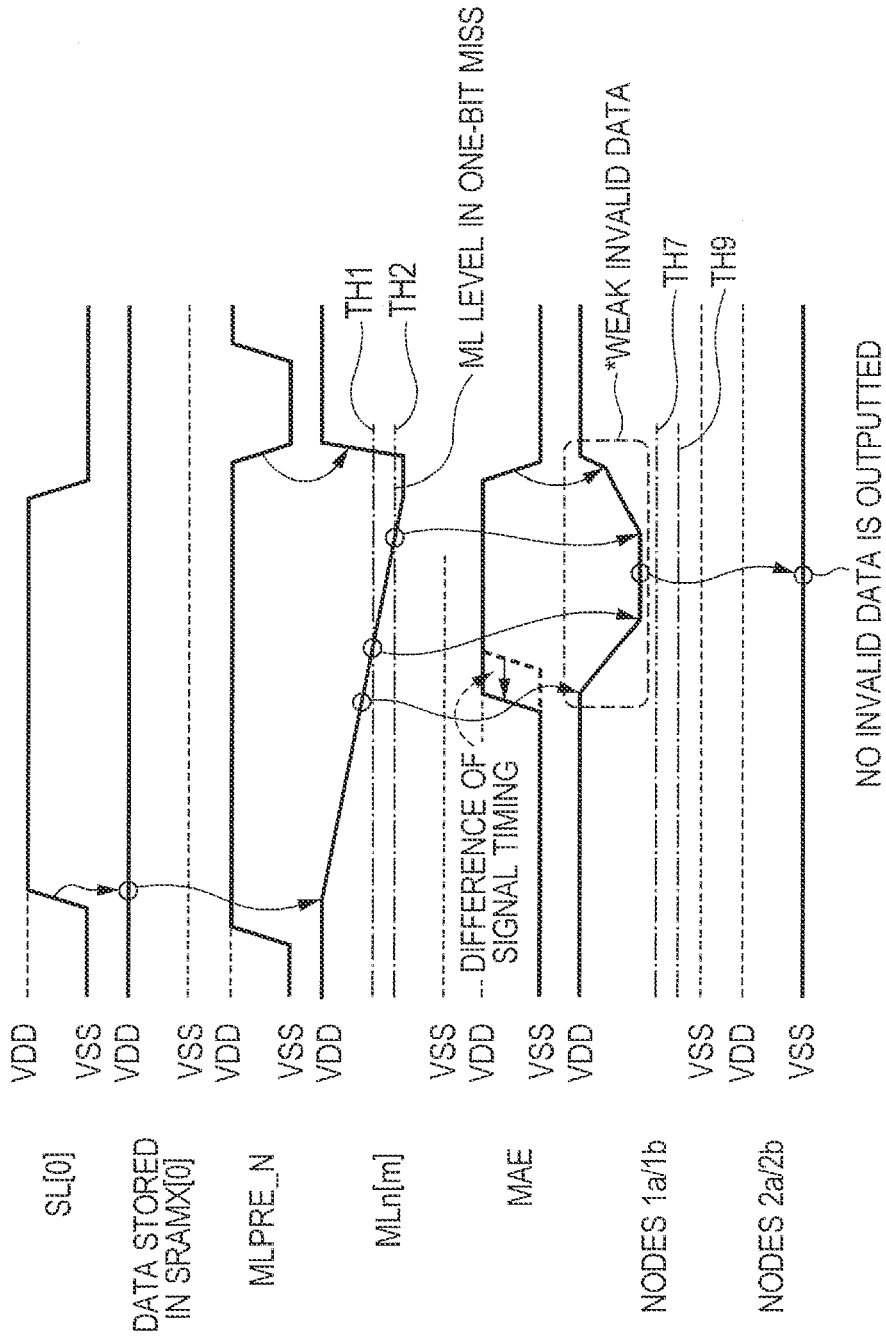
FIG. 15 is a drawing illustrating a case where activation timing of a match amplifier activation signal is advanced due to a noise or other factors and a middle potential close to an "L" level is outputted.

FIG. 15 illustrates a case where activation timing of the match amplifier activation signal MAE is advanced due to a power supply noise and other factors, and the first stage NAND outputs a middle potential close to an "L" level, in the match amplifier first unit illustrated in FIG. 4. Same applies also to the match amplifier middle unit illustrated in FIG. 5.

In the present example, as illustrated in the part enclosed with the solid line (a) in FIG. 14, it is assumed that the NMOS transistors NMOS5 and NMOS6, and the PMOS transistors PMOS3 and PMOS4 are formed with MVth MOS transistors. Even in the present case, the operation is normal as shown in the following.

The match amplifier activation signal MAE is activated at a time when the level of the match line MLn[m] is somewhat higher than a logic threshold value "H" of the first stage NAND circuit 21_A or 21_B. Therefore, the node 1a or the node 1b as the output of the first stage NAND circuit 21_A or 21_B descends. However, the gradient of the descent becomes comparatively slow at this time, because the level of the match line MLn[m] exceeds the logic threshold value "H" of the first stage NAND circuit 21_A or 21_B just slightly. Immediately after that, the match line MLn[m] reaches the dead zone of the first stage NAND circuit. Accordingly, the descent of the node 1a or the node 2b, as the output of the first stage NAND circuit 21_A or 21_B, stops. As illustrated in FIG. 15, an "L" level of the weak invalid data of the node 1a or the node 2b, as the output of the first stage NAND circuit 21_A or 21_B, does not reach the low logic threshold value of the second stage NOR circuit 22. Thereby, the second stage NOR circuit 22 can prevent generation of the invalid data. In this way, there is a merit that the invalid data is not generated easily, because the logic threshold value to the input of the second stage NOR circuit 22 is low.

As illustrated in the part enclosed with the solid line (b) in FIG. 14, by forming PMOS3 and PMOS4 of the second stage NOR circuit 22 to have a logic threshold value of HVth, it is possible to further lower the logic threshold value "L" to an input, and to realize a circuit configuration which is more resistant to generation of the invalid data. Even by forming one of PMOS3 and PMOS4 of the second stage NOR circuit 22 to have a logic threshold value of HVth and forming the other to have a logic threshold value of MVth, the logic threshold value "L" to the input of the second stage NOR circuit 22 becomes low, particularly at the minimum of VDD at which the invalid data tends to generate; therefore, some effects are obtained even in the present case.

Modified Example 4 of Embodiment 1

Figure 16:
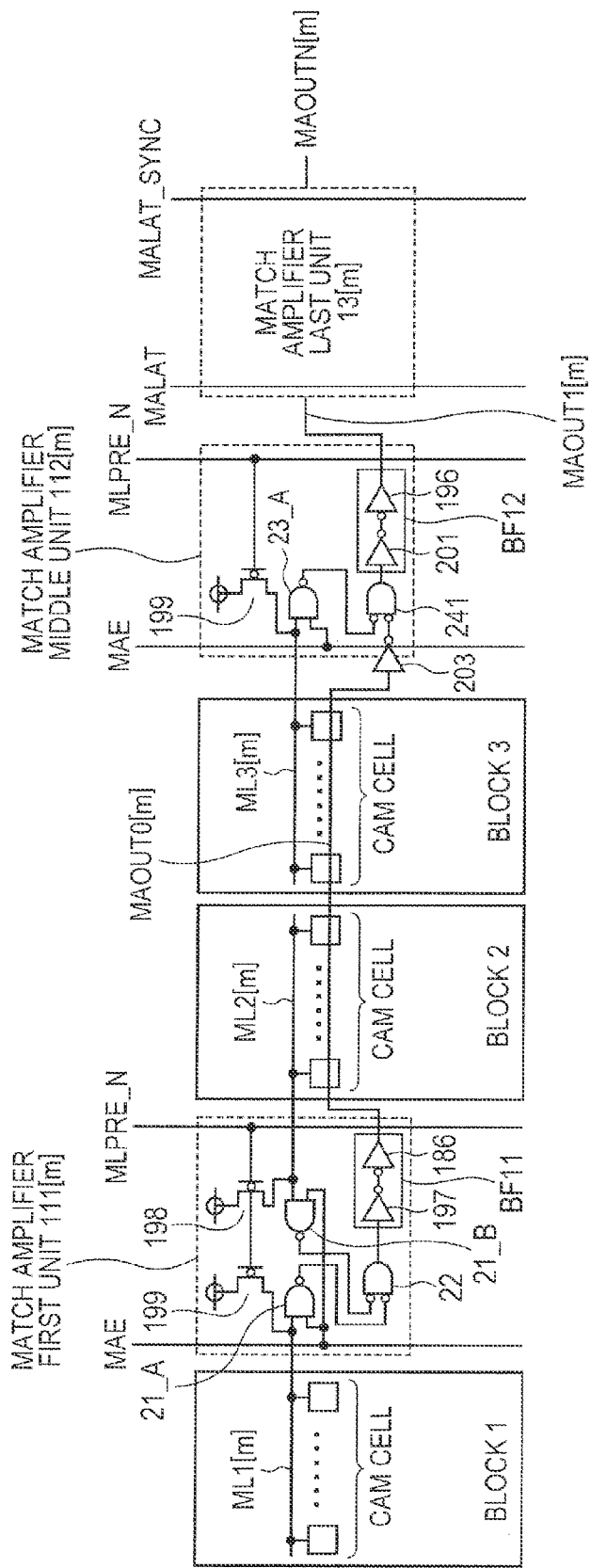
FIG. 16 is a drawing illustrating a configuration of a CAM cell array and a match amplifier according to a modified example 4 of Embodiment 1.

FIG. 16 illustrates a configuration of a CAM cell array and a match amplifier according to a modified example 4 of Embodiment 1.

In the present modified example, the CAM cell array 507 and the match line ML are divided into three blocks, Block 1-Block 3. Accordingly, one match line is divided into three match lines ML1[m]-ML3[m].

A match amplifier first unit 111[m] is arranged between Block 1 and Block 2.

A match amplifier middle unit 112[m] is arranged next to Block 3. Next to the match amplifier middle unit 112[m], a match amplifier last unit 13[m] is arranged.

The match amplifier first unit 111[m] takes in voltages of the match lines ML1[m] and ML2[m] which have changed by the search of an entry[m] in Block 1 and Block 2, and outputs a voltage indicating that the entry[m] of Block 1 and the entry[m] of Block 2 are coincidence concurrently, to an internal data wiring MAOUT0[m].

The internal data wiring MAOUT0[m] is coupled to the match amplifier middle unit 112[m] via Block 2 and Block 3.

The match amplifier middle unit 112[m] takes in a voltage of the match line ML3[m] which has changed by the search of the entry[m] in Block 3 and a voltage of the internal data wiring MAOUT0[m], and outputs a voltage indicating that the entry[m] of Block 1 through the entry[m] of Block 3 are coincidence concurrently, to an internal data wiring MAOUT1[m].

The internal data wiring MAOUT1[m] is coupled to the match amplifier last unit 13[m]. The match amplifier last unit 13[m] takes in a voltage of the internal data wiring MAOUT1[m], and outputs a match amplifier output signal to an output data wiring MAOUTN, according to a pre-latch signal MALAT and an output latch signal MALAT_SYNC.

As is the case with the match amplifier first unit 11[m] illustrated in FIG. 4, the match amplifier first unit 111[m] illustrated in FIG. 16 comprises PMOS transistors 198 and 199, first stage NAND circuits 21_A and 21_B, and a second stage NOR circuit 22. The match amplifier first unit 111[m] further comprises a buffer unit BF11.

As is the case with the match amplifier middle unit 12[m] illustrated in FIG. 5, the match amplifier middle unit 112[m] illustrated in FIG. 16 comprises a PMOS transistor 199 and a first stage NAND circuit 23_A. The match amplifier middle unit 112[m] further comprises an inverter 203 for adjusting the data polarity when inputting MAOUT0[m].

Unlike the match amplifier middle unit 12[m] illustrated in FIG. 5, the match amplifier middle unit 112[m] illustrated in FIG. 16 does not comprise the PMOS transistor 198 and the first stage NAND circuit 23_B. The NAND 191 of the buffer unit BF12 of the match amplifier middle unit 12[m] illustrated in FIG. 5 has been changed to an inverter 201 of the buffer unit BF12 as will be explained in the following.

The match amplifier middle unit 112[m] illustrated in FIG. 16 further comprises a second stage NOR circuit 241 and a buffer unit BF12.

The second stage NOR circuit 241 illustrated in FIG. 16 differs from the second stage NOR circuit 24 of the match amplifier middle unit 12[m] illustrated in FIG. 4 in that one input thereof is coupled to an output of the first stage NAND circuit 23_A, and the other input is coupled to an output of the inverter 203 and receives the inverted internal data wiring MAOUT0[m]. The second stage NOR circuit 241 operates a non-disjunction of these two inputs and outputs the result to the buffer unit BF12.

Unlike the buffer unit BF2 of the match amplifier middle unit 12[m] illustrated in FIG. 4, the buffer unit BF12 illustrated in FIG. 16 comprises two stages of inverters 201 and 196. The buffer unit BF12 outputs the data inputted from the second stage NOR circuit 241 to the internal data wiring MAOUT1.

The match amplifier last unit 13[m] illustrated in FIG. 16 is the same as the match amplifier last unit 13[m] illustrated in FIG. 6.

In general, when a CAM cell array and a match line are divided into the first to the (2n+1)-th block (n is a natural number), the match amplifier comprises a first determination circuit (a match amplifier first unit, same as in FIG. 4), a second determination circuit through an n-th determination circuit (a match amplifier middle unit, same as in FIG. 5), an (n+1)-th determination circuit (the same as the match amplifier middle unit 112[m] illustrated in FIG. 16), and a latch circuit (the same as the match amplifier last unit 13[m] illustrated in FIG. 16) which latches and outputs the output of the (n+1)-th determination circuit.

Internal data wirings which couple in series the first to the (n+1)-th determination circuit and the latch circuit are provided for every entry.

The i-th determination circuit (1≤i≤n) is arranged between the (2i−1)-th block and the 2i-th block. The i-th determination circuit (1≤i≤n) comprises a first and a second NAND circuit which are fed from a match line of the (2i−1)-th block and a match line of the 2i-th block, respectively, and a logic circuit which performs logical operation of outputs of the first and the second NAND circuit and an output of a determination circuit in the preceding stage transferred through the internal data wiring, and which outputs the logical operation result to the internal data wiring.

The (n+1)-th determination circuit is arranged at either of adjacent sides of the (2n+1)-th block. The (n+1)-th determination circuit comprises a NAND circuit to which a match line (2n+1) of the (2n+1)-th block is inputted, and a logic circuit (a NOR circuit and a buffer unit) which performs logical operation of an output of the n-th determination circuit in the preceding stage transferred through the internal data wiring, and outputs the result to the match amplifier last unit. The match amplifier last unit is arranged next to the (n+1)-th determination circuit or the (2n+1)-th block.

(Effect) The match amplifier according to the present embodiment has fewer numbers of control signals compared with a clocked-inverter-type match amplifier and a cross-coupled match amplifier in the past; accordingly, it is possible to reduce the charge and discharge current of the control signals. For example, in FIG. 3, there are two signal lines of the match amplifier activation signal MAE, two signal lines of the match line pre-charge signal MLPRE_N, two signal lines of the pre-latch signal MALAT and its inverted signal, and two signal lines of the output latch signal MALAT_SYNC and its inverted signal, amounting to eight signal lines in total. Considering that the match line is divided into plural parts, the total number of the control signals is relatively small. The fact that the number of signal systems is also small (that is, only four systems of MAE, MLPRE_N, MALAT, and MALAT_SYNC are required) makes generation of the signals at high frequency easy.

That the match amplifier activation signal MAE being non-active is expressed by "L" is the same logic as that Miss (non-coincidence) is expressed by "L." Therefore, it is possible to hold the non-active state of the inside of the match amplifier by use of the state of Miss (non-coincidence). That is, when the match amplifier is activated to perform sensing and when the search result is Miss (non-coincidence), the internal circuit of the match amplifier and the internal data wiring are not reversed because they are same as in the standby state; accordingly, charge and discharge do not take place except in the control signal wiring.

The access at the time of Miss (non-coincidence) may be sufficient as the access from the internal data wiring MAOUT1[m] in a Miss state, arranged immediately before the pre-latch. Therefore, the access distance is very short and the access can be performed at a high speed. The access time in the case of Miss is equal to time from the falling edge of the MALAT signal until the pre-latch is inverted by the internal data wiring MAOUT1[m] which is already in the state of Miss.

When the search result is Hit (coincidence), the output of each first stage NAND circuit is inverted from an "H" level to an "L" level, triggered by the state that the match line is at an "H" level and the activation of the match amplifier activation signal MAE is at an "H" level. Then, all the internal data wirings from each of the second stage NOR circuits to the pre-latch are inverted. That is, the access time becomes the maximum when the search result is Hit (coincidence). However, the match line holds a sufficiently high "H" level at the beginning of activation of the match amplifier activation signal MAE; accordingly, it is possible to flow a sufficient drain current into the HVth NMOS transistor of the first stage NAND circuit which inputs the match line; therefore, the access is comparatively fast.

In the clocked-inverter-type match amplifier in the past, the descent of the match line level is slow at the time of a one-bit miss search, on the conditions that a search transistor is Slow in processed performance, a drain current is small due to local variations, and a drain current decreases at a low temperature and a minimum VDD. Consequently, it is necessary to delay the activation of the match amplifier activation signal MAE until the search line descends to an "L" level at which sensing becomes possible in one-bit miss search and also to a level at which no flow-through current flows. As compared with this, in the match amplifier according to the present embodiment, the NMOS transistor is formed with an HVth transistor, and accordingly, the logic threshold value "H" of the first stage NAND circuit is high and a dead zone is produced, preventing the flow-through current from flowing. Therefore, it is possible to advance the activation of MAE to the neighborhood of timing at which the level of the match line descends and reaches a comparatively high level of the dead zone of the first stage NAND circuit. Accordingly, Hit (coincidence) access on the search operation is comparatively fast.

Usually, the search transistor employs an HVth NMOS transistor in order to alleviate an off state leakage current. Accordingly, it is possible to adjust the property of the first stage NAND circuit which employs the HVth NMOS transistor, to the property based on the processed performance of the HVth NMOS transistor or on the temperature conditions. Particularly, when the search transistor has a small drain current owing to Slow in processed performance, the minimum VDD, and low temperature, and when the descent of the match line level due to a one-bit miss is slow, it is possible for the first stage NAND circuit to enlarge the dead zone on the same conditions, and to prevent a flow-through current from flowing.

The match amplifier according to the present embodiment employs a 2-input NAND circuit for the first stage input circuit, and the circuit configuration is simple. In the circuits in the next and latter stages, the sense results of the divided match amplifiers are logically integrated efficiently; accordingly, the number of elements required is small. Therefore, the layout area is small even when the match line is divided.

The match amplifier according to the present embodiment employs a 2-input NAND circuit in the first stage; accordingly, the number of control signal lines is small, when compared with match amplifiers of other types. Only a small number of internal data wirings are arranged over the array with respect to one entry; accordingly, it is possible to reduce the charge and discharge current of the control signal wiring and the internal data wiring, leading to reduction of the power consumption.

The match amplifier according to the present embodiment is provided with a 2-input NOR circuit in the second stage which performs NOR operation of the outputs of the two first stage NAND circuits. In the NOR circuit, the logic threshold value "L" to the input is low from the constructional point of view; accordingly, the search transistor has a small drain current owing to the Slow processed performance and the local variations. On the conditions that the drain current decreases at a low temperature and a minimum VDD, the descent of the match line level is slow in the one-bit miss search. In the case where the first stage NAND circuit tends to generate invalid data, that is, in the case where the first stage NAND circuit, which usually senses Miss (non-coincidence) and outputs an "H" level, may sense a level of the match line which has not fully descended and may output weak invalid data with a level close to an "L" level, it is possible to prevent the invalid data from being outputted by use of the NOR circuit. The NOR circuit has a low logic threshold value to an input, and the output close to an "L" level of the weak invalid data from the first stage NAND circuit does not reach the logic threshold value of the NOR circuit; accordingly it is possible to block the invalid data.

Furthermore, by changing two PMOS transistors of the 2-input NOR circuit in the second stage from the ordinary MVth PMOS transistors to the HVth PMOS transistors, it is possible to further lower the logic threshold value and to make it harder to output the invalid data.

Embodiment 2

Figure 17:
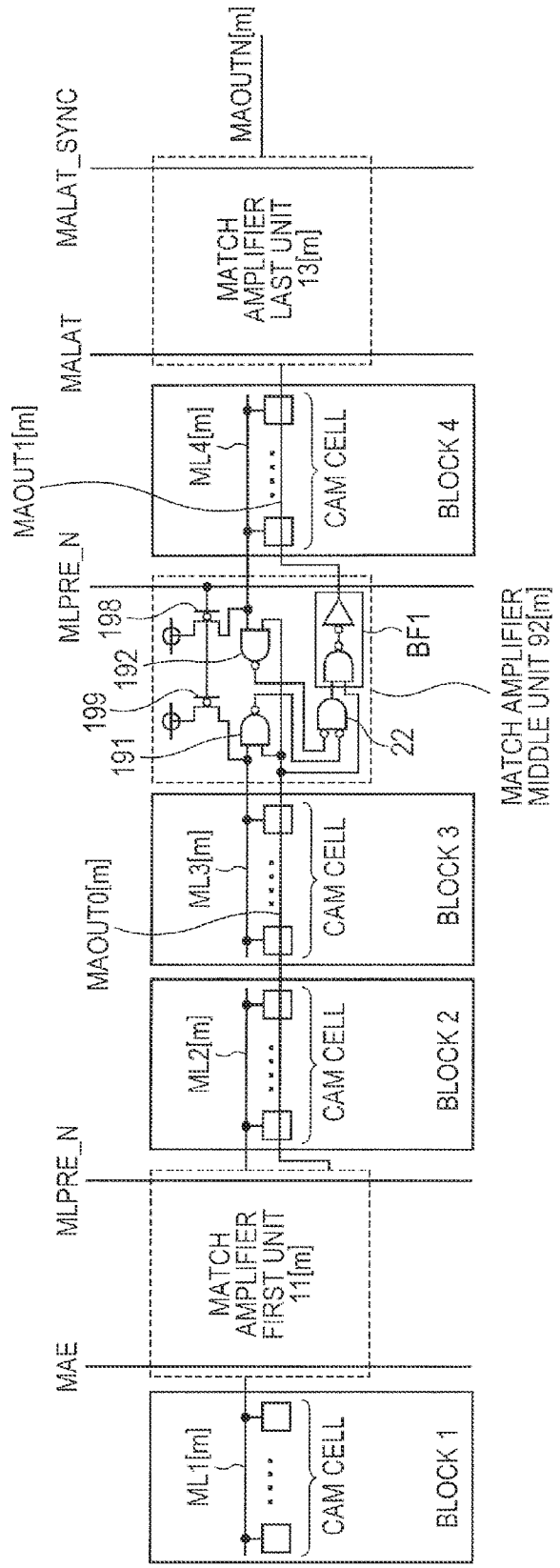
FIG. 17 is a drawing illustrating a configuration of a CAM cell array and a match amplifier according to Embodiment 2.

FIG. 17 illustrates a configuration of a CAM cell array and a match amplifier according to Embodiment 2.

In the present embodiment, as is the case with Embodiment 1, the CAM cell array 507 and the match line ML illustrated in FIG. 1 are divided into four blocks, Block 1-Block 4. One match line is divided into four match lines ML1[$m$]-ML4[$m$].

The match amplifier middle unit 92[$m$] according to the present embodiment employs an internal data wiring MAOUT0[$m$] as an output of the match amplifier first unit 11[$m$], in lieu of the match amplifier activation signal MAE.

As illustrated in FIG. 17, the match amplifier middle unit 92[$m$] comprises the PMOS transistors 199 and 198, the NOR circuit 22, and the buffer unit BF1, which are the same as those employed in Embodiment 1.

The match amplifier middle unit 92[$m$] comprises a first stage NAND circuit 191 and a first stage NAND circuit 192, which are different from those employed in Embodiment 1.

One input of the first stage NAND circuit 191 and the first stage NAND circuit 192 is not the match amplifier activation signal MAE but the internal data wiring MAOUT0[$m$].

Accordingly, the match amplifier activation signal MAE of the match amplifier middle unit becomes unnecessary, and the electric power can be reduced by the amount otherwise required for the charge and discharge of this signal wiring.

Also in the case where the CAM cell array and the match line are divided into six parts, eight parts, and ten parts, by employing the output of the match amplifier first unit or the match amplifier middle unit similarly, in lieu of the match amplifier activation signal MAE of a match amplifier middle unit in the next stage, it is possible to reduce the electric power by the amount otherwise required for the charge and discharge of the signal wiring of the match amplifier activation signal MAE in the latter stages than the match amplifier middle unit.

Modified Example 1 of Embodiment 2

Figure 18:
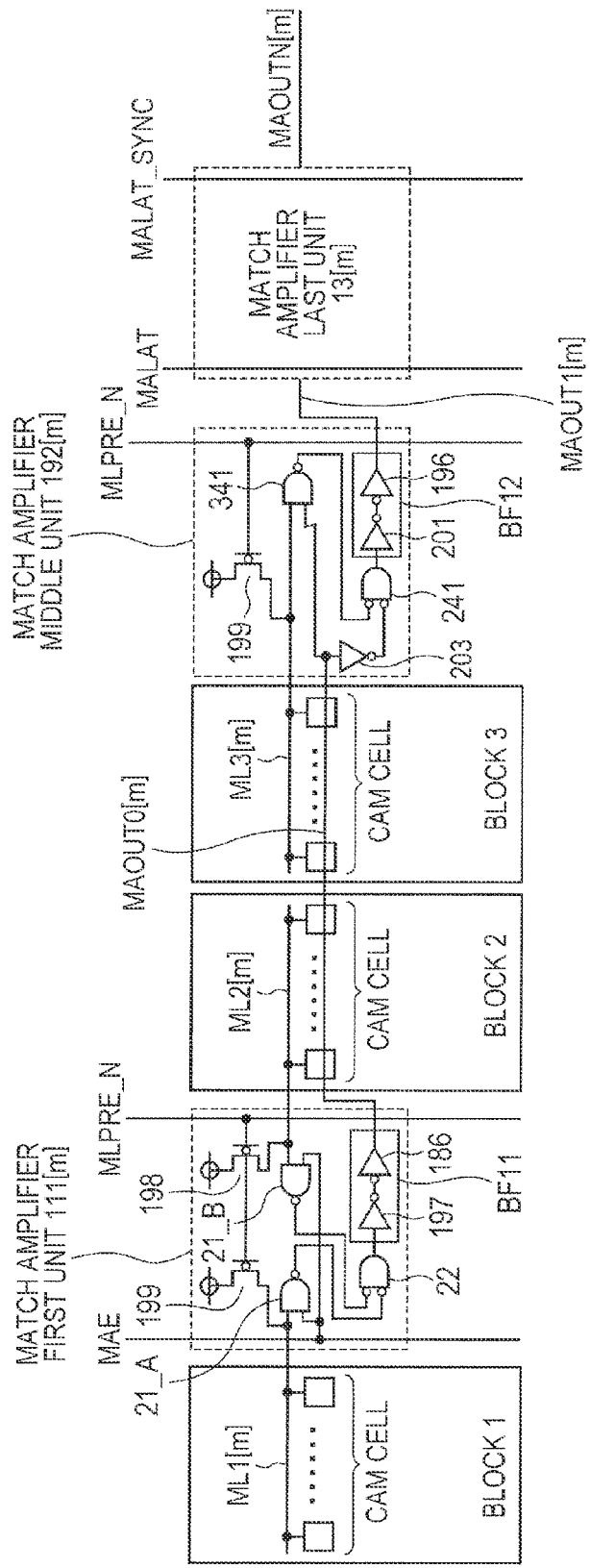
FIG. 18 is a drawing illustrating a configuration of a CAM cell array and a match amplifier according to a modified example 1 of Embodiment 2.

FIG. 18 illustrates a configuration of a CAM cell array and a match amplifier according to a modified example 1 of Embodiment 2.

In this modified example, the CAM cell array 507 and the match line ML illustrated in FIG. 1 are divided into three blocks, Block 1-Block 3, and one match line is divided into three match lines ML1[$m$]-ML3[$m$].

A match amplifier first unit 111[$m$] is arranged between Block 1 and Block 2.

Next to Block 3, a match amplifier middle unit 192[$m$] is arranged. Next to the match amplifier middle unit 192[$m$], the match amplifier last unit 13[$m$] is arranged.

The match amplifier first unit 111[$m$] takes in voltages of the match lines ML1[$m$] and ML2[$m$] which have changed by the search of an entry[m] in Block 1 and Block 2, and outputs a voltage indicating that both of the entry[m] of Block 1 and the entry[m] of Block 2 are coincidence, to an internal data wiring MAOUT0[m]. The match amplifier first unit 111[m] is the same as the match amplifier first unit 111[m] illustrated in FIG. 16.

The internal data wiring MAOUT0[m] is coupled to the match amplifier middle unit 192[m] via Block 2 and Block 3.

The match amplifier middle unit 192[m] determines coincidence or non-coincidence of the match line ML3[m] which has changed by the search of the entry[m] in Block 3 with the NAND circuit 341, takes in the voltage outputted by the NAND circuit 341 and the voltage outputted by the match amplifier first unit 111[m] to the internal data wiring MAOUT0[m], and outputs a voltage indicating that all the entry[m] of Block 1 through the entry[m] of Block 3 are coincidence, to an internal data wiring MAOUT1[m].

The match amplifier middle unit 192[m] comprises a PMOS transistor 199, a second stage NOR circuit 241, and a buffer unit BF12, as is the case with the match amplifier middle unit 112[m] illustrated in FIG. 17. Unlike the match amplifier middle unit 92[m] illustrated in FIG. 17, the match amplifier middle unit 192[m] comprises only the first stage NAND circuit 341 alone.

The internal data wiring MAOUT0 is coupled to one input of the first stage NAND circuit 341, and utilized as an activation signal of the first stage NAND circuit 341. The internal data wiring MAOUT0 is inputted also into an inverter 203, and an output of the inverter 203 is inputted into the second stage NOR circuit 241.

One input of the first stage NAND circuit 341 is coupled to the internal data wiring MAOUT0, and the other input is coupled to the match line ML3[m]. The first stage NAND circuit 341 outputs the non-conjunction of two inputs to the second stage NOR circuit 241. The second stage NOR circuit 241 performs the non-disjunction of the output of the second stage NOR circuit 241 and the output of the inverter 203 described above, and outputs the result to the buffer circuit BF12.

The buffer circuit BF12 outputs the signal to the internal data wiring MAOUT1[m] coupled to the match amplifier last unit 13[m].

The match amplifier last unit 13[m] takes in the output of the internal data wiring MAOUT1[m], and outputs the match amplifier output signal to the output data wiring MAOUTN, in response to the pre-latch signal MALAT and the output latch signal MALAT_SYNC.

The match amplifier last unit 13[m] illustrated in FIG. 18 is the same as the match amplifier last unit 13[m] illustrated in FIG. 6.

Also in the case where the CAM cell array and the match line are divided into five parts, seven parts, and nine parts, by employing the output of the match amplifier first unit or the match amplifier middle unit similarly, in lieu of the match amplifier activation signal MAE of a match amplifier middle unit in the next stage, it is possible to reduce the electric power by the amount otherwise required for the charge and discharge of the signal wiring of the match amplifier activation signal MAE in the latter stages than the match amplifier middle unit.

Embodiment 3

A dummy search function is added in the present embodiment.

Figure 19:
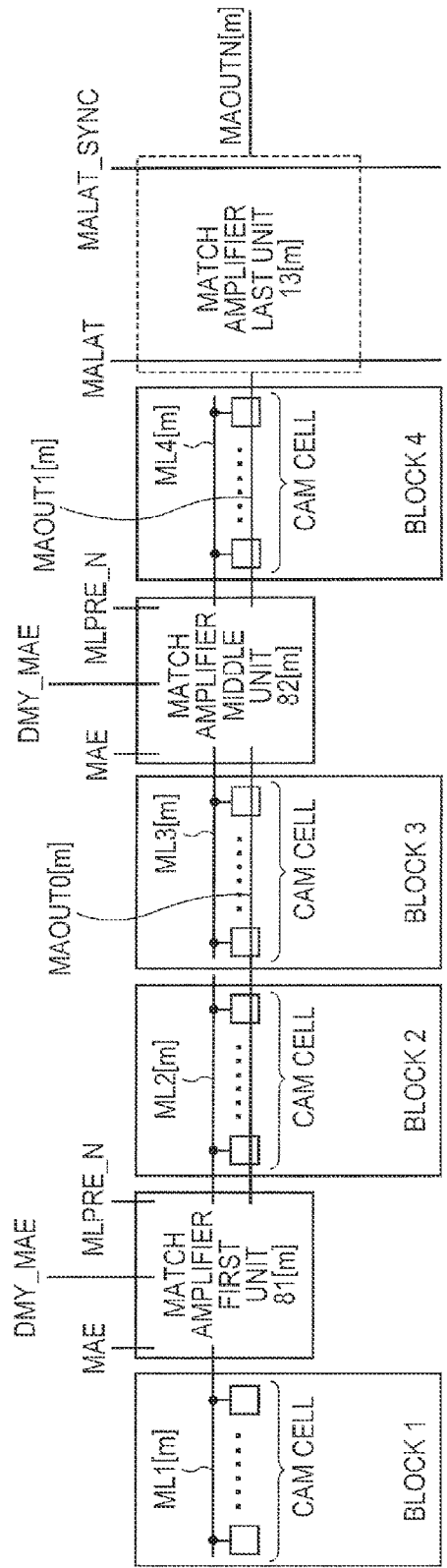
FIG. 19 is a drawing illustrating a configuration of a CAM cell array and a match amplifier according to Embodiment 3.

FIG. 19 illustrates a configuration of a CAM cell array and a match amplifier according to Embodiment 3.

In the present embodiment, as is the case with Embodiment 1, the CAM cell array 507 and the match line ML illustrated in FIG. 1 are divided into four blocks, Block 1-Block 4. One match line is divided into four match lines ML1[m]-ML4[m].

A dummy search activation signal DMY_MAE is inputted to a match amplifier first unit 81[m] and a match amplifier middle unit 82[m]. In a dummy search operation, the dummy search activation signal DMY_MAE is activated to an "H" level by the control circuit 510 illustrated in FIG. 1 at the same timing as the match amplifier activation signal MAE.

Figure 20:
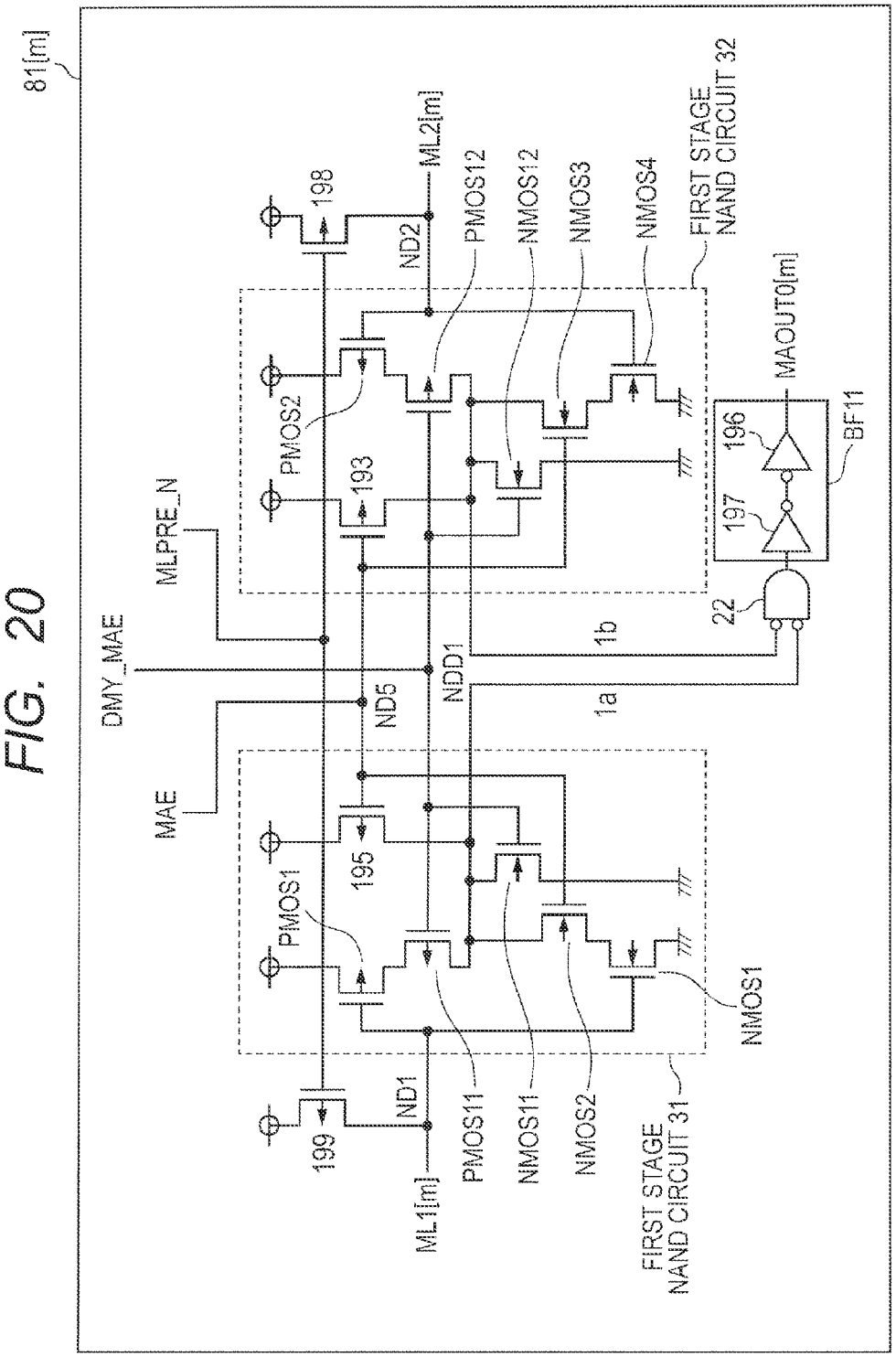
FIG. 20 is a drawing illustrating a configuration of a match amplifier first unit 81[m]

FIG. 20 illustrates a configuration of the match amplifier first unit 81[m]. The match amplifier first unit 81[m] illustrated in FIG. 20 comprises PMOS transistors 198 and 199, a second stage NOR circuit 22, and a buffer unit BF1, as is the case with the match amplifier first unit 11[m] illustrated in FIG. 4.

The match amplifier first unit 81[m] illustrated in FIG. 20 comprises first stage NAND circuits 31 and 32 which are different from those employed in the match amplifier first unit 11[m] illustrated in FIG. 4.

The first stage NAND circuit 31 illustrated in FIG. 20 comprises PMOS transistors PMOS1 and 195, NMOS transistors NMOS1 and NMOS2, as is the case with the first stage NAND circuit 21_A illustrated in FIG. 4.

The first stage NAND circuit 31 illustrated in FIG. 20 further comprises a PMOS transistor PMOS11 and an NMOS transistor NMOS11, for processing the dummy search activation signal DMY_MAE.

The PMOS transistor PMOS11 is provided between a drain of the PMOS transistor PMOS1 and a node 1a, and has a gate coupled to a node NDD1 which receives the dummy search activation signal DMY_MAE.

The NMOS transistor NMOS11 is provided between the node 1a and the ground, and has a gate coupled to the node NDD1 which receives the dummy search activation signal DMY_MAE.

The first stage NAND circuit 32 comprises PMOS transistors PMOS2 and 193, and NMOS transistors NMOS3 and NMOS4, as is the case with the first stage NAND circuit 21_B.

The first stage NAND circuit 32 further comprises a PMOS transistor PMOS12 and an NMOS transistor NMOS12, for processing the dummy search activation signal DMY_MAE.

The PMOS transistor PMOS12 is provided between a drain of the PMOS transistor PMOS2 and a node 1b, and has a gate coupled to a node NDD1 which receives the dummy search activation signal DMY_MAE.

The NMOS transistor NMOS12 is provided between the node 1b and the ground, and has a gate coupled to the node NDD1 which receives the dummy search activation signal DMY_MAE.

Figure 21:
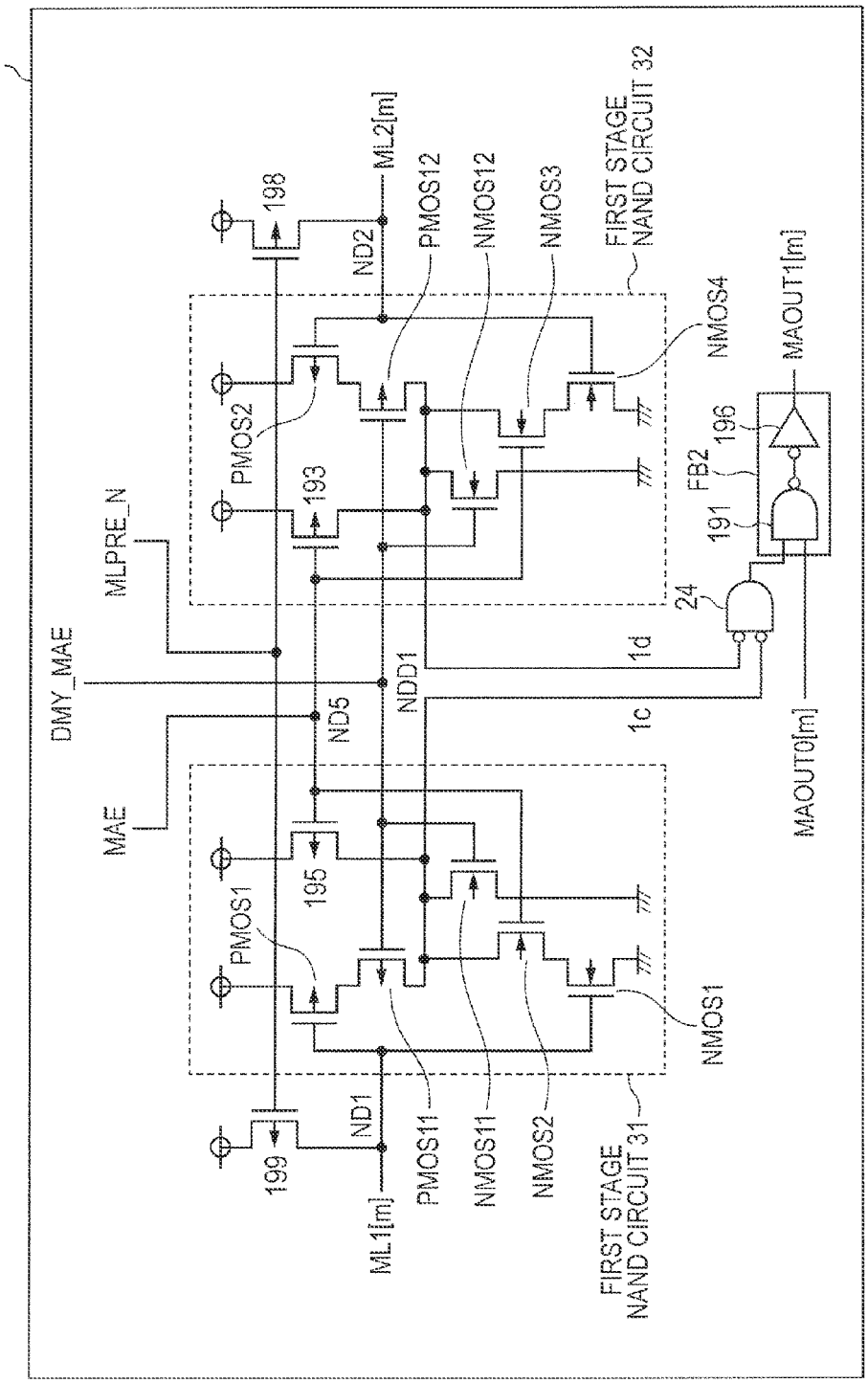
FIG. 21 is a drawing illustrating a configuration of a match amplifier middle unit 82[m]

FIG. 21 illustrates a configuration of the match amplifier middle unit 82[m]. The match amplifier middle unit 82[m] illustrated in FIG. 21 comprises PMOS transistors 198 and 199, a second stage NOR circuit 24, and a buffer unit BF2, as is the case with the match amplifier first unit 12[m] illustrated in FIG. 5.

The match amplifier middle unit 82[m] illustrated in FIG. 21 comprises first stage NAND circuits 31 and 32 which are different from those employed in the match amplifier middle unit 12[m] illustrated in FIG. 5.

The first stage NAND circuit 31 illustrated in FIG. 21 comprises PMOS transistors PMOS1 and 195, NMOS transistors NMOS1 and NMOS2, as is the case with the first stage NAND circuit 23_A illustrated in FIG. 5.

The first stage NAND circuit 31 illustrated in FIG. 21 further comprises a PMOS transistor PMOS11 and an NMOS transistor NMOS11, for processing the dummy search activation signal DMY_MAE.

The PMOS transistor PMOS11 is provided between a drain of the PMOS transistor PMOS1 and a node 1c, and has a gate coupled to a node NDD1 which receives the dummy search activation signal DMY_MAE.

The NMOS transistor NMOS11 is provided between the node 1c and the ground, and has a gate coupled to the node NDD1 which receives the dummy search activation signal DMY_MAE.

The first stage NAND circuit 32 illustrated in FIG. 21 comprises PMOS transistors PMOS2 and 193, and NMOS transistors NMOS3 and NMOS4, as is the case with the first stage NAND circuit 23_B.

The first stage NAND circuit 32 further comprises a PMOS transistor PMOS12 and an NMOS transistor NMOS12, for processing the dummy search activation signal DMY_MAE.

The PMOS transistor PMOS12 is provided between a drain of the PMOS transistor PMOS2 and a node 1d, and has a gate coupled to the node NDD1 which receives the dummy search activation signal DMY_MAE.

The NMOS transistor NMOS12 is provided between the node 1d and the ground, and has a gate coupled to the node NDD1 which receives the dummy search activation signal DMY_MAE.

Figure 22:
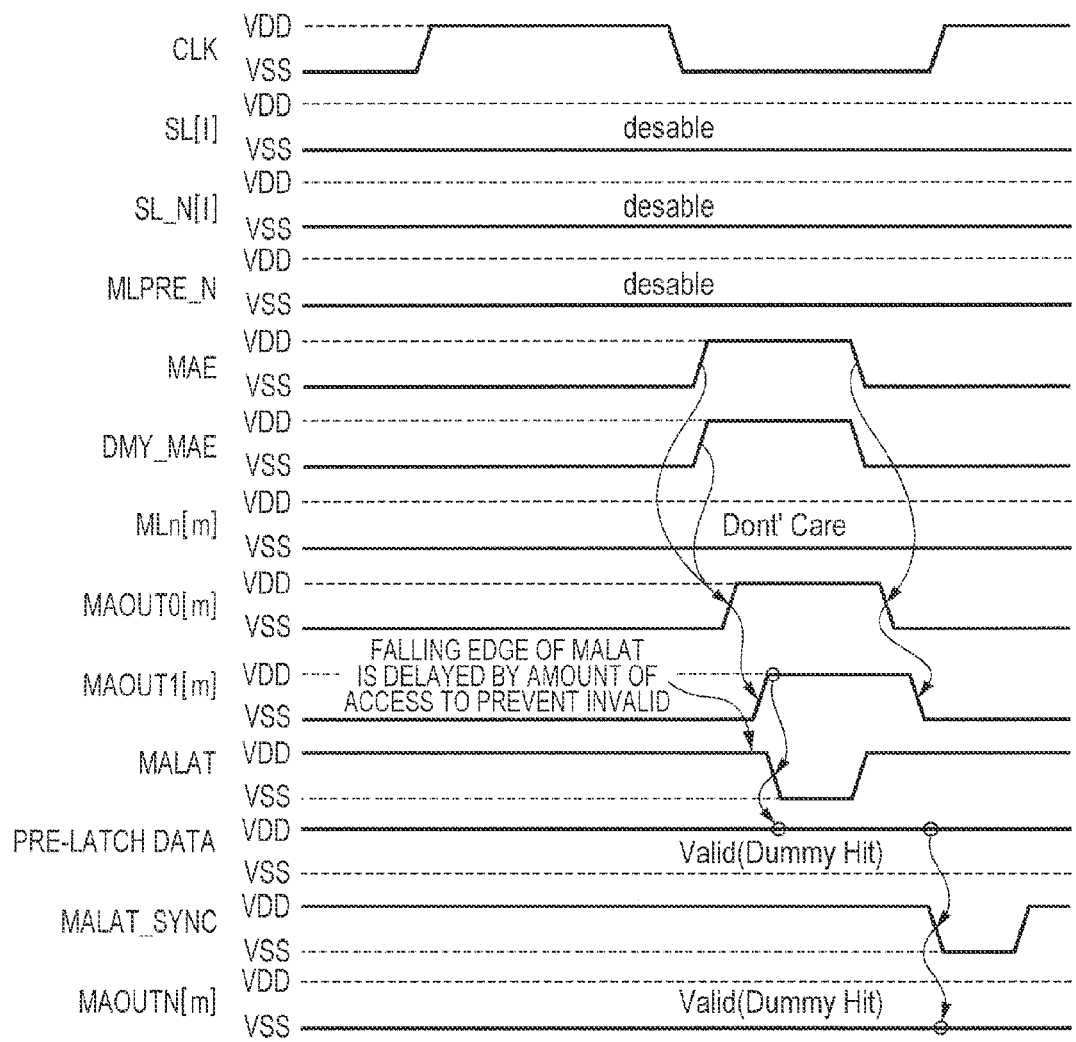
FIG. 22 is a drawing illustrating waveforms in dummy search operation according to Embodiment 3.

FIG. 22 illustrates waveforms in dummy search operation according to the present embodiment. As illustrated in FIG. 22, the search lines SL[1] and SL_N[1] need not be activated, and they remain at the ground VSS. The match line pre-charge signal MLPRE_N is also in the non-activated state and remains at the VDD power supply.

FIG. 22 shows that, by activating the match amplifier activation signal MAE and the dummy search activation signal DMY_MAE to an "H" level at the same timing, a false coincidence is transmitted from the internal data wiring MAOUT0[m] which is an output of the match amplifier first unit 81[m] to the internal data wiring MAOUT1[m] which is the output of the match amplifier middle unit 82[m], and up to the output data wiring MAOUTN[m], irrespective of the state of the match line MLn[m].

Figure 23:
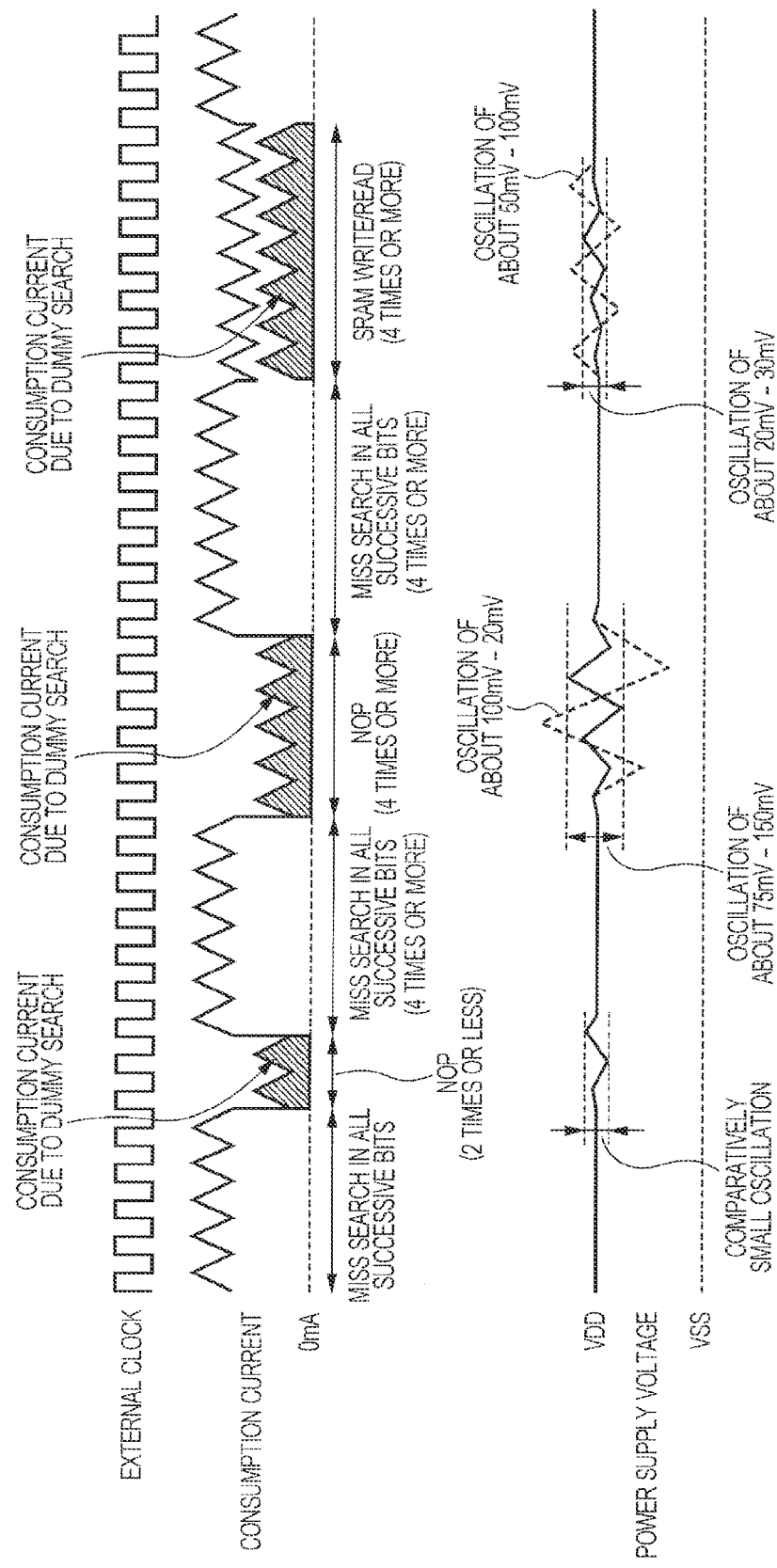
FIG. 23 is an explanatory drawing illustrating oscillation of a power supply voltage in each operation in Embodiment 3.

FIG. 23 is an explanatory drawing illustrating oscillation of a power supply voltage in each operation in Embodiment 3.

As illustrated in FIG. 23, by performing the dummy search operation at the time of NOP, an SRAM write operation, and an SRAM read operation, current consumption is developed at the time of NOP, and the current consumption is increased in the SRAM write operation; accordingly, rapid fluctuations in the current are relaxed. Thereby, it is possible to relax oscillation of the power supply.

The consumption current at the time of the dummy search operation is about ⅓ of the consumption current in a search operation when all the CAM cells of one entry are non-coincidence (all the bits are Miss in FIG. 23), because there are no charge and discharge of the search lines SL and /SL_N. In particular, when the number of continuation of NOP is two times or less, or at the time of an SRAM write operation or an SRAM read operation, it is possible to relax the time rate of change dI/dt of the consumption current, by performing the present dummy search operation.

Modified Example 1 of Embodiment 3

Figure 24:
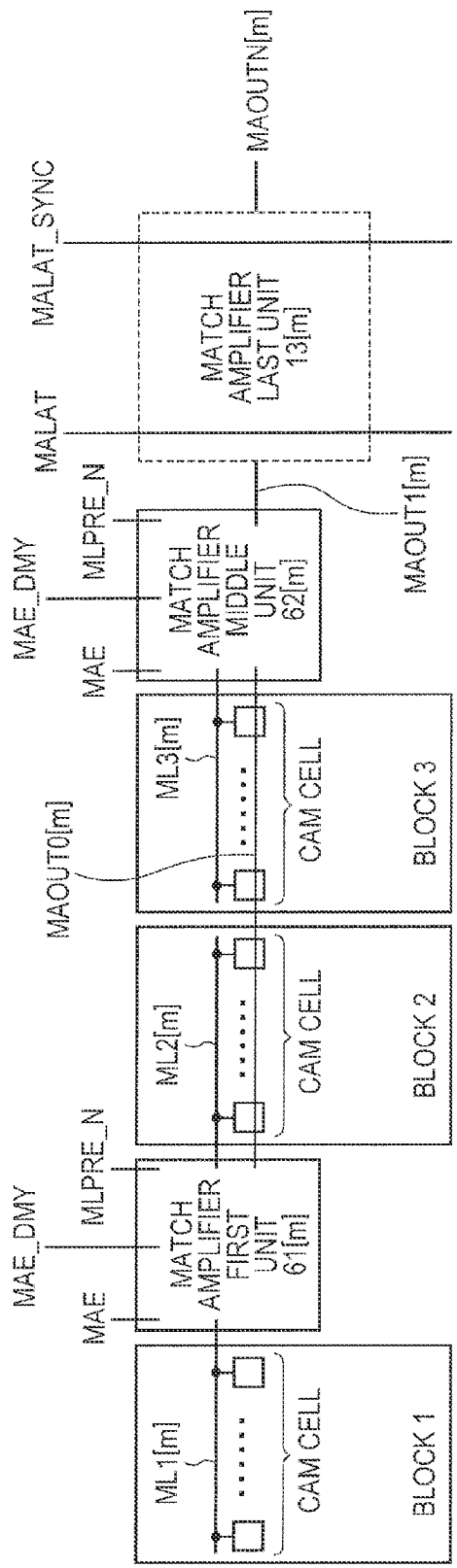
FIG. 24 is a drawing illustrating a configuration of a CAM cell array and a match amplifier according to a modified example 1 of Embodiment 3.

FIG. 24 illustrates a configuration of a CAM cell array and a match amplifier according to a modified example 1 of Embodiment 3.

In the present modified example, the CAM cell array 507 and the match line ML illustrated in FIG. 1 are divided into three blocks, Block 1-Block 3. One match line is divided into three match lines ML1[m]-ML3[m].

A match amplifier first unit 61[m] is arranged between Block 1 and Block 2. Next to Block 3, a match amplifier middle unit 62[m] is arranged. Next to the match amplifier middle unit 62[m], the match amplifier last unit 13[m] is arranged.

The match amplifier first unit 61[m] takes in voltages of the match lines ML1[m] and ML2[m] which have changed by the search of an entry[m] in Block 1 and Block 2, and outputs a voltage indicating that both of the entry[m] of Block 1 and the entry[m] of Block 2 are coincidence, to an internal data wiring MAOUT0[m].

The internal data wiring MAOUT0[m] is coupled to the match amplifier middle unit 62[m] via Block 2 and Block 3.

Figure 25:
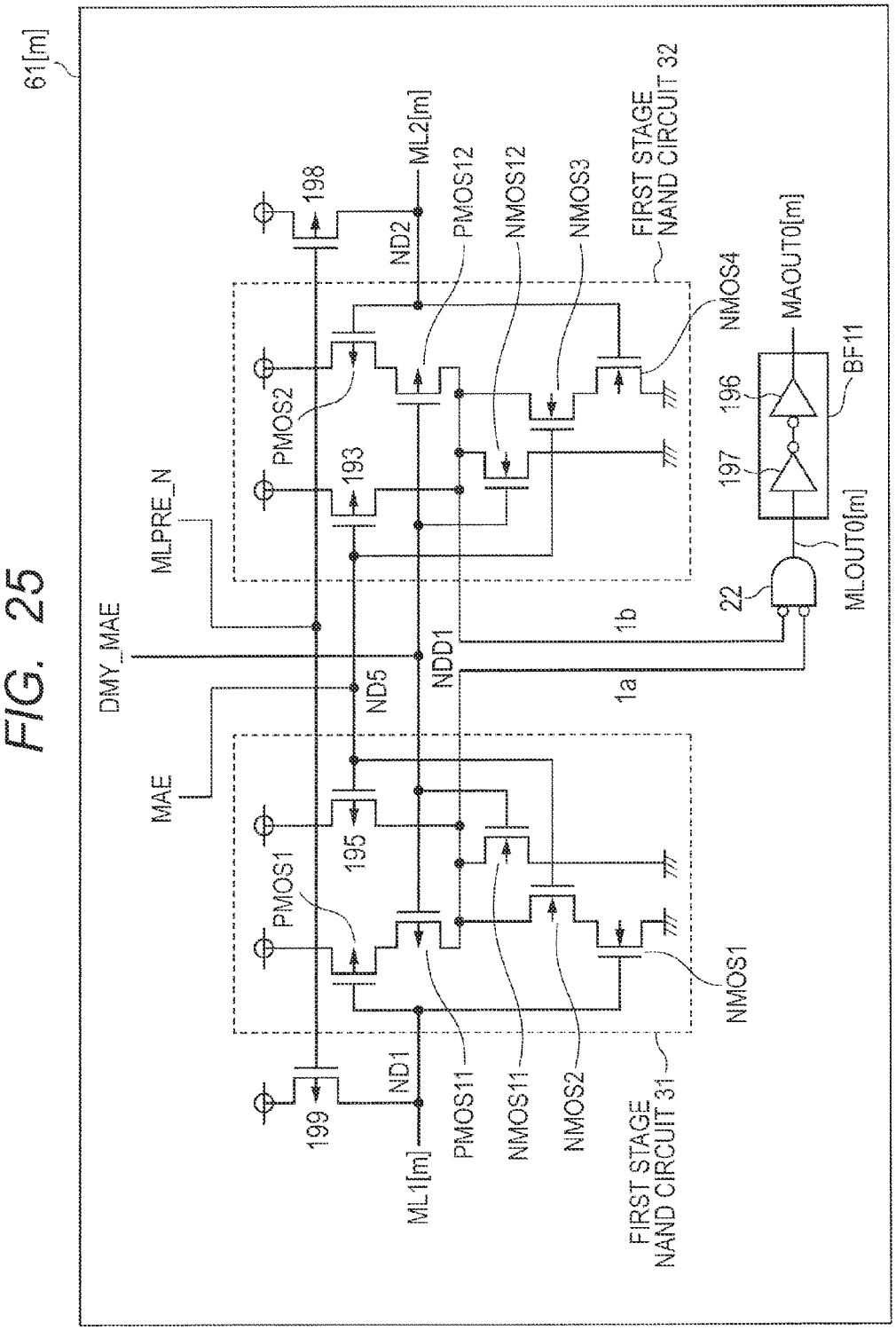
FIG. 25 is a drawing illustrating a configuration of a match amplifier first unit 61[m]

FIG. 25 illustrates a configuration of the match amplifier first unit 61[m]. As is the case with the match amplifier first unit 81[m] illustrated in FIG. 20, the match amplifier first unit 61[m] illustrated in FIG. 25 comprises PMOS transistors 198 and 199, first stage NAND circuits 31 and 32, and a second stage NOR circuit 22. The match amplifier first unit 61[m] further comprises a buffer unit BF11.

The buffer unit BF11 illustrated in FIG. 25 is the same as the buffer unit BF1 of the match amplifier first unit 81[m] illustrated in FIG. 20.

Figure 26:
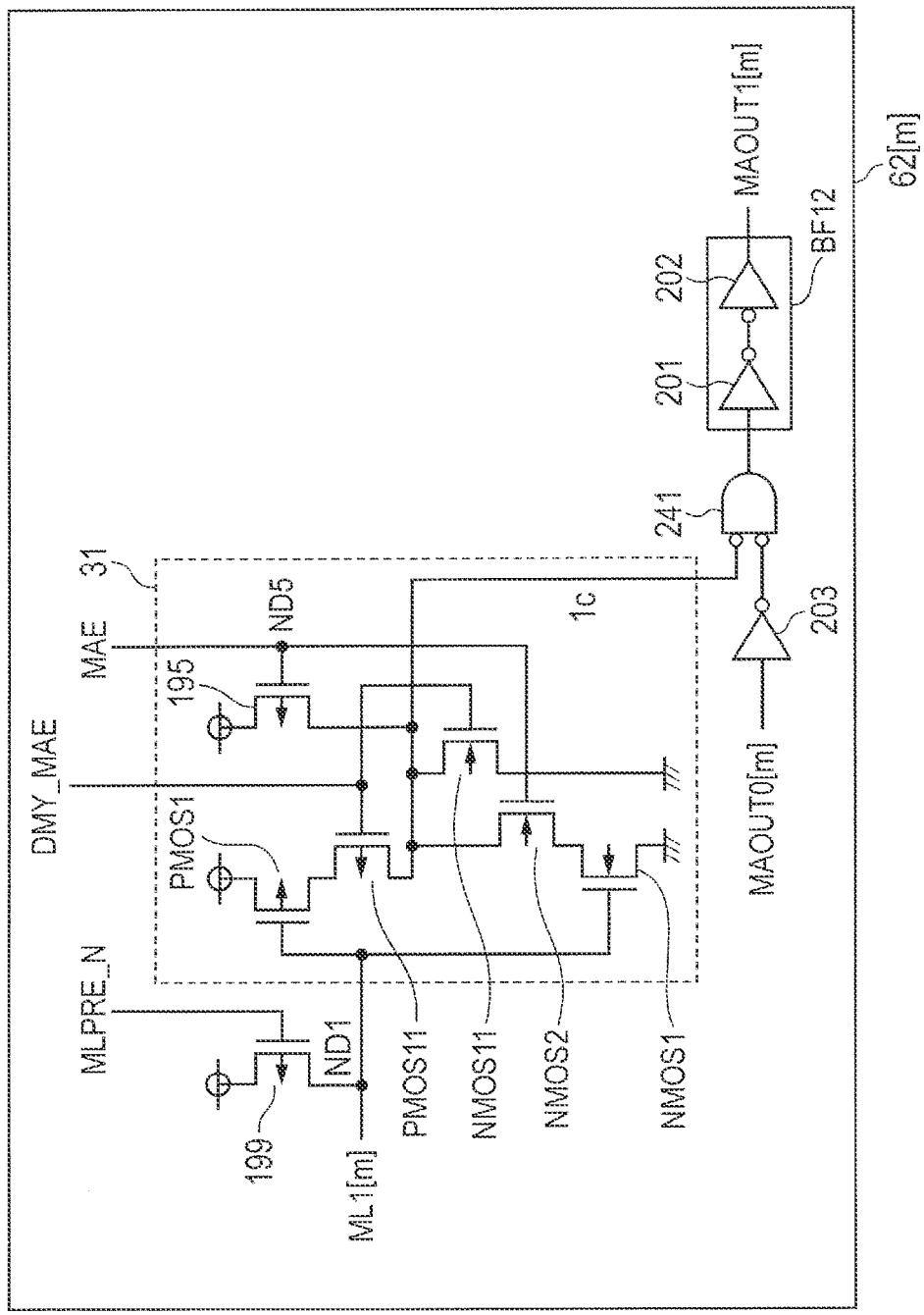
FIG. 26 is a drawing illustrating a configuration of a match amplifier middle unit 62[m]

FIG. 26 illustrates a configuration of the match amplifier middle unit 62[m]. As is the case with the match amplifier middle unit 82[m] illustrated in FIG. 21, the match amplifier middle unit 62[m] illustrated in FIG. 26 comprises a PMOS transistor 199 and a first stage NAND circuit 31.

Unlike the match amplifier middle unit 82[m] illustrated in FIG. 21, the match amplifier middle unit 62[m] illustrated in FIG. 26 does not comprise the PMOS transistor 198 and the first stage NAND circuit 32.

The match amplifier middle unit 62[m] illustrated in FIG. 26 further comprises an inverter circuit 203 for inverting the data polarity of MAOUT0[m] as an output of the match amplifier in the preceding stage, a second stage NOR circuit 241, and a buffer unit BF12.

Unlike the second stage NOR circuit 24 of the match amplifier middle unit 82[m] illustrated in FIG. 21, in the second stage NOR circuit 241 illustrated in FIG. 26, one input is coupled to an output of the first stage NAND circuit 31, and the other input is coupled to a signal obtained by inverting the internal data wiring MAOUT0 by the inverter circuit 203. The second stage NOR circuit 241 outputs a non-disjunction of the two inputs to the internal data wiring MAOUT1[m] after enhancing its drive capability by the buffer unit BF12.

Unlike the buffer unit BF2 of the match amplifier middle unit 82[m] illustrated in FIG. 21, the buffer unit BF12 illustrated in FIG. 26 comprises two stages of inverters 201 and 202.

The match amplifier last unit 13[m] illustrated in FIG. 24 is the same as the match amplifier last unit 13[m] illustrated in FIG. 6.

Even in the case where the division is made into five blocks to ten or more blocks, by adding the dummy search activation signal DMY_MAE, and PMOS11, PMOS12, NMOS11, or NMOS12 to each first stage NAND circuit, it is possible to generate coincidence data compulsorily in the first stage NAND circuit and to operate the match amplifier easily.

Modified Example 2 of Embodiment 3

A configuration of a CAM cell array and a match amplifier according to the present modified example is the same as that according to Embodiment 3 illustrated in FIG. 19.

Figure 27:
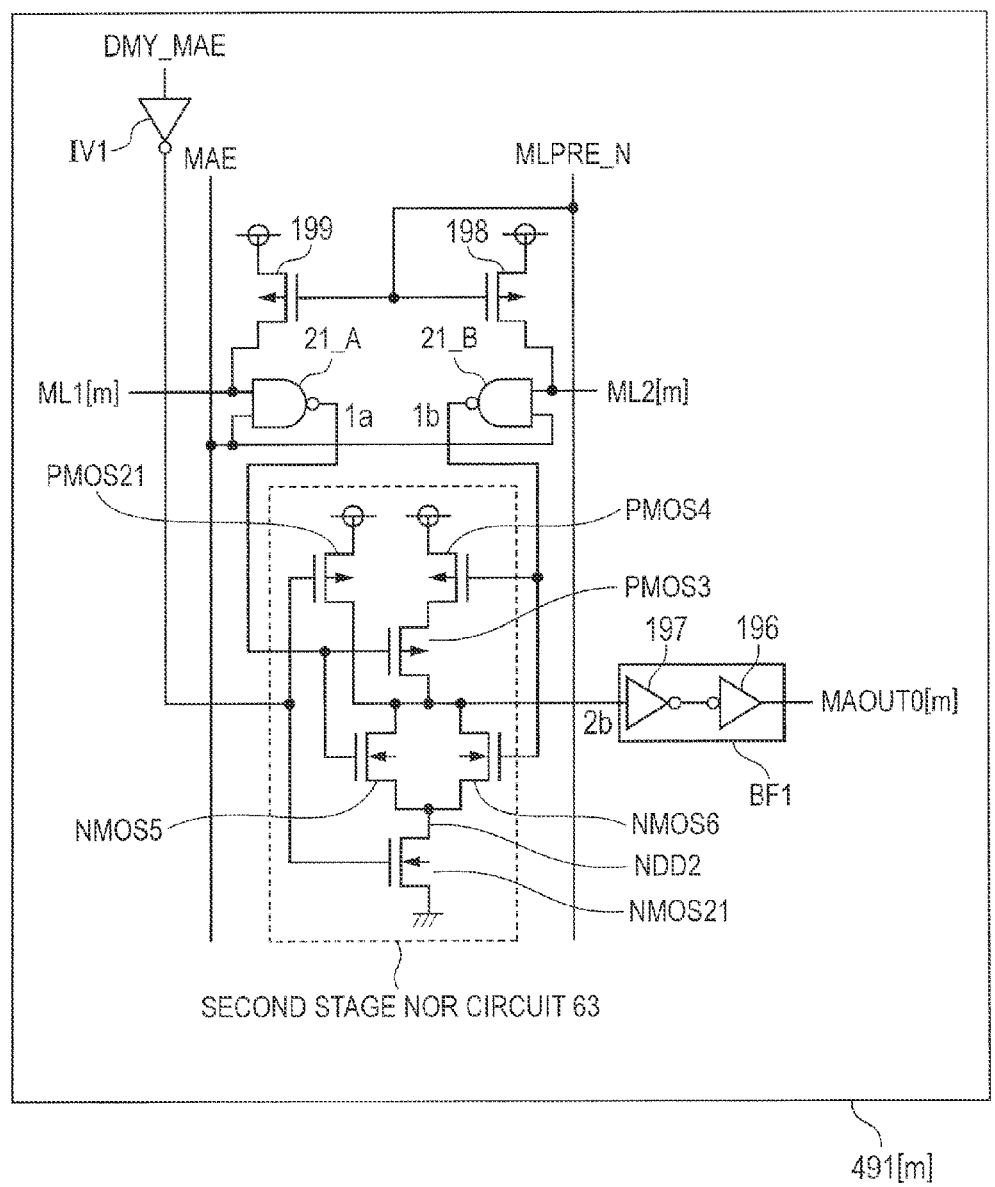
FIG. 27 is a drawing illustrating a configuration of a match amplifier first unit 491[m] according to a modified example 2 of Embodiment 3.

FIG. 27 illustrates a configuration of a match amplifier first unit 491[*m*] according to the modified example 2 of Embodiment 3.

As is the case with the match amplifier first unit 11[*m*] illustrated in FIG. 4, the match amplifier first unit 491[*m*] illustrated in FIG. 27 comprises PMOS transistors 198 and 199, first stage NAND circuits 21_A and 21_B, and a buffer unit BF1.

The match amplifier first unit 491[*m*] illustrated in FIG. 27 comprises an inverter IV1 and a second stage NOR circuit 63, which are different from the match amplifier first unit 11[*m*] illustrated in FIG. 4.

The inverter IV1 illustrated in FIG. 27 inverts the dummy search activation signal DMY_MAE. The second stage NOR circuit 63 illustrated in FIG. 27 comprises PMOS transistors PMOS3 and PMOS4, and NMOS transistors NMOS5 and NMOS6, as is the case with the second stage NOR circuit 22 illustrated in FIG. 4.

The second stage NOR circuit 63 further comprises a PMOS transistor PMOS21 and an NMOS transistor NMOS21 for processing the dummy search activation signal DMY_MAE.

The PMOS transistor PMOS21 is provided between the VDD power supply and a node 2a, and has a gate coupled to an output of the inverter IV1. The PMOS transistor PMOS21 is set to ON when the dummy search activation signal DMY_MAE becomes at an "H" level and charges an output of the second stage NOR circuit 63 to "H."

The NMOS transistor NMOS21 is provided between a node NDD2 coupled to drains of the NMOS transistors NMOS5 and NMOS6 and the ground, and has a gate coupled to the output of the inverter IV1. The NMOS transistor NMOS21 is set to OFF when the dummy search activation signal DMY_MAE becomes at an "H" level, and blocks the output of the second stage NOR circuit 63 to discharge from the NMOS transistors NMOS5 and NMOS6 to the ground, when the outputs of the first stage NAND circuits 21_A and 21_B are "H."

Figure 28:
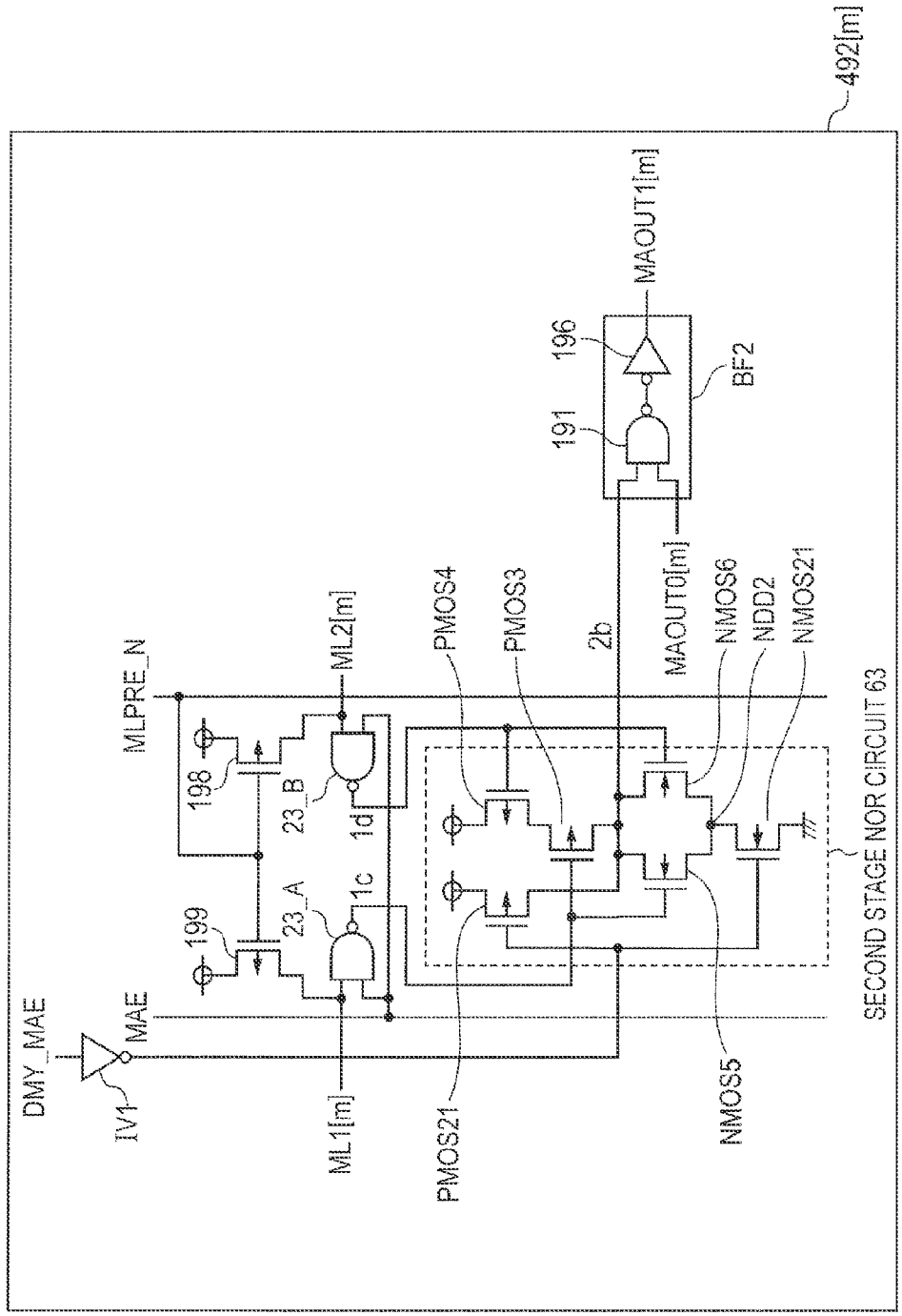
FIG. 28 is a drawing illustrating a configuration of a match amplifier middle unit 492[m] according to the modified example 2 of Embodiment 3.

FIG. 28 illustrates a configuration of a match amplifier middle unit 492[*m*] according to the modified example 2 of Embodiment 3.

The match amplifier middle unit 492[*m*] illustrated in FIG. 28 comprises PMOS transistors 198 and 199, first stage NAND circuits 23_A and 23_B, and a buffer unit BF2, as is the case with the match amplifier middle unit 12[*m*] illustrated in FIG. 5.

The match amplifier middle unit 492[*m*] illustrated in FIG. 28 comprises an inverter IV1 and a second stage NOR circuit 63, which are different from the match amplifier middle unit 12[*m*] illustrated in FIG. 5.

The inverter IV1 inverts the dummy search activation signal DMY_MAE. The second stage NOR circuit 63 illustrated in FIG. 28 comprises PMOS transistors PMOS3 and PMOS4, and NMOS transistors NMOS5 and NMOS6, as is the case with the second stage NOR circuit 24 illustrated in FIG. 5.

The second stage NOR circuit 63 further comprises a PMOS transistor PMOS21 and an NMOS transistor NMOS21 for processing the dummy search activation signal DMY_MAE.

The PMOS transistor PMOS21 is provided between the VDD power supply and a node 2b, and has a gate coupled to an output of the inverter IV1.

The NMOS transistor NMOS21 is provided between a node NDD2 coupled to drains of the NMOS transistors NMOS5 and NMOS6 and the ground, and has a gate coupled to the output of the inverter IV1.

Modified Example 3 of Embodiment 3

A configuration of a CAM cell array and a match amplifier according to the present modified example is the same as that according to the modified example 1 of Embodiment 3 illustrated in FIG. 24.

Figure 29:
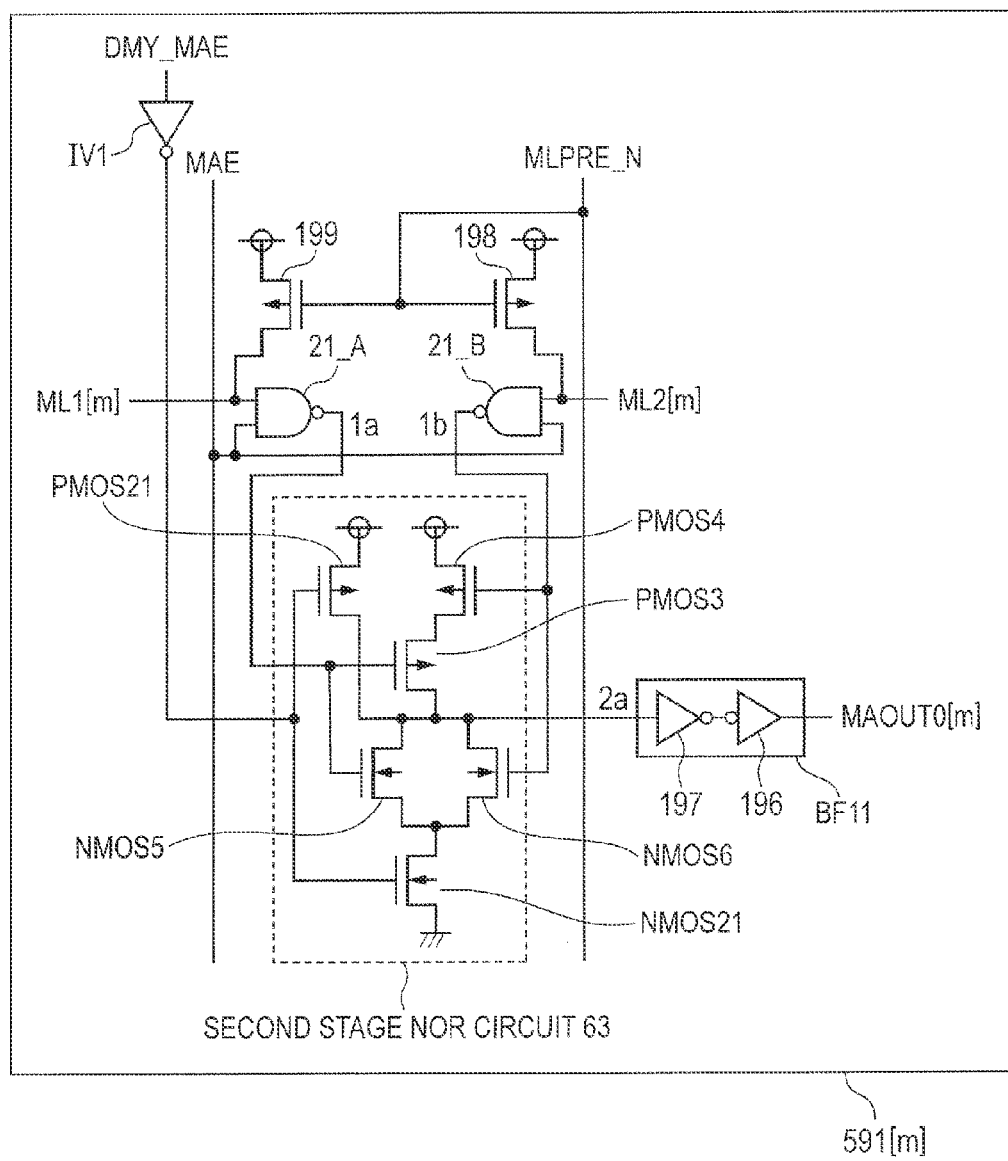
FIG. 29 is a drawing illustrating a configuration of a match amplifier first unit according to a modified example 3 of Embodiment 3.

FIG. 29 illustrates a configuration of a match amplifier first unit 591[*m*] according to the modified example 3 of Embodiment 3. As is the case with the match amplifier first unit 491[*m*] illustrated in FIG. 27, the match amplifier first unit 591[*m*] illustrated in FIG. 29 comprises PMOS transistors 198 and 199, first stage NAND circuits 21_A and 21_B, and a second stage NOR circuit 63. The match amplifier first unit 591[*m*] further comprises a buffer unit BF11.

The buffer unit BF11 is the same as the buffer unit BF1 of the match amplifier first unit 491[*m*] illustrated in FIG. 27.

Figure 30:
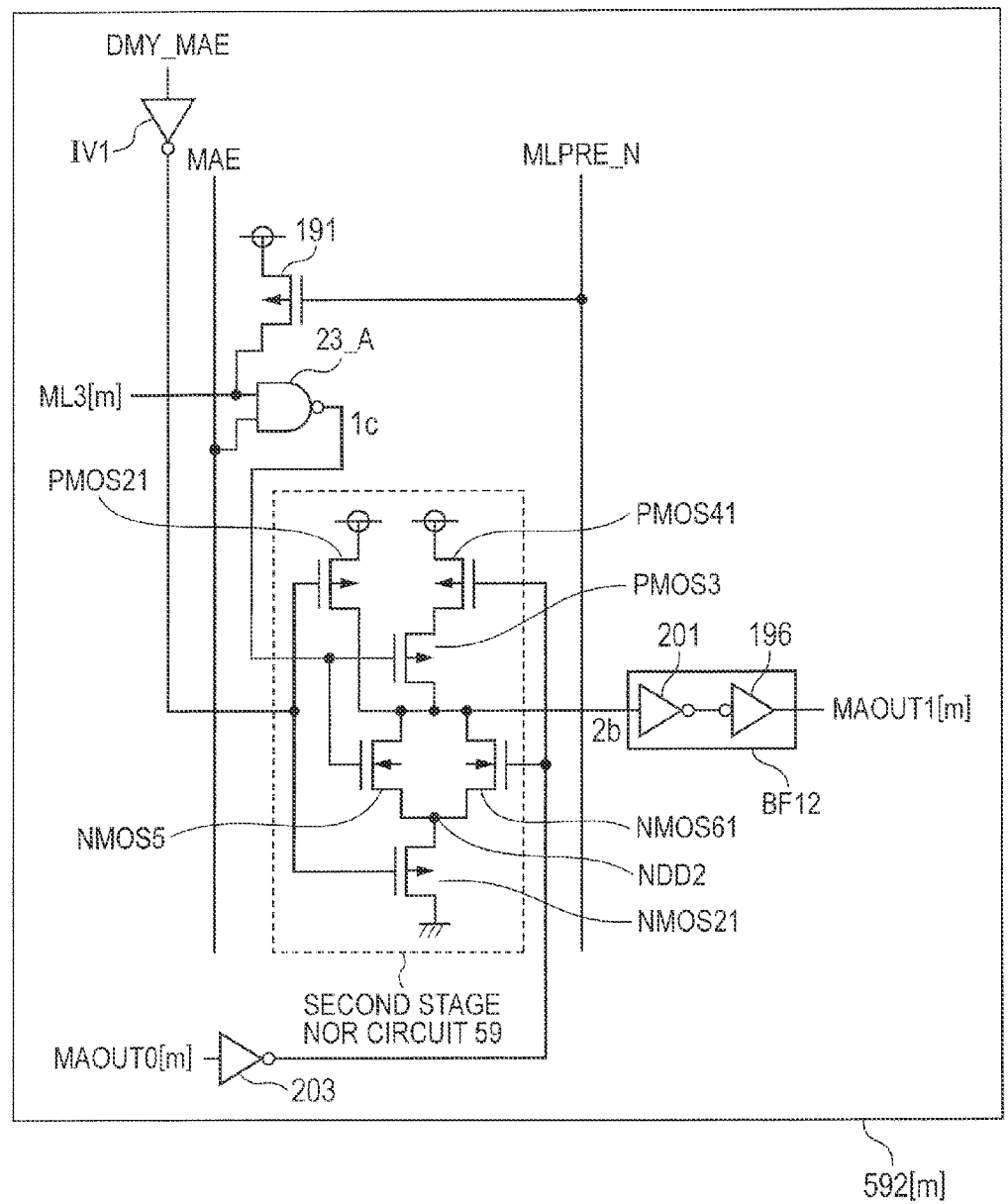
FIG. 30 is a drawing illustrating a configuration of a match amplifier middle unit according to a modified example 3 of Embodiment 3.

FIG. 30 illustrates a configuration of a match amplifier middle unit 592[*m*] according to the modified example 3 of Embodiment 3. As is the case with the match amplifier middle unit 492[*m*] illustrated in FIG. 28, the match amplifier middle unit 592[*m*] illustrated in FIG. 30 comprises a PMOS transistor 199 and a first stage NAND circuit 23_A.

Unlike the match amplifier middle unit 492[*m*] illustrated in FIG. 28, the match amplifier middle unit 592[*m*] illustrated in FIG. 30 does not comprise the PMOS transistor 198 and the first stage NAND circuit 23_B.

The match amplifier middle unit 592[*m*] illustrated in FIG. 30 further comprises a second stage NOR circuit 59 and a buffer unit BF12. The match amplifier middle unit 592[*m*] further comprises an inverter circuit 203 which inverts the internal data wiring MAOUT0[*m*] as an output of the preceding stage, in order to match the data polarity.

The second stage NOR circuit 59 illustrated in FIG. 30 comprises PMOS transistors PMOS3 and PMOS21, and NMOS transistors NMOS5 and NMOS21, as is the case with the second stage NOR circuit 63 of the match amplifier middle unit 492[*m*] illustrated in FIG. 28.

The second stage NOR circuit 59 illustrated in FIG. 30 further comprises a PMOS transistor PMOS41 and an NMOS transistor NMOS61, which are different from the transistors employed in the match amplifier middle unit 492[*m*] illustrated in FIG. 28.

The PMOS transistor PMOS41 is provided between the VDD power supply and the PMOS transistor PMOS3, and has a gate coupled to a signal obtained by inverting the internal data wiring MAOUT0[*m*] by the inverter circuit 203.

The NMOS transistor NMOS61 is provided between a node 2b and a node NDD2, and has a gate coupled to the signal obtained by inverting the internal data wiring MAOUT0[*m*] by the inverter circuit 203.

Unlike the buffer unit BF2 of the match amplifier middle unit 492[*m*] illustrated in FIG. 28, the buffer unit BF12 comprises two stages of inverters 201 and 196.

In the case where the match line ML is divided into three parts in the modified example 3 of Embodiment 3, by changing the match amplifier first unit illustrated in FIG. 24 to the match amplifier first unit illustrated in FIG. 29, for example, by changing the match amplifier middle unit illustrated in FIG. 24 to the match amplifier middle unit illustrated in FIG. 30, and by inputting the dummy search activation signal DMY_MAE to each NOR circuit of the match amplifier first unit and the match amplifier middle unit, it is possible to generate coincidence data compulsorily in the second stage NOR circuit and to perform the dummy search operation easily.

When the match line is divided into the first block through the (2n+1)-th block (n is a natural number), the match amplifier comprises the match amplifier first unit 491 same as illustrated in FIG. 27 as the first stage, the match amplifier middle unit 492 same as illustrated in FIG. 28 as the second to the n-th determination circuit, the match amplifier middle unit 592 same as illustrated in FIG. 30 as the (n+1)-th determination circuit, and the match amplifier last unit 13[*m*] same as illustrated in FIG. 6 as the output latch circuit. The internal data wirings which couple in series the first to the (n+1)-th determination circuit and the latch circuit are also provided for every entry. According to the present configuration, by inputting the dummy search activation signal DMY_MAE to each NOR circuit included in the match amplifier first unit and the match amplifier middle units, it is possible to generate coincidence data compulsorily in the second stage NOR circuit and to perform the dummy search operation easily.

Embodiment 4

In Embodiment 4, a function to further consume another current is added to the dummy search operation according to Embodiment 3.

Figure 31:
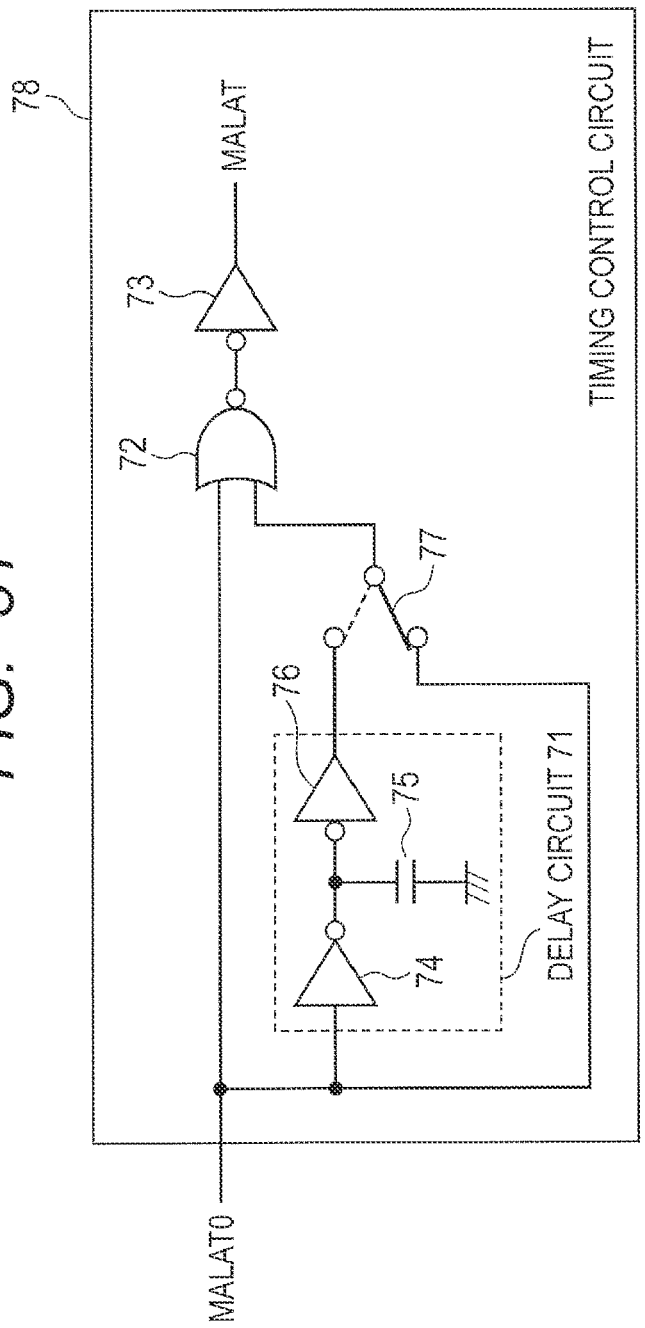
FIG. 31 is a drawing illustrating a configuration of a timing control circuit 78.

FIG. 31 illustrates a configuration of a timing control circuit 78. The timing control circuit 78 is included in the control circuit 510 illustrated in FIG. 1.

As illustrated in FIG. 31, the timing control circuit 78 comprises a delay circuit 71, a NOR circuit 72, and an inverter 73.

The delay circuit 71 comprises two stages of inverters 74 and 76, and a capacitive element 75 provided between a node between the inverter 74 and the inverter 76 and the ground.

The delay circuit 71 delays the pre-latch signal MALAT0 generated in a predetermined circuit of the control circuit 510 by the predetermined time.

A switch 77 selects one of an output of the delay circuit 71 and the pre-latch signal MALAT0, and outputs the selected one to the NOR circuit 72. The switch 77 selects and outputs the pre-latch signal MALAT0 in the dummy search, and the output of the delay circuit 71 (that is, a signal obtained by delaying the pre-latch signal MALAT0) in the normal operation.

The NOR circuit 72 outputs an inverted logical addition of the pre-latch signal MALAT0 and the output of the switch 77, that is the signal obtained by delaying the pre-latch signal MALAT0.

The inverter 73 inverts the output of the NOR circuit 72 and outputs it as a pre-latch signal MALAT to the pre-latch 121 of the match amplifier last unit 13[*m*] illustrated in FIG. 6.

In the normal operation, the delay circuit 71 is selected by the switch 77, and the pre-latch signal MALAT obtained by delaying only the falling edge of the pre-latch signal MALAT0 is outputted.

In the dummy operation, the switch 77 illustrated in FIG. 31 does not select the delay circuit 71; accordingly, the falling edge of the pre-latch signal MALAT can be advanced earlier than in the normal operation.

Figure 32:
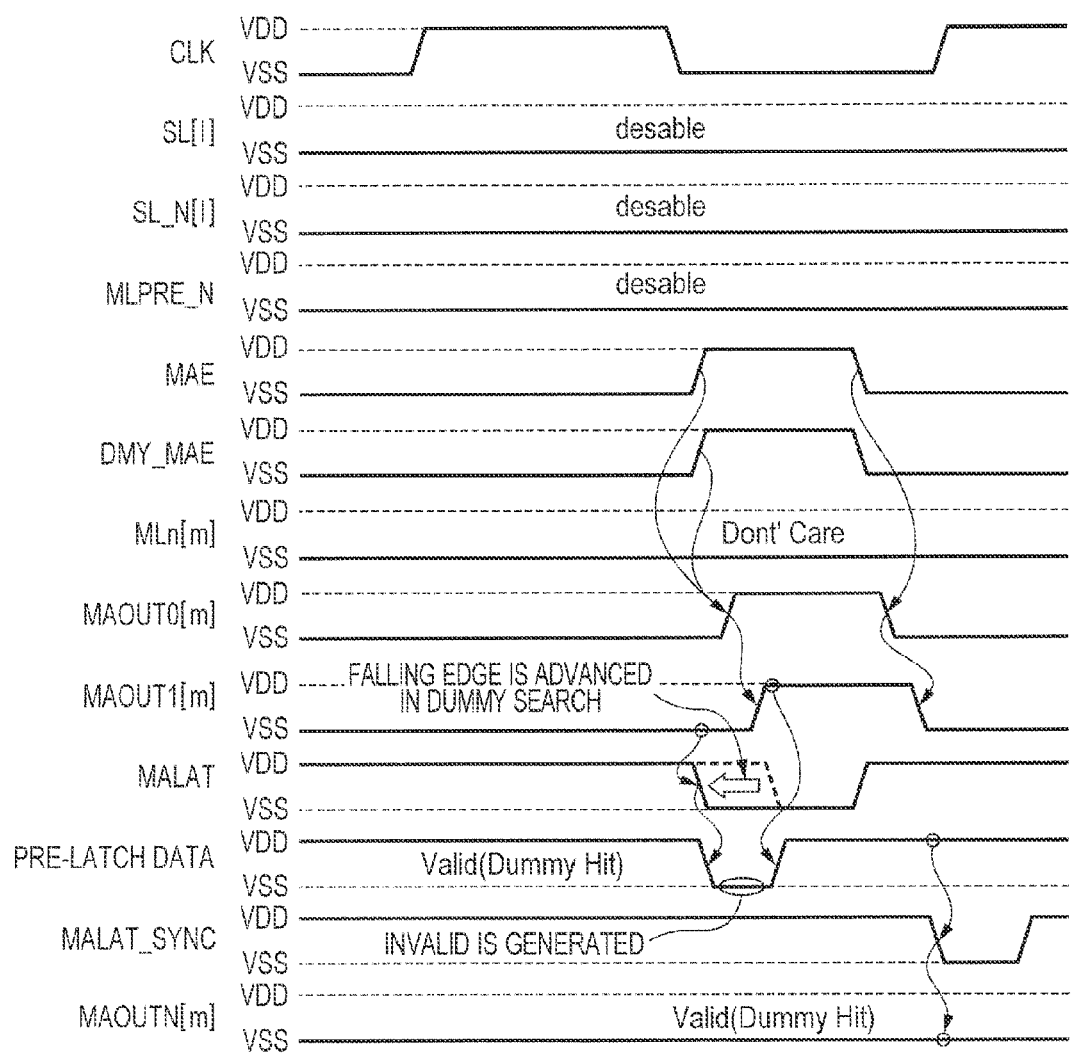
FIG. 32 is a timing chart of Embodiment 4.

FIG. 32 is a timing chart of Embodiment 4. As illustrated in FIG. 32, there has been an issue of outputting data indicating the non-coincidence state in the standby state (invalid data), when the pre-latch signal MALAT is activated to an "L" level before the coincidence data is transmitted. Therefore, in the past, the falling edge of the pre-latch signal MALAT has been delayed until the coincidence data propagates.

As compared with this, in the present embodiment, the falling edge of the pre-latch signal MALAT is advanced along with the rising edge of the match amplifier activation signal MAE in the dummy search operation. Accordingly, invalid data is intentionally transmitted to the pre-latch. As a result, the consumption current can be increased, by forcing charge and discharge to take place in the data wiring inside the pre-latch 121 and in the pre-latch data wiring as the output thereof. Accordingly, it is possible to further increase the consumption current, compared with the case where the dummy search operation alone is performed as in Embodiment 3.

Figure 33:
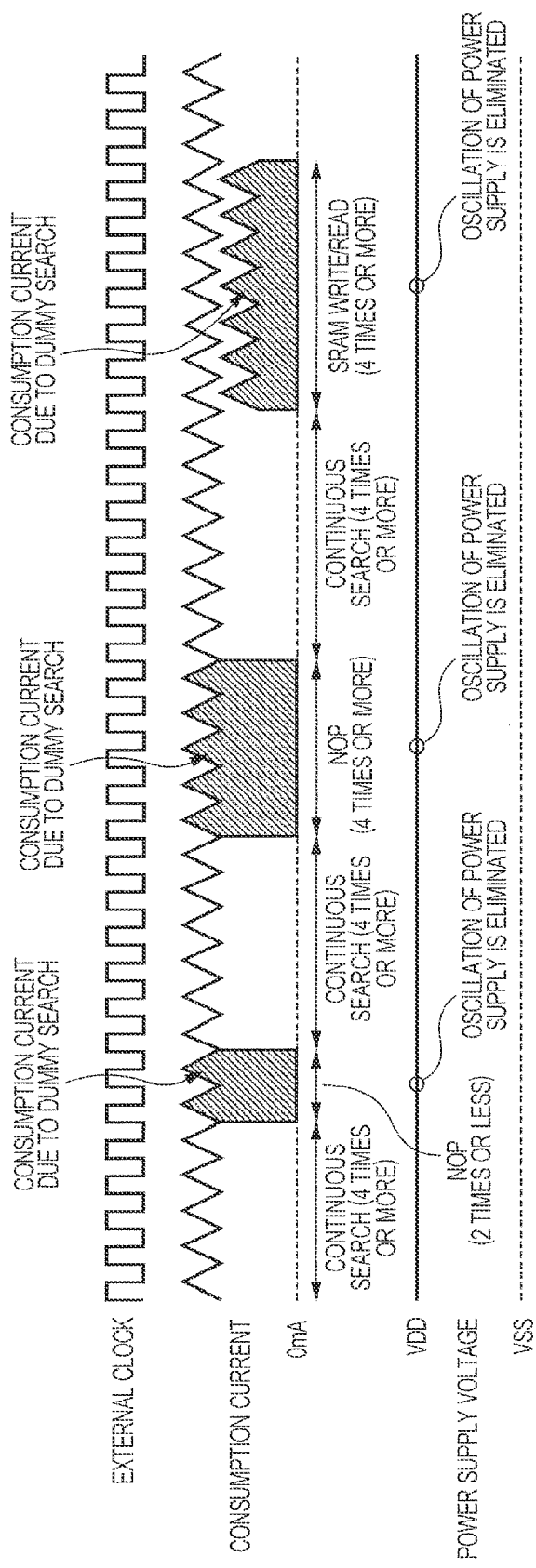
FIG. 33 is an explanatory drawing illustrating oscillation of a power supply voltage in each operation in Embodiment 4.

FIG. 33 is an explanatory drawing illustrating oscillation of the power supply voltage in each operation in Embodiment 4, Embodiment 5, or Embodiment 6.

As illustrated in FIG. 33, the oscillation of the power supply voltage can be relaxed, as is the case with Embodiment 3, by performing the dummy search operation at the time of NOP, the SRAM write operation, or the SRAM read operation.

In Embodiment 4, the power consumption is increased by performing the charge and discharge of the data wiring inside the pre-latch 121 and the pre-latch data wiring as the output thereof. Accordingly, it is possible to bring the consumption current in the dummy search operation close to the consumption current in the normal search; accordingly, it is possible to eliminate the oscillation of the power supply voltage for the most part.

Embodiment 5

Figure 34:
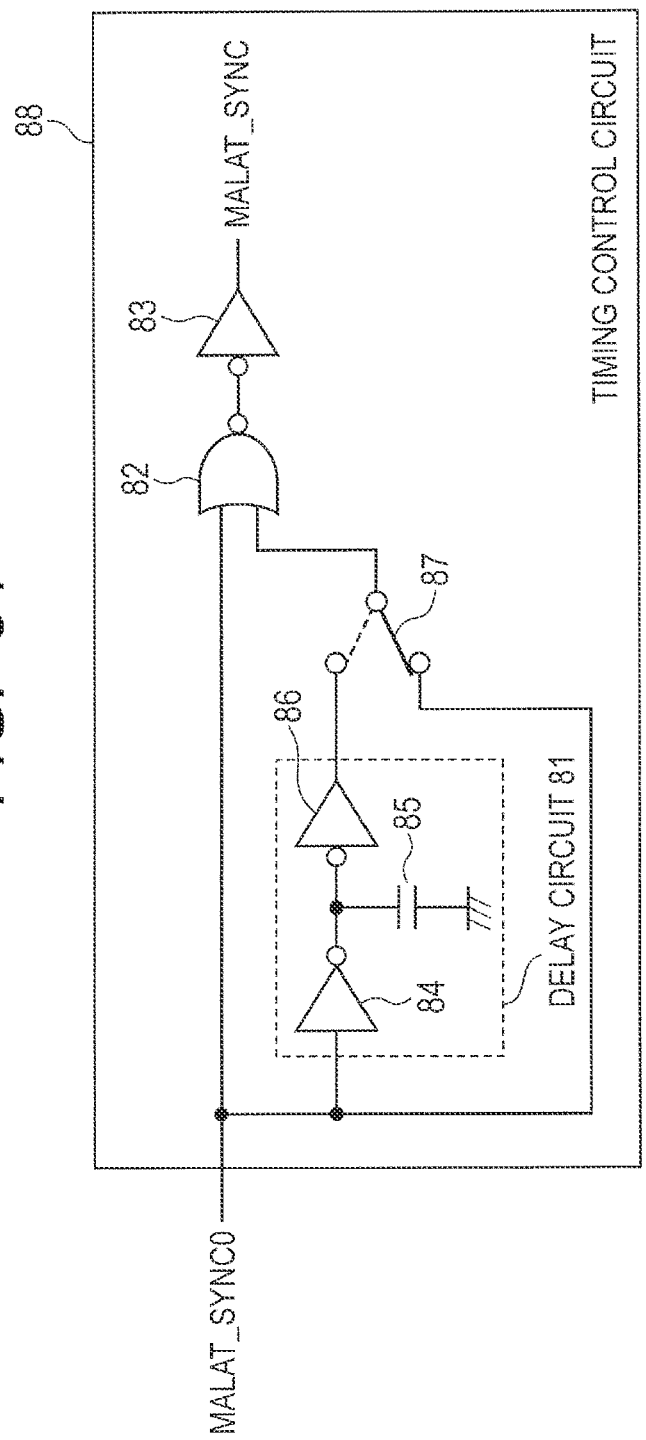
FIG. 34 is a drawing illustrating a configuration of a timing control circuit 88.

FIG. 34 illustrates a configuration of a timing control circuit 88.

This timing control circuit 88 is included in the control circuit 510 illustrated in FIG. 1. As illustrated in FIG. 34, the timing control circuit 88 comprises a delay circuit 81, a NOR circuit 82, and an inverter 83.

The delay circuit 81 comprises two stages of inverters 84 and 86, and a capacitive element 85 provided between a node between the inverter 84 and the inverter 86 and the ground.

The delay circuit 81 delays the output latch signal MALAT_SYNC0 generated in a predetermined circuit of the control circuit 510 by the predetermined time.

The switch 87 selects one of an output of the delay circuit 81 and the output latch signal MALAT_SYNC0, and outputs the selected one to the NOR circuit 82. The switch 87 selects and outputs the output latch signal MALAT_SYNC0 in the dummy search, and the output of the delay circuit 81 (that is, a signal obtained by delaying the output latch signal MALAT_SYNC0) in the normal operation.

The NOR circuit 82 outputs an inverted logical addition of the output latch signal MALAT_SYNC0 and the output of the switch 87.

The inverter 83 inverts the output of the NOR circuit 82 and outputs it as an output latch signal MALAT_SYNC to the output latch 122 of the match amplifier last unit 13[*m*] illustrated in FIG. 6.

In the normal operation, the delay circuit 81 is selected by the switch 87, and the pre-latch signal MALAT_SYNC obtained by delaying only the falling edge of the pre-latch signal MALAT0 is outputted.

In the dummy operation, the switch 87 illustrated in FIG. 34 does not select the delay circuit 81; accordingly, the falling edge of the output latch signal MALAT_SYNC can be advanced earlier than in the normal operation.

Figure 35:
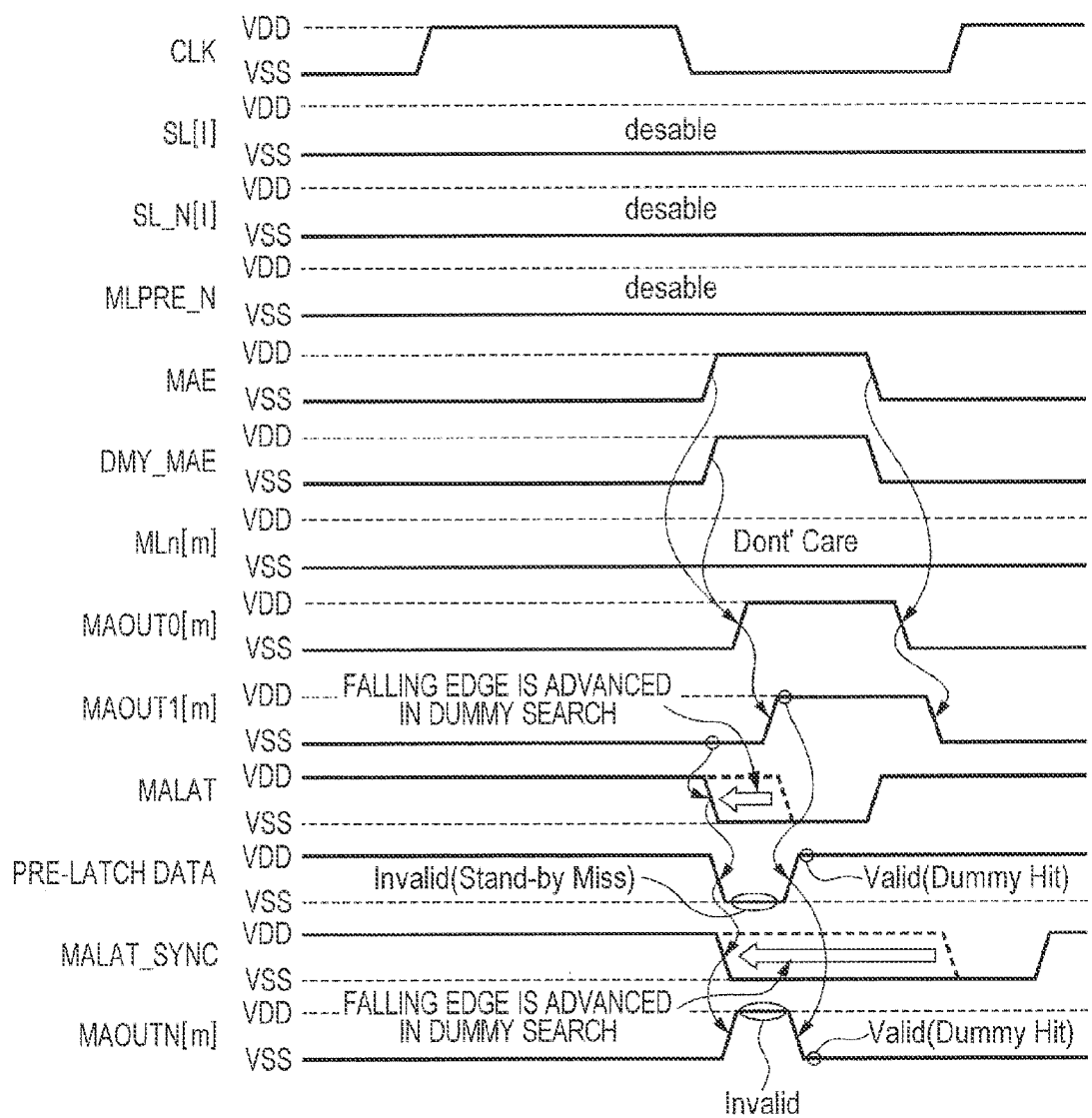
FIG. 35 is a timing chart of Embodiment 5.

FIG. 35 is a timing chart of Embodiment 5. The falling edge of the output latch signal MALAT_SYNC is advanced along with the rising edge of the match amplifier activation signal MAE and the falling edge of the pre-latch signal MALAT. Accordingly, invalid data is intentionally transmitted to the data wiring inside the output latch 122 and the output data wiring MAOUTN[m] thereof. As a result, the consumption current can be further increased than in Embodiment 4. Accordingly, it is possible to further improve the oscillation of the power supply voltage.

Embodiment 6

In Embodiment 6, a function to further increase the charge and discharge current of the output data wiring is added to the function in Embodiment 5.

Figure 36:
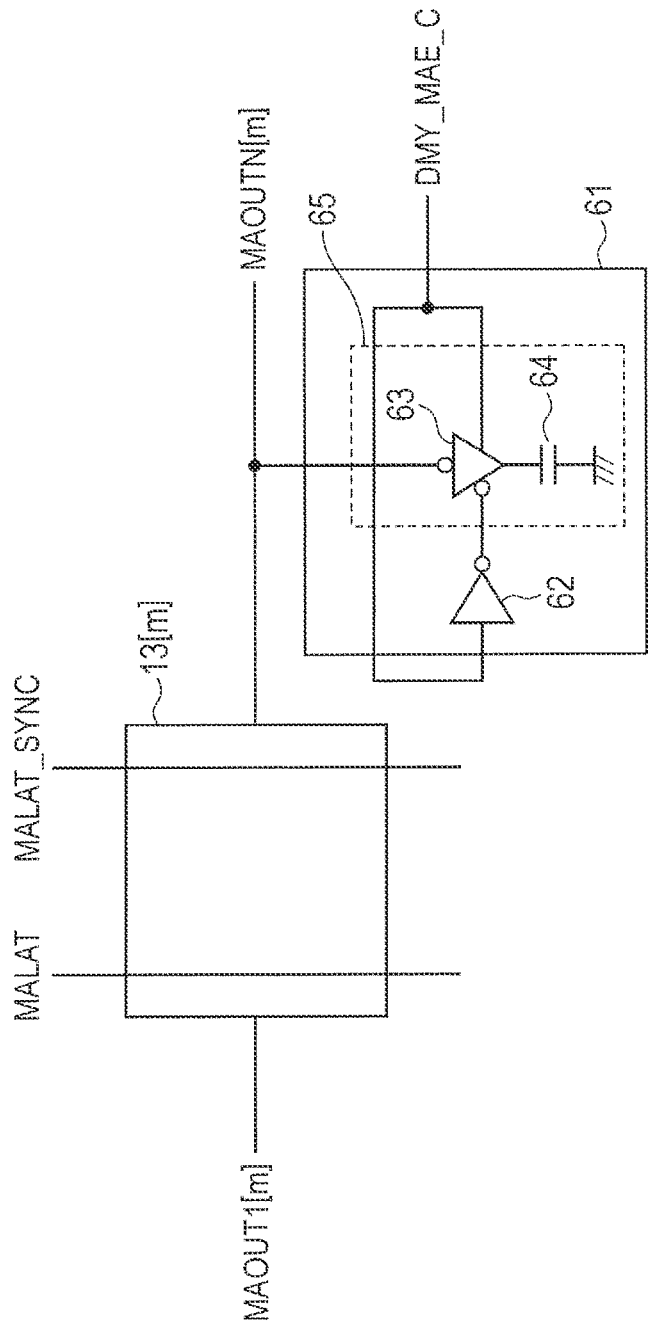
FIG. 36 is an explanatory drawing illustrating a load capacity coupled to an output data wiring according to Embodiment 6.

FIG. 36 is an explanatory drawing illustrating a load capacity coupled to the output data wiring according to Embodiment 6.

The load capacity 65 provided is coupled to or decoupled from the output data wiring MAOUTN[m], according to the dummy search load capacity signal DMY_MAE_C.

In the normal operation, the dummy search load capacity signal DMY_MAE_C is deactivated, to decouple the load capacity 65 from the output data wiring MAOUTN[m]. In the dummy search operation, the dummy search load capacity signal DMY_MAE_C is activated, to couple the load capacity 65 to the output data wiring MAOUTN[m]. Accordingly, the consumption current in the dummy search operation can be increased further.

Modified Example 1 of Embodiment 6

Figure 37:
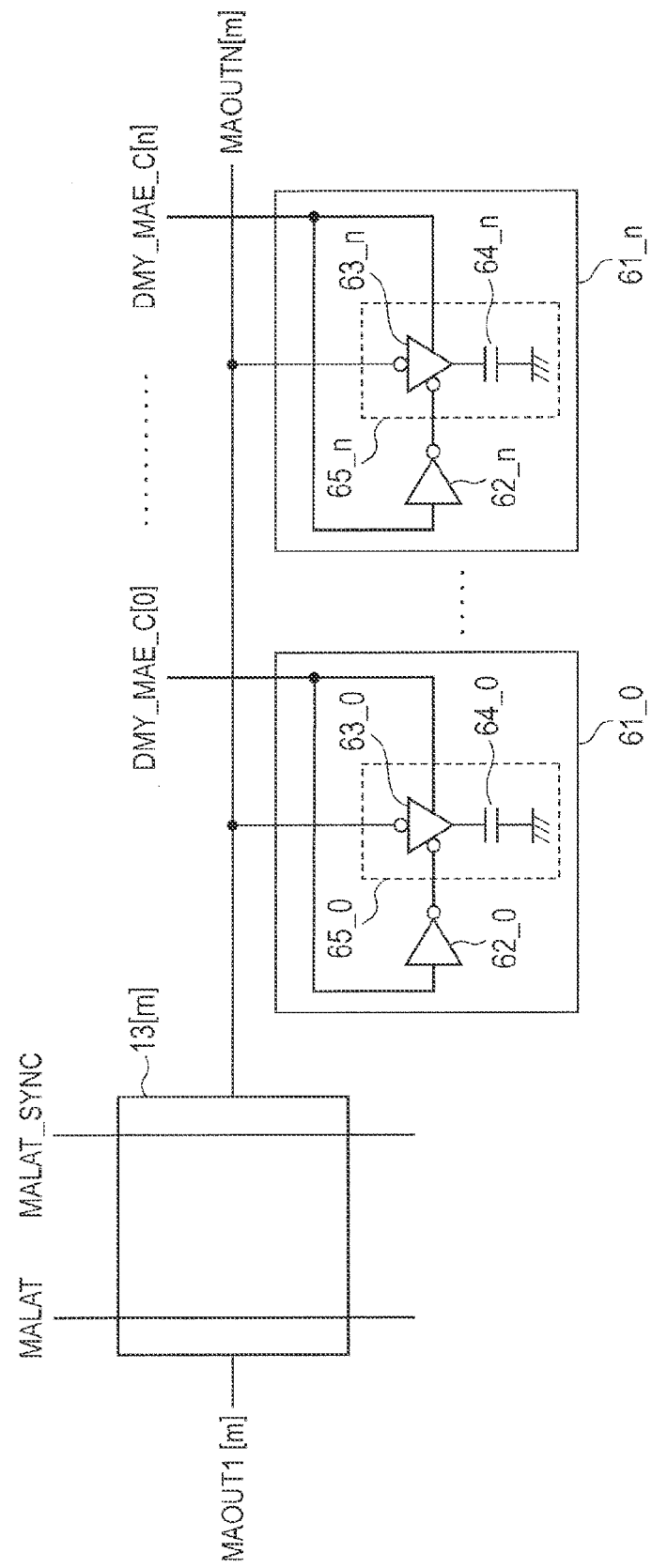
FIG. 37 is an explanatory drawing illustrating a load capacity coupled to an output data wiring according to a modified example 1 of Embodiment 6.

FIG. 37 is an explanatory drawing illustrating the load capacity coupled to the output data wiring according to a modified example 1 of Embodiment 6.

Load capacities 61_0-61_n provided are coupled to or decoupled from the output data wiring MAOUTN[m], according to dummy search load capacity signals DMY_MAE_C [0]-DMY_MAE_C[n].

By switching the number of load capacities 61_0-61_n to be activated by means of the dummy search load capacity signals DMY_MAE_C[0]-DMY_MAE_C[n], it is possible to adjust the magnitude of the consumption current to the value appropriate to the operation mode (write operation, read operation, and NOP).

Modified Example Through the Entire Embodiments

The configuration of the CAM cell is not restricted to what has been explained in FIG. 2.

Figure 38:
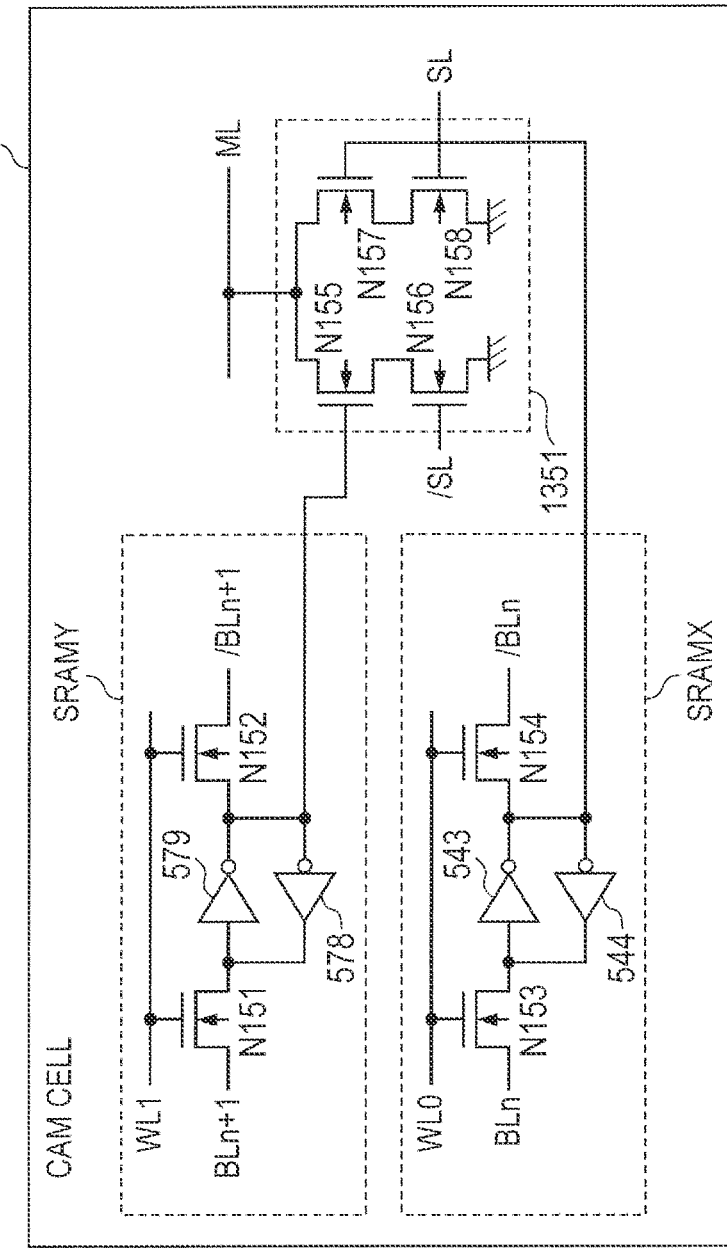
FIG. 38 is a drawing illustrating a configuration of a modified example of a CAM cell.

FIG. 38 illustrates a configuration of a modified example of the CAM cell. The present CAM cell is called TCAM (Ternary CAM), and can store any one of four values of "L", "H", "Always Hit (always coincidence)", and "Always Miss (always non-coincidence)." These CAM cells can select the configuration depending on application. Some CAM cells may be comprised of a DRAM and a logic circuit. In each SRAM in the CAM cell, write of a database is possible and read is also possible for verify (confirmation of whether data writing is performed normally).

As illustrated in FIG. 38, the CAM cell 1601 comprises an SRAMX, an SRAMY, and a search unit 1351.

The SRAMX and the SRAMY store one of the binaries of "L" or "H", respectively.

The search unit 1351 comprises search transistors N155-N158. The search transistors N155-N158 employ HVth NMOS transistors in order to alleviate an off state leakage current. A gate of the search transistor N158 is coupled to a search line SL indicating search data. A gate of the search transistor N156 is coupled to a search line /SL indicating the search data.

When the search line SL is at an "H" level and the internal /BL of the SRAMX is at an "H" level, or when the search line /SL is at an "H" level and the internal BL of the SRAMY is at an "H" level, the high potential precharged to the match line ML in advance is discharged to the ground.

It should be understood by those skilled in the art that the embodiments disclosed in the present application are illustrative and not restrictive, with all the points of view. The scope of the present invention is illustrated not by the explanatory description given above but by the scope of the appended claims, and it is meant that various modifications, combinations, and alterations may occur insofar as they are within the scope of the appended claims or the equivalents thereof.

What is claimed is:

1. A content addressable memory chip, comprising:
   a plurality of entries each having a plurality of content addressable memory cells in a memory array;
   a plurality of match lines, arranged corresponding to the respective entries, each coupled to the plurality of content addressable memory cells in a corresponding one of the entries; and
   a plurality of match amplifiers, each coupled to an associated one of the match lines and a match amplifier enable signal line, and detecting a voltage on the associated one of the match lines,
   wherein each of match amplifiers comprises a NAND circuit receiving the voltage on the associated one of the match lines and a voltage on the match amplifier enable signal line,
   wherein the NAND circuit comprises a first NMOS transistor having a gate coupled to the associated one of the match lines, a source coupled to a ground and a drain, and having a first threshold value higher than a threshold value of a standard NMOS transistor composing the content addressable memory cells.

2. The content addressable memory chip according to claim 1, wherein the NAND circuit further comprises a first PMOS transistor having a gate coupled to the associated one of the match lines and a source coupled to a power supply voltage line and a drain, and having a second threshold value lower than a threshold value of a standard PMOS transistor composing the content addressable memory cells.

3. The content addressable memory chip according to claim 2, wherein the NAND circuit further comprises a second NMOS transistor having a gate coupled to the match amplifier enable signal line and a source-drain path coupled between the drain of the first NMOS transistor and the drain of the first PMOS transistor, and having a third threshold value higher than the threshold value of the standard NMOS transistor composing the content addressable memory cells.

4. The content addressable memory chip according to claim 1, wherein each of the content addressable memory cells comprises a search unit having a plurality of search transistors, each of the search transistors has a threshold value substantially equal the first threshold value.

5. A content addressable memory chip, comprising:
   a plurality of entries each having a plurality of content addressable memory cells in a memory array;
   a plurality of match lines, arranged corresponding to the respective entries, each coupled to the of plurality content addressable memory cells in a corresponding one of the entries; and
   a plurality of match amplifiers, each detecting a voltage on the associated one of the match lines, wherein the memory array and the match lines are divided into a first to 2n-th block (n is a natural number), wherein each of the match amplifiers comprises:
  a first to a n-th determination circuit coupled in series such that the output of a preceding one of the determination circuit is supplied to a succeeding one of the determination circuits, and
  a latch that latches and outputs an output of the n-th determination circuit, wherein the i-th determination circuit (1≤i≤n) comprises:
  a first and a second NAND circuit arranged between the (2i−1)-th block and the 2i-th block, and coupling a match line of the (2i−1)-th block and a match line of the 2i-th block, respectively, and
  a logic circuit that performs a logical operation of an output of the first and the second NAND circuit and an output of the preceding determination circuit, and outputs the logical operation result as the output of the determination circuit, and wherein the first NAND circuit comprises a first NMOS transistor having a gate coupled to the match line of the (2i−1)-th block, a source coupled to a ground and a drain, wherein the second NAND circuit comprises a second NMOS transistor having a gate coupled to the match line of the 2i-th block, a source coupled to a ground and a drain, and wherein the first and the second NMOS transistor comprises a first threshold value higher than a threshold value of a standard NMOS transistor composing the content addressable memory cells.

6. The content addressable memory chip according to claim 5,
  wherein the first NAND circuit further comprises
    a first PMOS transistor having a gate coupled to the match line of the (2i−1)-th block, a source coupled to a power supply voltage line and a drain,
  wherein the second NAND circuit further comprises
    a second PMOS transistor having a gate coupled to the match line of the 2i-th block, a source coupled to the power supply voltage line and a drain, and
  wherein the first and the second PMOS transistor comprises a second threshold value lower than a threshold value of a standard PMOS transistor composing the content addressable memory cells.

7. The content addressable memory chip according to claim 5, wherein the logic circuit comprises:
  a NOR circuit receiving an output of the first and the second NAND circuit, and a third PMOS transistor having a gate coupled to an output of the first NAND circuit and a source coupled the power source supply line and a drain, and having a third threshold value higher than the standard PMOS transistor composing the content addressable memory cells.

8. The content addressable memory chip according to claim 7, wherein the NOR circuit further comprises
  a fourth PMOS transistor having a gate coupled to an output of the second NAND circuit and a source-drain path coupled the third PMOS transistor, and having the third threshold value.

9. The content addressable memory chip according to claim 5, wherein the first and the second NAND circuit of the i-th determination circuit receive a dummy search signal, and supply the logic circuit with an output signal indicative of coincidence in response to the dummy search signal irrespective of the voltage of the match line of the (2i−1)-th block and the voltage of the match line of the 2i-th block, respectively.

10. The content addressable memory chip according to claim 5, wherein the logic circuit comprises a NOR circuit, the NOR circuit receives an output of the first and the second NAND circuit and a dummy search signal, and outputs an output signal indicative of coincidence in response to the dummy search signal irrespective of the output of the first and the second NAND circuit.

11. The content addressable memory chip according to claim 5, wherein a determination circuit in the second or latter stage receives an output of a determination circuit in the preceding stage, as an activation signal to start coincidence determination.

12. The content addressable memory chip according to claim 5, wherein each of the content addressable memory cells comprises a search unit having a plurality of search transistors, each of the search transistors has a threshold value substantially equal the first threshold value.

13. The content addressable memory chip according to claim 5, wherein each of the match amplifiers generates an output signal indicative of coincidence during the period of dummy search.

14. The content addressable memory chip according to claim 13, wherein the latch unit comprises:
  a pre-latch circuit operable to pre-latch a signal according to a pre-latch signal, and
  an output latch circuit operable to output the pre-latched signal according to an output latch signal, and
  wherein the pre-latch circuit advances the activation timing of the pre-latch signal in the dummy search rather than in the normal operation.

15. The content addressable memory chip according to claim 14, wherein the output latch circuit advances the activation timing of the output latch signal in the dummy search rather than in the normal operation.

16. The content addressable memory chip according to claim 15, further comprising one or more variable load capacities coupled to an output data wiring which is coupled to the output of the output latch circuit, during the period of dummy search.

* * * * *